(12) United States Patent
Liang et al.

(10) Patent No.: US 11,264,213 B2
(45) Date of Patent: *Mar. 1, 2022

(54) CHEMICAL CONTROL FEATURES IN WAFER PROCESS EQUIPMENT

(71) Applicant: Applied Materials, Inc., Santa Clara, CA (US)

(72) Inventors: Qiwei Liang, Fremont, CA (US); Xinglong Chen, San Jose, CA (US); Kien Chuc, San Francisco, CA (US); Dmitry Lubomirsky, Cupertino, CA (US); Soonam Park, Sunnyvale, CA (US); Jang-Gyoo Yang, San Jose, CA (US); Shankar Venkataraman, San Jose, CA (US); Toan Tran, San Jose, CA (US); Kimberly Hinckley, Mountain View, CA (US); Saurabh Garg, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/511,990

(22) Filed: Jul. 15, 2019

(65) Prior Publication Data
US 2019/0385823 A1    Dec. 19, 2019

Related U.S. Application Data

(60) Continuation of application No. 15/581,357, filed on Apr. 28, 2017, now Pat. No. 10,354,843, which is a
(Continued)

(51) Int. Cl.
*C23C 16/40* (2006.01)
*H01J 37/32* (2006.01)
(Continued)

(52) U.S. Cl.
CPC ........ *H01J 37/32449* (2013.01); *B05B 1/005* (2013.01); *B05B 1/18* (2013.01);
(Continued)

(58) Field of Classification Search
CPC .......... H01J 37/32449; H01J 37/32009; H01J 37/3244; H01J 37/32568; H01J 37/32357;
(Continued)

(56) References Cited

U.S. PATENT DOCUMENTS 2,369,620 A    2/1945  Sullivan et al.
3,401,302 A    9/1968  Thorpe
(Continued)

FOREIGN PATENT DOCUMENTS

CN    1124364 A    6/1996
CN    1847450 A    10/2006
(Continued)

*Primary Examiner* — Rudy Zervigon
(74) *Attorney, Agent, or Firm* — Kilpatrick Townsend & Stockton LLP

(57) ABSTRACT

Gas distribution assemblies are described including an annular body, an upper plate, and a lower plate. The upper plate may define a first plurality of apertures, and the lower plate may define a second and third plurality of apertures. The upper and lower plates may be coupled with one another and the annular body such that the first and second apertures produce channels through the gas distribution assemblies, and a volume is defined between the upper and lower plates.

20 Claims, 14 Drawing Sheets

Related U.S. Application Data continuation of application No. 14/853,838, filed on Sep. 14, 2015, now Pat. No. 9,978,564, which is a division of application No. 13/799,840, filed on Mar. 13, 2013, now Pat. No. 9,132,436.

(60) Provisional application No. 61/704,257, filed on Sep. 21, 2012.

(51) Int. Cl.
  *B05B 1/00* (2006.01)
  *C23C 16/455* (2006.01)
  *C23C 16/452* (2006.01)
  *B05B 1/18* (2006.01)
  *C23C 16/50* (2006.01)
  *H01L 21/67* (2006.01)

(52) U.S. Cl.
  CPC .......... *C23C 16/452* (2013.01); *C23C 16/455* (2013.01); *C23C 16/45561* (2013.01); *C23C 16/45565* (2013.01); *C23C 16/45574* (2013.01); *C23C 16/45582* (2013.01); *C23C 16/50* (2013.01); *H01J 37/32009* (2013.01); *H01J 37/3244* (2013.01); *H01J 37/32357* (2013.01); *H01J 37/32568* (2013.01); *H01L 21/67069* (2013.01); *H01J 2237/002* (2013.01)

(58) Field of Classification Search
  CPC ............... H01J 2237/002; H01J 37/32; H01L 21/67069; H01L 21/3065; C23C 16/50; C23C 16/45582; C23C 16/45561; C23C 16/455; C23C 16/45574; C23C 16/45565; C23C 16/452; B05B 1/18; B05B 1/005
  USPC .................. 118/715; 156/345.33, 345.34
  See application file for complete search history.

(56) References Cited

U.S. PATENT DOCUMENTS

| | | |
|---|---|---|
| 3,451,840 A | 6/1969 | Hough |
| 3,537,474 A | 11/1970 | Rohrer |
| 3,756,511 A | 9/1973 | Shinroku |
| 3,937,857 A | 2/1976 | Brummett et al. |
| 3,969,077 A | 7/1976 | Hill |
| 4,006,047 A | 2/1977 | Brummett et al. |
| 4,190,488 A | 2/1980 | Winters |
| 4,209,357 A | 6/1980 | Gorin et al. |
| 4,214,946 A | 7/1980 | Forget et al. |
| 4,232,060 A | 11/1980 | Mallory, Jr. |
| 4,234,628 A | 11/1980 | DuRose |
| 4,265,943 A | 5/1981 | Goldstein et al. |
| 4,340,462 A | 7/1982 | Koch |
| 4,341,592 A | 7/1982 | Shortes et al. |
| 4,361,418 A | 11/1982 | Tscheppe |
| 4,361,441 A | 11/1982 | Tylko |
| 4,364,803 A | 12/1982 | Nidola et al. |
| 4,368,223 A | 1/1983 | Kobayashi et al. |
| 4,374,698 A | 2/1983 | Sanders et al. |
| 4,397,812 A | 8/1983 | Mallory, Jr. |
| 4,468,413 A | 8/1984 | Bachmann |
| 4,503,807 A | 3/1985 | Nakayama et al. |
| 4,508,054 A * | 4/1985 | Baumberger ............. B05B 7/10 118/718 |
| 4,543,110 A | 9/1985 | Engelhardt et al. |
| 4,565,601 A | 1/1986 | Kakehi et al. |
| 4,579,618 A | 4/1986 | Celestino et al. |
| 4,585,920 A | 4/1986 | Hoog et al. |
| 4,600,464 A | 7/1986 | Desilets et al. |
| 4,610,775 A | 9/1986 | Phifer |
| 4,625,678 A | 12/1986 | Shloya et al. |
| 4,632,857 A | 12/1986 | Mallory, Jr. |
| 4,656,052 A | 4/1987 | Satou et al. |
| 4,656,076 A | 4/1987 | Vetanen et al. |
| 4,668,335 A | 5/1987 | Mockler |
| 4,690,746 A | 9/1987 | McInerney et al. |
| 4,715,937 A | 12/1987 | Moslehi et al. |
| 4,749,440 A | 6/1988 | Blackwood et al. |
| 4,753,898 A | 6/1988 | Parrillo et al. |
| 4,786,360 A | 11/1988 | Cote et al. |
| 4,792,378 A | 12/1988 | Rose et al. |
| 4,793,897 A | 12/1988 | Dunfield et al. |
| 4,807,016 A | 2/1989 | Douglas |
| 4,810,520 A | 3/1989 | Wu |
| 4,816,638 A | 3/1989 | Ukai et al. |
| 4,820,377 A | 4/1989 | Davis et al. |
| 4,828,649 A | 5/1989 | Davis |
| 4,857,140 A | 8/1989 | Loewenstein |
| 4,867,841 A | 9/1989 | Loewenstein et al. |
| 4,904,621 A | 2/1990 | Lowenstein et al. |
| 4,913,929 A | 4/1990 | Moslehi et al. |
| 4,919,750 A | 4/1990 | Bausmith et al. |
| 4,946,903 A | 8/1990 | Gardella et al. |
| 4,951,601 A | 8/1990 | Maydan et al. |
| 4,960,488 A | 10/1990 | Law et al. |
| 4,980,018 A | 12/1990 | Mu et al. |
| 4,981,551 A | 1/1991 | Palmour |
| 4,985,372 A | 1/1991 | Narita et al. |
| 4,987,856 A | 1/1991 | Hey et al. |
| 4,991,542 A | 2/1991 | Kohmura et al. |
| 4,992,136 A | 2/1991 | Tachi et al. |
| 4,993,358 A | 2/1991 | Mahawili |
| 4,994,404 A | 2/1991 | Sheng et al. |
| 5,000,113 A | 3/1991 | Wang et al. |
| 5,006,192 A | 4/1991 | Deguchi |
| 5,010,842 A | 4/1991 | Oda et al. |
| 5,013,691 A | 5/1991 | Lory et al. |
| 5,028,565 A | 7/1991 | Chang |
| 5,030,319 A | 7/1991 | Nishino et al. |
| 5,038,713 A | 8/1991 | Kawakami et al. |
| 5,045,244 A | 9/1991 | Marlett |
| 5,061,838 A | 10/1991 | Lane et al. |
| 5,069,938 A | 12/1991 | Lorimer et al. |
| 5,074,456 A | 12/1991 | Degner et al. |
| 5,083,030 A | 1/1992 | Stavov |
| 5,089,441 A | 2/1992 | Moslehi |
| 5,089,442 A | 2/1992 | Olmer |
| 5,147,692 A | 9/1992 | Bengston |
| 5,156,881 A | 10/1992 | Okano et al. |
| 5,180,435 A | 1/1993 | Markunas et al. |
| 5,186,718 A | 2/1993 | Tepman et al. |
| 5,188,706 A | 2/1993 | Hori et al. |
| 5,198,034 A | 3/1993 | deBoer et al. |
| 5,200,016 A | 4/1993 | Namose |
| 5,203,911 A | 4/1993 | Sricharoenchalkit et al. |
| 5,215,787 A | 6/1993 | Homma |
| 5,217,559 A | 6/1993 | Moslehi et al. |
| 5,221,427 A | 6/1993 | Koinuma et al. |
| 5,228,501 A | 7/1993 | Tepman et al. |
| 5,231,690 A | 7/1993 | Soma et al. |
| 5,235,139 A | 8/1993 | Bengston et al. |
| 5,238,499 A | 8/1993 | van de Ven et al. |
| 5,240,497 A | 8/1993 | Shacham et al. |
| 5,248,371 A | 9/1993 | Maher et al. |
| 5,248,527 A | 9/1993 | Uchida et al. |
| 5,252,178 A | 10/1993 | Moslehi |
| 5,266,157 A | 11/1993 | Kadomura |
| 5,269,881 A | 12/1993 | Sekiya |
| 5,270,125 A | 12/1993 | America et al. |
| 5,271,972 A | 12/1993 | Kwok et al. |
| 5,274,917 A | 1/1994 | Corbett, III et al. |
| 5,275,977 A | 1/1994 | Otsubo et al. |
| 5,277,087 A | 1/1994 | Wilson, Jr. et al. |
| 5,277,750 A | 1/1994 | Wolgang |
| 5,279,669 A | 1/1994 | Lee |
| 5,279,705 A | 1/1994 | Tanaka |
| 5,279,865 A | 1/1994 | Chebi et al. |
| 5,288,518 A | 2/1994 | Homma |
| 5,290,382 A | 3/1994 | Zarowin et al. |
| 5,290,383 A | 3/1994 | Koshimizu |
| 5,292,370 A | 3/1994 | Tsai et al. |
| 5,292,682 A | 3/1994 | Stevens et al. |
| 5,300,463 A | 4/1994 | Cathey et al. |

(56) References Cited

U.S. PATENT DOCUMENTS

| | | | |
|---|---|---|---|
| 5,302,233 | A | 4/1994 | Kim et al. |
| 5,304,250 | A | 4/1994 | Sameshima et al. |
| 5,306,530 | A | 4/1994 | Strongin et al. |
| 5,314,724 | A | 5/1994 | Tsukune et al. |
| 5,318,668 | A | 6/1994 | Tamaki et al. |
| 5,319,247 | A | 6/1994 | Matsuura |
| 5,326,427 | A | 7/1994 | Jerbic |
| 5,328,558 | A | 7/1994 | Kawamura et al. |
| 5,328,810 | A | 7/1994 | Lowrey et al. |
| 5,330,578 | A | 7/1994 | Sakama |
| 5,334,552 | A | 8/1994 | Homma |
| 5,345,999 | A | 9/1994 | Hosokawa |
| 5,352,636 | A | 10/1994 | Beinglass |
| 5,356,478 | A | 10/1994 | Chen et al. |
| 5,362,526 | A | 11/1994 | Wang et al. |
| 5,366,585 | A | 11/1994 | Robertson et al. |
| 5,368,897 | A | 11/1994 | Kurihara et al. |
| 5,378,316 | A | 1/1995 | Franke et al. |
| 5,380,560 | A | 1/1995 | Kaja et al. |
| 5,382,311 | A | 1/1995 | Ishikawa et al. |
| 5,384,284 | A | 1/1995 | Doan et al. |
| 5,385,763 | A | 1/1995 | Okano et al. |
| 5,399,237 | A | 3/1995 | Keswick et al. |
| 5,399,529 | A | 3/1995 | Homma |
| 5,403,434 | A | 4/1995 | Moslehi |
| 5,413,670 | A | 5/1995 | Langan et al. |
| 5,413,967 | A | 5/1995 | Matsuda et al. |
| 5,415,753 | A * | 5/1995 | Hurwitt ............... C23C 14/0068 204/192.12 |
| 5,415,890 | A | 5/1995 | Kloiber et al. |
| 5,416,048 | A | 5/1995 | Blalock et al. |
| 5,420,075 | A | 5/1995 | Homma et al. |
| 5,429,995 | A | 7/1995 | Nishiyama et al. |
| 5,439,553 | A | 8/1995 | Grant et al. |
| 5,451,169 | A | 9/1995 | Corbett, III et al. |
| 5,451,259 | A | 9/1995 | Krogh |
| 5,453,124 | A | 9/1995 | Moslehi et al. |
| 5,454,170 | A | 10/1995 | Cook |
| 5,464,499 | A | 11/1995 | Moslehi |
| 5,468,342 | A | 11/1995 | Nulty et al. |
| 5,474,589 | A | 12/1995 | Ohga et al. |
| 5,478,403 | A | 12/1995 | Shinigawa et al. |
| 5,478,462 | A | 12/1995 | Walsh |
| 5,483,920 | A | 1/1996 | Pryor |
| 5,494,494 | A | 2/1996 | Mizuno et al. |
| 5,500,249 | A | 3/1996 | Telford et al. |
| 5,500,256 | A * | 3/1996 | Watabe ............. C23C 16/45574 427/579 |
| 5,505,816 | A | 4/1996 | Barnes et al. |
| 5,510,216 | A | 4/1996 | Calabrese et al. |
| 5,516,367 | A | 5/1996 | Lei et al. |
| 5,518,962 | A | 5/1996 | Murao |
| 5,531,835 | A | 7/1996 | Fodor et al. |
| 5,534,070 | A | 7/1996 | Okamura et al. |
| 5,536,360 | A | 7/1996 | Nguyen et al. |
| 5,549,780 | A | 8/1996 | Koinuma et al. |
| 5,556,521 | A | 9/1996 | Ghanbari |
| 5,558,717 | A | 9/1996 | Zhao et al. |
| 5,560,779 | A | 10/1996 | Knowles et al. |
| 5,563,105 | A | 10/1996 | Dobuzinsky et al. |
| 5,567,243 | A | 10/1996 | Foster et al. |
| 5,571,576 | A | 11/1996 | Qian et al. |
| 5,575,853 | A | 11/1996 | Arami et al. |
| 5,578,130 | A | 11/1996 | Hayashi et al. |
| 5,578,161 | A | 11/1996 | Auda |
| 5,580,385 | A | 12/1996 | Paranjpe et al. |
| 5,580,421 | A | 12/1996 | Hiatt et al. |
| 5,591,269 | A | 1/1997 | Arami et al. |
| 5,592,358 | A | 1/1997 | Shamouilian |
| 5,595,606 | A | 1/1997 | Fujikawa et al. |
| 5,597,439 | A | 1/1997 | Salzman |
| 5,599,740 | A | 2/1997 | Jang et al. |
| 5,605,637 | A | 2/1997 | Shan et al. |
| 5,614,055 | A | 3/1997 | Fairbairn et al. |
| 5,616,518 | A | 4/1997 | Foo et al. |
| 5,624,582 | A | 4/1997 | Cain |
| 5,626,922 | A | 5/1997 | Miyanaga et al. |
| 5,628,829 | A | 5/1997 | Foster et al. |
| 5,635,086 | A | 6/1997 | Warren, Jr. |
| 5,645,645 | A | 7/1997 | Zhang et al. |
| 5,648,125 | A | 7/1997 | Cane |
| 5,648,175 | A | 7/1997 | Russell et al. |
| 5,656,093 | A | 8/1997 | Burkhart et al. |
| 5,660,957 | A | 8/1997 | Chou et al. |
| 5,661,093 | A | 8/1997 | Ravi et al. |
| 5,670,066 | A | 9/1997 | Barnes et al. |
| 5,674,787 | A | 10/1997 | Zhao et al. |
| 5,676,758 | A | 10/1997 | Hasgawa et al. |
| 5,679,606 | A | 10/1997 | Wang et al. |
| 5,685,946 | A | 11/1997 | Fathauer et al. |
| 5,688,331 | A | 11/1997 | Aruga et al. |
| 5,695,810 | A | 12/1997 | Dubin et al. |
| 5,712,185 | A | 1/1998 | Tsai et al. |
| 5,716,500 | A | 2/1998 | Bardos et al. |
| 5,716,506 | A | 2/1998 | Maclay et al. |
| 5,719,085 | A | 2/1998 | Moon et al. |
| 5,733,816 | A | 3/1998 | Iyer et al. |
| 5,747,373 | A | 5/1998 | Yu |
| 5,753,886 | A | 5/1998 | Iwamura et al. |
| 5,755,859 | A | 5/1998 | Brusic et al. |
| 5,756,400 | A | 5/1998 | Ye et al. |
| 5,756,402 | A | 5/1998 | Jimbo et al. |
| 5,772,770 | A | 6/1998 | Suda et al. |
| 5,781,693 | A | 7/1998 | Balance et al. |
| 5,786,276 | A | 7/1998 | Brooks et al. |
| 5,788,825 | A | 8/1998 | Park et al. |
| 5,789,300 | A | 8/1998 | Fulford |
| 5,792,376 | A | 8/1998 | Kanai et al. |
| 5,800,686 | A | 9/1998 | Littau et al. |
| 5,804,259 | A | 9/1998 | Robles |
| 5,812,403 | A | 9/1998 | Fong et al. |
| 5,814,238 | A | 9/1998 | Ashby et al. |
| 5,814,365 | A | 9/1998 | Mahawill |
| 5,819,434 | A * | 10/1998 | Herchen ........... C23C 16/45565 34/232 |
| 5,820,723 | A | 10/1998 | Benjamin et al. |
| 5,824,599 | A | 10/1998 | Schacham-Diamand et al. |
| 5,830,805 | A | 11/1998 | Schacham-Diamand et al. |
| 5,835,334 | A | 11/1998 | McMillin et al. |
| 5,843,538 | A | 12/1998 | Ehrsam et al. |
| 5,843,847 | A | 12/1998 | Pu et al. |
| 5,844,195 | A | 12/1998 | Fairbairn et al. |
| 5,846,332 | A | 12/1998 | Zhao et al. |
| 5,846,373 | A | 12/1998 | Pirkle et al. |
| 5,846,375 | A | 12/1998 | Gilchrist et al. |
| 5,846,598 | A | 12/1998 | Semkow et al. |
| 5,846,883 | A | 12/1998 | Moslehi |
| 5,849,639 | A | 12/1998 | Molloy et al. |
| 5,850,105 | A | 12/1998 | Dawson et al. |
| 5,855,681 | A | 1/1999 | Maydan et al. |
| 5,855,685 | A | 1/1999 | Tobe et al. |
| 5,856,240 | A | 1/1999 | Sinha et al. |
| 5,858,876 | A | 1/1999 | Chew |
| 5,863,376 | A | 1/1999 | Wicker |
| 5,865,896 | A | 2/1999 | Nowak |
| 5,866,483 | A | 2/1999 | Shiau et al. |
| 5,868,897 | A | 2/1999 | Ohkawa |
| 5,872,052 | A | 2/1999 | Iyer |
| 5,872,058 | A | 2/1999 | Van Cleemput et al. |
| 5,882,424 | A | 3/1999 | Taylor et al. |
| 5,882,786 | A | 3/1999 | Nassau et al. |
| 5,883,012 | A | 3/1999 | Chiou |
| 5,885,358 | A | 3/1999 | Maydan et al. |
| 5,885,404 | A | 3/1999 | Kim et al. |
| 5,885,749 | A | 3/1999 | Huggins et al. |
| 5,888,906 | A | 3/1999 | Sandhu et al. |
| 5,891,349 | A | 4/1999 | Tobe et al. |
| 5,891,513 | A | 4/1999 | Dubin et al. |
| 5,897,751 | A | 4/1999 | Makowiecki |
| 5,899,752 | A | 5/1999 | Hey et al. |
| 5,900,163 | A | 5/1999 | Yi et al. |
| 5,904,827 | A | 5/1999 | Reynolds |
| 5,907,790 | A | 5/1999 | Kellam |
| 5,910,340 | A | 6/1999 | Uchida et al. |

(56) References Cited

U.S. PATENT DOCUMENTS

| | | |
|---|---|---|
| 5,913,147 A | 6/1999 | Dubin et al. |
| 5,913,978 A | 6/1999 | Kato et al. |
| 5,915,190 A | 6/1999 | Pirkle |
| 5,918,116 A | 6/1999 | Chittipeddi |
| 5,919,332 A | 7/1999 | Koshiishi et al. |
| 5,920,792 A | 7/1999 | Lin |
| 5,926,737 A | 7/1999 | Ameen et al. |
| 5,928,528 A | 7/1999 | Kubota et al. |
| 5,932,077 A | 8/1999 | Reynolds |
| 5,933,757 A | 8/1999 | Yoshikawa et al. |
| 5,935,334 A | 8/1999 | Fong et al. |
| 5,935,340 A | 8/1999 | Xia et al. |
| 5,937,323 A | 8/1999 | Orczyk et al. |
| 5,939,831 A | 8/1999 | Fong et al. |
| 5,942,075 A | 8/1999 | Nagahata et al. |
| 5,944,049 A | 8/1999 | Beyer et al. |
| 5,944,902 A | 8/1999 | Redeker et al. |
| 5,948,702 A | 9/1999 | Rotondaro |
| 5,951,601 A | 9/1999 | Lesinski et al. |
| 5,951,776 A | 9/1999 | Selyutin et al. |
| 5,951,896 A | 9/1999 | Mahawill |
| 5,953,591 A | 9/1999 | Ishihara et al. |
| 5,953,635 A | 9/1999 | Andideh |
| 5,963,840 A | 10/1999 | Xia et al. |
| 5,968,379 A | 10/1999 | Zhao et al. |
| 5,968,587 A | 10/1999 | Frankel et al. |
| 5,968,610 A | 10/1999 | Liu et al. |
| 5,969,422 A | 10/1999 | Ting et al. |
| 5,976,327 A | 11/1999 | Tanaka |
| 5,982,100 A | 11/1999 | Ghanbari |
| 5,990,000 A | 11/1999 | Hong et al. |
| 5,990,013 A | 11/1999 | Berenguer et al. |
| 5,993,916 A | 11/1999 | Zhao et al. |
| 5,994,209 A | 11/1999 | Yieh et al. |
| 5,997,649 A | 12/1999 | Hillman |
| 5,997,721 A | 12/1999 | Limbach et al. |
| 5,997,962 A | 12/1999 | Ogasawara et al. |
| 6,004,884 A | 12/1999 | Abraham |
| 6,007,635 A | 12/1999 | Mahawill |
| 6,007,785 A | 12/1999 | Liou |
| 6,010,962 A | 1/2000 | Liu et al. |
| 6,013,191 A | 1/2000 | Nasser-Faili et al. |
| 6,013,584 A | 1/2000 | M'Saad |
| 6,015,724 A | 1/2000 | Yamazaki et al. |
| 6,015,747 A | 1/2000 | Lopatin et al. |
| 6,017,414 A | 1/2000 | Koemtzopoulos et al. |
| 6,143,158 A | 1/2000 | Nishino et al. |
| 6,019,848 A | 2/2000 | Kiyama et al. |
| 6,020,271 A | 2/2000 | Yanagida |
| 6,022,446 A | 2/2000 | Shan et al. |
| 6,030,666 A | 2/2000 | Lam et al. |
| 6,030,881 A | 2/2000 | Papasouliotis et al. |
| 6,035,101 A | 3/2000 | Sajoto et al. |
| 6,036,878 A | 3/2000 | Collins et al. |
| 6,037,018 A | 3/2000 | Jang et al. |
| 6,037,266 A | 3/2000 | Tao et al. |
| 6,037,273 A | 3/2000 | Gronet et al. |
| 6,039,834 A | 3/2000 | Tanaka et al. |
| 6,039,851 A | 3/2000 | Iyer |
| 6,050,085 A | 4/2000 | Mayer |
| 6,053,982 A | 4/2000 | Halpin et al. |
| 6,059,643 A | 5/2000 | Hu et al. |
| 6,063,683 A | 5/2000 | Wu et al. |
| 6,063,712 A | 5/2000 | Gilton et al. |
| 6,065,424 A | 5/2000 | Shacham-Diamand et al. |
| 6,065,425 A | 5/2000 | Takaki et al. |
| 6,072,147 A | 6/2000 | Koshiishi |
| 6,072,227 A | 6/2000 | Yau et al. |
| 6,074,512 A | 6/2000 | Collins et al. |
| 6,074,514 A | 6/2000 | Bjorkman et al. |
| 6,077,384 A | 6/2000 | Collins et al. |
| 6,077,386 A | 6/2000 | Smith, Jr. et al. |
| 6,077,780 A | 6/2000 | Dubin |
| 6,079,356 A | 6/2000 | Umotoy et al. |
| 6,080,446 A * | 6/2000 | Tobe ............... C23C 16/34 257/E21.168 |
| 6,080,529 A | 6/2000 | Ye et al. |
| 6,081,414 A | 6/2000 | Flanigan et al. |
| 6,083,344 A | 7/2000 | Hanawa et al. |
| 6,083,844 A | 7/2000 | Bui-Le et al. |
| 6,086,677 A | 7/2000 | Umotoy et al. |
| 6,087,278 A | 7/2000 | Kim et al. |
| 6,090,212 A | 7/2000 | Mahawill |
| 6,093,457 A | 7/2000 | Okumura |
| 6,093,594 A | 7/2000 | Yeap et al. |
| 6,099,697 A | 8/2000 | Hausmann |
| 6,107,199 A | 8/2000 | Allen et al. |
| 6,110,530 A | 8/2000 | Chen et al. |
| 6,110,556 A | 8/2000 | Bang et al. |
| 6,110,832 A | 8/2000 | Morgan et al. |
| 6,110,836 A | 8/2000 | Cohen et al. |
| 6,110,838 A | 8/2000 | Loewenstein |
| 6,113,771 A | 9/2000 | Landau et al. |
| 6,114,216 A | 9/2000 | Yieh et al. |
| 6,117,245 A | 9/2000 | Mandrekar et al. |
| 6,120,640 A | 9/2000 | Shih et al. |
| 6,124,003 A | 9/2000 | Mikami et al. |
| 6,126,753 A | 10/2000 | Shinriki et al. |
| 6,132,512 A | 10/2000 | Horie et al. |
| 6,136,163 A | 10/2000 | Cheung et al. |
| 6,136,165 A | 10/2000 | Moslehi et al. |
| 6,136,685 A | 10/2000 | Narwankar et al. |
| 6,136,693 A | 10/2000 | Chan et al. |
| 6,140,234 A | 10/2000 | Uzoh et al. |
| 6,144,099 A | 11/2000 | Lopatin et al. |
| 6,147,009 A | 11/2000 | Grill et al. |
| 6,148,761 A | 11/2000 | Majewski et al. |
| 6,149,828 A | 11/2000 | Vaartstra |
| 6,150,628 A | 11/2000 | Smith et al. |
| 6,153,935 A | 11/2000 | Edelstein et al. |
| 6,161,500 A | 12/2000 | Kopacz et al. |
| 6,161,576 A | 12/2000 | Maher et al. |
| 6,162,302 A | 12/2000 | Raghavan et al. |
| 6,162,323 A * | 12/2000 | Koshimizu ......... H01J 37/3244 156/345.26 |
| 6,162,370 A | 12/2000 | Hackett et al. |
| 6,165,912 A | 12/2000 | McConnell et al. |
| 6,167,834 B1 | 1/2001 | Wang et al. |
| 6,169,021 B1 | 1/2001 | Akram et al. |
| 6,170,428 B1 | 1/2001 | Redeker et al. |
| 6,170,429 B1 | 1/2001 | Schoepp |
| 6,171,661 B1 | 1/2001 | Zheng et al. |
| 6,174,450 B1 | 1/2001 | Patrick et al. |
| 6,174,810 B1 | 1/2001 | Patrick et al. |
| 6,174,812 B1 | 1/2001 | Hsuing et al. |
| 6,176,198 B1 | 1/2001 | Kao et al. |
| 6,176,667 B1 | 1/2001 | Fairbairn |
| 6,177,245 B1 | 1/2001 | Ward et al. |
| 6,178,919 B1 | 1/2001 | Li et al. |
| 6,179,924 B1 | 1/2001 | Zhao et al. |
| 6,180,523 B1 | 1/2001 | Lee et al. |
| 6,182,602 B1 | 2/2001 | Redeker et al. |
| 6,182,603 B1 | 2/2001 | Shang et al. |
| 6,184,121 B1 | 2/2001 | Buchwalter et al. |
| 6,184,489 B1 | 2/2001 | Ito et al. |
| 6,186,091 B1 | 2/2001 | Chu et al. |
| 6,189,483 B1 | 2/2001 | Ishikawa et al. |
| 6,190,233 B1 | 2/2001 | Hong et al. |
| 6,194,038 B1 | 2/2001 | Rossman |
| 6,197,181 B1 | 3/2001 | Chen |
| 6,197,364 B1 | 3/2001 | Paunovic et al. |
| 6,197,680 B1 | 3/2001 | Lin et al. |
| 6,197,688 B1 | 3/2001 | Simpson |
| 6,197,705 B1 | 3/2001 | Vassiliev |
| 6,198,616 B1 | 3/2001 | Dahimene et al. |
| 6,200,412 B1 | 3/2001 | Kilgore et al. |
| 6,203,620 B1 | 3/2001 | Moslehi |
| 6,203,863 B1 | 3/2001 | Liu et al. |
| 6,204,200 B1 | 3/2001 | Shieh et al. |
| 6,209,480 B1 | 4/2001 | Moslehi et al. |
| 6,210,486 B1 | 4/2001 | Mizukami et al. |
| 6,217,658 B1 | 4/2001 | Orczyk et al. |
| 6,220,201 B1 | 4/2001 | Nowak |

(56) References Cited

U.S. PATENT DOCUMENTS

| | | |
|---|---|---|
| 6,225,745 B1 | 5/2001 | Srivastava |
| 6,228,233 B1 | 5/2001 | Lakshmikanthan et al. |
| 6,228,751 B1 | 5/2001 | Yamazaki et al. |
| 6,228,758 B1 | 5/2001 | Pellerin et al. |
| 6,235,643 B1 | 5/2001 | Mui et al. |
| 6,237,527 B1 | 5/2001 | Kellerman et al. |
| 6,238,513 B1 | 5/2001 | Arnold et al. |
| 6,238,582 B1 | 5/2001 | Williams et al. |
| 6,197,151 B1 | 6/2001 | Kaji et al. |
| 6,241,845 B1 | 6/2001 | Gadgil et al. |
| 6,242,349 B1 | 6/2001 | Nogami et al. |
| 6,242,360 B1 | 6/2001 | Fischer et al. |
| 6,244,211 B1 | 6/2001 | Nishikawa et al. |
| 6,245,192 B1 | 6/2001 | Dhindsa et al. |
| 6,245,396 B1 | 6/2001 | Nogami |
| 6,245,670 B1 | 6/2001 | Cheung et al. |
| 6,251,236 B1 | 6/2001 | Stevens |
| 6,251,802 B1 | 6/2001 | Moore et al. |
| 6,258,170 B1 | 7/2001 | Somekh et al. |
| 6,258,220 B1 | 7/2001 | Dordi et al. |
| 6,258,223 B1 | 7/2001 | Cheung et al. |
| 6,258,270 B1 | 7/2001 | Hilgendorff et al. |
| 6,261,637 B1 | 7/2001 | Oberle |
| 6,267,074 B1 | 7/2001 | Okumura |
| 6,277,733 B1 | 8/2001 | Smith |
| 6,277,752 B1 | 8/2001 | Chen |
| 6,277,763 B1 | 8/2001 | Kugimiya et al. |
| 6,281,072 B1 | 8/2001 | Li et al. |
| 6,281,135 B1 | 8/2001 | Han et al. |
| 6,284,146 B1 | 9/2001 | Kim et al. |
| 6,287,643 B1 | 9/2001 | Powell et al. |
| 6,291,282 B1 | 9/2001 | Wilk et al. |
| 6,291,348 B1 | 9/2001 | Lopatin et al. |
| 6,302,964 B1 | 10/2001 | Umotoy et al. |
| 6,303,044 B1 | 10/2001 | Koemtzopoulos |
| 6,303,418 B1 | 10/2001 | Cha et al. |
| 6,306,246 B1 | 10/2001 | Melvin et al. |
| 6,306,772 B1 | 10/2001 | Lin |
| 6,308,654 B1 | 10/2001 | Schneider et al. |
| 6,308,776 B1 | 10/2001 | Sloan |
| 6,310,755 B1 | 10/2001 | Busato et al. |
| 6,312,554 B1 | 11/2001 | Ye |
| 6,312,995 B1 | 11/2001 | Yu |
| 6,319,387 B1 | 11/2001 | Krishnamoorthy et al. |
| 6,321,587 B1 | 11/2001 | Laush |
| 6,322,716 B1 | 11/2001 | Qiao et al. |
| 6,323,128 B1 | 11/2001 | Sambucetti et al. |
| 6,329,297 B1 | 12/2001 | Balish et al. |
| 6,335,288 B1 | 1/2002 | Kwan et al. |
| 6,340,435 B1 | 1/2002 | Bjorkman et al. |
| 6,342,733 B1 | 1/2002 | Hu et al. |
| RE37,546 E | 2/2002 | Mahawill |
| 6,344,410 B1 | 2/2002 | Lopatin et al. |
| 6,348,407 B1 | 2/2002 | Gupta et al. |
| 6,350,320 B1 | 2/2002 | Sherstinsky et al. |
| 6,350,697 B1 | 2/2002 | Richardson |
| 6,351,013 B1 | 2/2002 | Luning et al. |
| 6,352,081 B1 | 3/2002 | Lu et al. |
| 6,355,573 B1 | 3/2002 | Okumura |
| 6,358,827 B1 | 3/2002 | Chen et al. |
| 6,364,949 B1 | 4/2002 | Or et al. |
| 6,364,954 B2 | 4/2002 | Umotoy et al. |
| 6,364,957 B1 | 4/2002 | Schneider et al. |
| 6,364,958 B1 | 4/2002 | Lai et al. |
| 6,372,657 B1 | 4/2002 | Hineman et al. |
| 6,375,748 B1 | 4/2002 | Yudovsky et al. |
| 6,376,386 B1 | 4/2002 | Oshima |
| 6,379,575 B1 | 4/2002 | Yin et al. |
| 6,383,896 B1 | 5/2002 | Kirimura et al. |
| 6,383,951 B1 | 5/2002 | Li |
| 6,387,182 B1 | 5/2002 | Horie et al. |
| 6,387,207 B1 | 5/2002 | Janakiraman et al. |
| 6,391,753 B1 | 5/2002 | Yu |
| 6,395,150 B1 | 5/2002 | Van Cleemput et al. |
| 6,403,491 B1 | 6/2002 | Liu et al. |
| 6,415,736 B1 * | 7/2002 | Hao ............... H01L 21/67017 118/723 E |
| 6,416,647 B1 | 7/2002 | Dordi et al. |
| 6,418,874 B1 | 7/2002 | Cox et al. |
| 6,423,284 B1 | 7/2002 | Arno |
| 6,427,623 B2 | 8/2002 | Ko |
| 6,429,465 B1 | 8/2002 | Yagi et al. |
| 6,432,819 B1 | 8/2002 | Pavate et al. |
| 6,432,831 B2 * | 8/2002 | Dhindsa ............ C23C 16/45565 438/710 |
| 6,436,193 B1 | 8/2002 | Kasai et al. |
| 6,436,816 B1 | 8/2002 | Lee et al. |
| 6,437,512 B1 | 8/2002 | Chen et al. |
| 6,440,863 B1 | 8/2002 | Tsai et al. |
| 6,441,492 B1 | 8/2002 | Cunningham |
| 6,444,083 B1 | 9/2002 | Steger et al. |
| 6,446,572 B1 | 9/2002 | Brcka |
| 6,447,636 B1 | 9/2002 | Qian et al. |
| 6,448,537 B1 | 9/2002 | Nering |
| 6,458,718 B1 | 10/2002 | Todd |
| 6,461,974 B1 | 10/2002 | Ni et al. |
| 6,462,371 B1 | 10/2002 | Weimer et al. |
| 6,462,372 B1 | 10/2002 | Xia et al. |
| 6,463,782 B1 | 10/2002 | Shen et al. |
| 6,464,795 B1 | 10/2002 | Sherstinsky et al. |
| 6,465,051 B1 | 10/2002 | Sahin et al. |
| 6,465,350 B1 | 10/2002 | Taylor et al. |
| 6,465,366 B1 | 10/2002 | Nemani et al. |
| 6,471,779 B1 | 10/2002 | Nishio et al. |
| 6,477,980 B1 | 11/2002 | White et al. |
| 6,479,373 B2 | 11/2002 | Dreybrodt et al. |
| 6,488,984 B1 | 12/2002 | Wada et al. |
| 6,494,959 B1 | 12/2002 | Samoilov et al. |
| 6,499,425 B1 | 12/2002 | Sandhu et al. |
| 6,500,728 B1 | 12/2002 | Wang |
| 6,503,843 B1 | 1/2003 | Xia et al. |
| 6,506,291 B2 | 1/2003 | Tsai et al. |
| 6,509,283 B1 | 1/2003 | Thomas |
| 6,509,623 B2 | 1/2003 | Zhao |
| 6,514,377 B1 | 2/2003 | Morimoto et al. |
| 6,516,815 B1 | 2/2003 | Stevens et al. |
| 6,518,548 B2 | 2/2003 | Sugaya et al. |
| 6,527,968 B1 | 3/2003 | Wang et al. |
| 6,528,409 B1 | 3/2003 | Lopatin et al. |
| 6,528,751 B1 | 3/2003 | Hoffman et al. |
| 6,531,069 B1 | 3/2003 | Srivastava et al. |
| 6,537,707 B1 | 3/2003 | Lee |
| 6,537,733 B2 | 3/2003 | Campana et al. |
| 6,541,397 B1 | 4/2003 | Bencher |
| 6,541,671 B1 | 4/2003 | Martinez et al. |
| 6,544,340 B2 | 4/2003 | Yudovsky |
| 6,547,977 B1 | 4/2003 | Yan et al. |
| 6,551,924 B1 | 4/2003 | Dalton et al. |
| 6,558,564 B1 | 5/2003 | Loewenhardt |
| 6,565,661 B1 | 5/2003 | Nguyen |
| 6,565,729 B2 | 5/2003 | Chen et al. |
| 6,569,773 B1 | 5/2003 | Gellrich et al. |
| 6,572,937 B2 | 6/2003 | Hakovirta et al. |
| 6,573,030 B1 | 6/2003 | Fairbairn et al. |
| 6,573,606 B2 | 6/2003 | Sambucetti et al. |
| 6,576,151 B1 | 6/2003 | Vereecke et al. |
| 6,585,851 B1 | 7/2003 | Ohmi et al. |
| 6,586,163 B1 | 7/2003 | Okabe et al. |
| 6,596,599 B1 | 7/2003 | Guo |
| 6,596,654 B1 | 7/2003 | Bayman et al. |
| 6,602,434 B1 | 8/2003 | Hung et al. |
| 6,602,806 B1 | 8/2003 | Xia et al. |
| 6,603,269 B1 | 8/2003 | Vo et al. |
| 6,605,874 B2 | 8/2003 | Leu et al. |
| 6,616,967 B1 | 9/2003 | Test |
| 6,627,532 B1 | 9/2003 | Gaillard et al. |
| 6,635,575 B1 | 10/2003 | Xia et al. |
| 6,635,578 B1 | 10/2003 | Xu et al. |
| 6,638,810 B2 | 10/2003 | Bakli et al. |
| 6,638,855 B1 | 10/2003 | Chang et al. |
| 6,645,301 B2 | 11/2003 | Sainty et al. |
| 6,645,550 B1 | 11/2003 | Cheung et al. |
| 6,656,831 B1 | 12/2003 | Lee et al. |
| 6,656,837 B2 | 12/2003 | Xu et al. |

(56) References Cited

U.S. PATENT DOCUMENTS

| | | |
|---|---|---|
| 6,656,848 B1 | 12/2003 | Scanlan et al. |
| 6,663,715 B1 | 12/2003 | Yuda et al. |
| 6,673,200 B1 | 1/2004 | Gu et al. |
| 6,677,242 B1 | 1/2004 | Liu et al. |
| 6,679,981 B1 | 1/2004 | Pan et al. |
| 6,688,375 B1 | 2/2004 | Turner |
| 6,692,903 B2 | 2/2004 | Chen et al. |
| 6,713,356 B1 | 3/2004 | Skotnicki et al. |
| 6,713,835 B1 | 3/2004 | Horak et al. |
| 6,717,189 B2 | 4/2004 | Inoue et al. |
| 6,720,213 B1 | 4/2004 | Gambino et al. |
| 6,733,620 B1 | 5/2004 | Sugiyama et al. |
| 6,736,147 B2 | 5/2004 | Satoh et al. |
| 6,736,987 B1 | 5/2004 | Cho |
| 6,740,247 B1 | 5/2004 | Han et al. |
| 6,740,585 B2 | 5/2004 | Yoon et al. |
| 6,740,977 B2 | 5/2004 | Ahn et al. |
| 6,743,473 B1 | 6/2004 | Parkhe et al. |
| 6,743,732 B1 | 6/2004 | Lin et al. |
| 6,756,235 B1 | 6/2004 | Liu et al. |
| 6,759,261 B2 | 7/2004 | Shimokohbe et al. |
| 6,762,127 B2 | 7/2004 | Boiteux et al. |
| 6,762,435 B2 | 7/2004 | Towle |
| 6,764,958 B1 | 7/2004 | Nemani et al. |
| 6,765,273 B1 | 7/2004 | Chau et al. |
| 6,767,834 B2 | 7/2004 | Chung et al. |
| 6,768,079 B2 | 7/2004 | Kosakai |
| 6,770,166 B1 | 8/2004 | Fisher |
| 6,772,827 B2 | 8/2004 | Keller et al. |
| 6,779,481 B2 | 8/2004 | Kent et al. |
| 6,792,889 B1 | 9/2004 | Nakano et al. |
| 6,794,290 B1 | 9/2004 | Papasouliotis et al. |
| 6,794,311 B2 | 9/2004 | Huang et al. |
| 6,796,314 B1 | 9/2004 | Graff et al. |
| 6,797,189 B2 | 9/2004 | Hung et al. |
| 6,797,634 B2 | 9/2004 | Suzuki |
| 6,800,336 B1 | 10/2004 | Fornsel et al. |
| 6,800,830 B2 | 10/2004 | Mahawili |
| 6,802,944 B2 | 10/2004 | Ahmad et al. |
| 6,808,564 B2 | 10/2004 | Dietze |
| 6,808,747 B1 | 10/2004 | Shih et al. |
| 6,808,748 B2 | 10/2004 | Kapoor et al. |
| 6,815,633 B1 | 11/2004 | Chen et al. |
| 6,818,561 B1 | 11/2004 | Sonderman |
| 6,821,571 B2 | 11/2004 | Huang |
| 6,823,589 B2 | 11/2004 | White et al. |
| 6,826,451 B2 | 11/2004 | del Puerto et al. |
| 6,828,241 B2 | 12/2004 | Kholodenko et al. |
| 6,830,624 B2 | 12/2004 | Janakiraman et al. |
| 6,835,995 B2 | 12/2004 | Li |
| 6,838,684 B2 | 1/2005 | Bakker et al. |
| 6,846,401 B2 | 1/2005 | Wijenberg et al. |
| 6,846,745 B1 | 1/2005 | Papasouliotis et al. |
| 6,849,854 B2 | 2/2005 | Sainty |
| 6,852,550 B2 | 2/2005 | Tuttle et al. |
| 6,852,584 B1 | 2/2005 | Chen et al. |
| 6,853,533 B2 | 2/2005 | Parkhe et al. |
| 6,858,153 B2 | 2/2005 | Bjorkman et al. |
| 6,861,097 B1 | 3/2005 | Goosey et al. |
| 6,861,332 B2 | 3/2005 | Park et al. |
| 6,869,880 B2 | 3/2005 | Krishnaraj et al. |
| 6,872,909 B2 | 3/2005 | Holber et al. |
| 6,875,280 B2 | 4/2005 | Ikeda et al. |
| 6,878,206 B2 | 4/2005 | Tzu et al. |
| 6,879,981 B2 | 4/2005 | Rothschild et al. |
| 6,883,733 B1 | 4/2005 | Lind et al. |
| 6,886,491 B2 | 5/2005 | Kim et al. |
| 6,892,669 B2 | 5/2005 | Xu et al. |
| 6,893,967 B1 | 5/2005 | Wright et al. |
| 6,897,532 B1 | 5/2005 | Schwarz et al. |
| 6,900,596 B2 | 5/2005 | Yang et al. |
| 6,903,511 B2 | 6/2005 | Chistyakov |
| 6,908,862 B2 | 6/2005 | Li et al. |
| 6,911,112 B2 | 6/2005 | An |
| 6,911,401 B2 | 6/2005 | Khandan et al. |
| 6,916,399 B1 | 7/2005 | Rozenzon et al. |
| 6,921,556 B2 | 7/2005 | Shimizu et al. |
| 6,924,191 B2 | 8/2005 | Liu et al. |
| 6,930,047 B2 | 8/2005 | Yamazaki |
| 6,935,269 B2 | 8/2005 | Lee et al. |
| 6,942,753 B2 | 9/2005 | Choi et al. |
| 6,946,033 B2 * | 9/2005 | Tsuei ............... C23C 16/45565 118/715 |
| 6,951,821 B2 | 10/2005 | Hamelin et al. |
| 6,958,175 B2 | 10/2005 | Sakamoto et al. |
| 6,958,286 B2 | 10/2005 | Chen et al. |
| 6,969,619 B1 | 11/2005 | Winniczek |
| 6,972,840 B1 | 12/2005 | Gu et al. |
| 6,974,523 B2 | 12/2005 | Benzing et al. |
| 6,995,073 B2 | 2/2006 | Liou |
| 7,017,269 B2 | 3/2006 | White et al. |
| 7,017,514 B1 | 3/2006 | Shepherd |
| 7,018,941 B2 | 3/2006 | Cui et al. |
| 7,025,857 B2 * | 4/2006 | Higashiura ........ H01J 37/32082 156/345.44 |
| 7,030,034 B2 | 4/2006 | Fucsko et al. |
| 7,037,846 B2 | 5/2006 | Srivastava et al. |
| 7,049,200 B2 | 5/2006 | Arghavani et al. |
| 7,049,244 B2 | 5/2006 | Becker et al. |
| 7,052,553 B1 | 5/2006 | Shih et al. |
| 7,071,532 B2 | 7/2006 | Geffken et al. |
| 7,084,070 B1 | 8/2006 | Lee et al. |
| 7,115,525 B2 | 10/2006 | Abatchev et al. |
| 7,122,949 B2 | 10/2006 | Strikovski |
| 7,138,767 B2 | 11/2006 | Chen et al. |
| 7,145,725 B2 | 12/2006 | Hasel et al. |
| 7,148,155 B1 | 12/2006 | Tarafdar et al. |
| 7,153,779 B2 | 12/2006 | Trapp |
| 7,166,233 B2 | 1/2007 | Johnson et al. |
| 7,183,214 B2 | 2/2007 | Nam et al. |
| 7,196,342 B2 | 3/2007 | Ershov et al. |
| 7,226,805 B2 | 6/2007 | Hallin et al. |
| 7,235,137 B2 | 6/2007 | Kitayama et al. |
| 7,244,474 B2 | 7/2007 | Hanawa et al. |
| 7,252,011 B2 | 8/2007 | Traverso |
| 7,252,716 B2 * | 8/2007 | Kim .................... C23C 16/4558 118/715 |
| 7,253,123 B2 | 8/2007 | Arghavani et al. |
| 7,255,773 B2 | 8/2007 | Ogasawara et al. |
| 7,256,370 B2 | 8/2007 | Guiver |
| 7,273,526 B2 * | 9/2007 | Shinriki ............ C23C 16/45536 118/715 |
| 7,274,004 B2 | 9/2007 | Benjamin et al. |
| 7,288,482 B2 | 10/2007 | Panda et al. |
| 7,291,360 B2 | 11/2007 | Hanawa et al. |
| 7,297,894 B1 | 11/2007 | Tsukamoto |
| 7,316,761 B2 | 1/2008 | Doan et al. |
| 7,329,608 B2 | 2/2008 | Babayan et al. |
| 7,341,633 B2 | 3/2008 | Lubomirsky et al. |
| 7,344,912 B1 | 3/2008 | Okoroanyanwu |
| 7,358,192 B2 | 4/2008 | Merry et al. |
| 7,361,865 B2 | 4/2008 | Maki et al. |
| 7,364,956 B2 | 4/2008 | Saito |
| 7,365,016 B2 | 4/2008 | Ouellet et al. |
| 7,396,480 B2 | 7/2008 | Kao et al. |
| 7,396,773 B1 | 7/2008 | Blosse et al. |
| 7,416,989 B1 | 8/2008 | Liu et al. |
| 7,465,358 B2 | 12/2008 | Weidman et al. |
| 7,465,953 B1 | 12/2008 | Koh et al. |
| 7,468,319 B2 | 12/2008 | Lee |
| 7,479,303 B2 | 1/2009 | Byun et al. |
| 7,484,473 B2 | 2/2009 | Keller et al. |
| 7,488,688 B2 | 2/2009 | Chung et al. |
| 7,494,545 B2 | 2/2009 | Lam et al. |
| 7,500,445 B2 | 3/2009 | Zhao et al. |
| 7,504,040 B2 | 3/2009 | Lijima et al. |
| 7,513,214 B2 | 4/2009 | Okumura et al. |
| 7,520,957 B2 | 4/2009 | Kao et al. |
| 7,543,546 B2 | 6/2009 | Shibata et al. |
| 7,553,756 B2 | 6/2009 | Hayashi et al. |
| 7,575,007 B2 | 8/2009 | Tang et al. |
| 7,581,511 B2 | 9/2009 | Mardian et al. |
| 7,604,708 B2 | 10/2009 | Wood et al. |
| 7,611,980 B2 | 11/2009 | Wells |

(56) References Cited

U.S. PATENT DOCUMENTS

| | | | |
|---|---|---|---|
| 7,628,897 B2 | 12/2009 | Mungekar et al. | |
| 7,658,799 B2 | 2/2010 | Ishikawa et al. | |
| 7,682,518 B2 | 3/2010 | Chandrachood et al. | |
| 7,695,590 B2 | 4/2010 | Hanawa et al. | |
| 7,708,859 B2 * | 5/2010 | Huang | H01J 37/3244 |
| | | | 156/345.34 |
| 7,722,925 B2 | 5/2010 | White et al. | |
| 7,723,221 B2 | 5/2010 | Hayashi | |
| 7,749,326 B2 * | 7/2010 | Kim | C23C 16/45508 |
| | | | 118/715 |
| 7,780,790 B2 | 8/2010 | Nogami | |
| 7,785,672 B2 | 8/2010 | Choi et al. | |
| 7,790,634 B2 | 9/2010 | Munro et al. | |
| 7,806,077 B2 | 10/2010 | Lee et al. | |
| 7,806,078 B2 * | 10/2010 | Yoshida | C23C 16/455 |
| | | | 118/723 I |
| 7,807,578 B2 | 10/2010 | Bencher et al. | |
| 7,825,038 B2 | 11/2010 | Ingle et al. | |
| 7,837,828 B2 | 11/2010 | Ikeda et al. | |
| 7,845,309 B2 | 12/2010 | Condrashoff et al. | |
| 7,867,926 B2 | 1/2011 | Satoh et al. | |
| 7,906,818 B2 | 3/2011 | Pekny | |
| 7,915,139 B1 | 3/2011 | Lang et al. | |
| 7,922,863 B2 | 4/2011 | Ripley | |
| 7,932,181 B2 | 4/2011 | Singh et al. | |
| 7,939,422 B2 | 5/2011 | Ingle et al. | |
| 7,968,441 B2 | 6/2011 | Xu | |
| 7,976,631 B2 | 7/2011 | Burrows | |
| 7,977,249 B1 | 7/2011 | Liu | |
| 7,981,806 B2 | 7/2011 | Jung | |
| 7,989,365 B2 | 8/2011 | Park et al. | |
| 8,008,166 B2 | 8/2011 | Sanchez et al. | |
| 8,048,811 B2 | 11/2011 | Feustel et al. | |
| 8,058,179 B1 | 11/2011 | Draeger et al. | |
| 8,071,482 B2 | 12/2011 | Kawada | |
| 8,074,599 B2 | 12/2011 | Choi et al. | |
| 8,076,198 B2 | 12/2011 | Lee et al. | |
| 8,083,853 B2 | 12/2011 | Choi et al. | |
| 8,088,691 B2 | 1/2012 | Kiehlbauch et al. | |
| 8,114,245 B2 | 2/2012 | Ohmi et al. | |
| 8,119,530 B2 | 2/2012 | Hori et al. | |
| 8,133,323 B2 * | 3/2012 | Kakegawa | H01L 21/67109 |
| | | | 118/724 |
| 8,133,349 B1 | 3/2012 | Panagopoulos | |
| 8,173,228 B2 | 5/2012 | Choi et al. | |
| 8,183,134 B2 | 5/2012 | Wu | |
| 8,187,486 B1 | 5/2012 | Liu et al. | |
| 8,199,454 B2 | 6/2012 | Koyama et al. | |
| 8,202,441 B2 | 6/2012 | Chandrachood et al. | |
| 8,211,808 B2 | 7/2012 | Sapre et al. | |
| 8,216,486 B2 | 7/2012 | Dhindsa | |
| 8,222,128 B2 | 7/2012 | Sasaki et al. | |
| 8,252,194 B2 | 8/2012 | Kiehlbauch et al. | |
| 8,272,346 B2 | 9/2012 | Bettencourt et al. | |
| 8,277,888 B2 | 10/2012 | DeDontney | |
| 8,295,089 B2 | 10/2012 | Jeong et al. | |
| 8,298,627 B2 | 10/2012 | Minami et al. | |
| 8,298,959 B2 | 10/2012 | Cheshire | |
| 8,309,440 B2 | 11/2012 | Sanchez et al. | |
| 8,312,839 B2 | 11/2012 | Baek | |
| 8,313,610 B2 | 11/2012 | Dhindsa | |
| 8,328,939 B2 | 12/2012 | Choi et al. | |
| 8,329,262 B2 | 12/2012 | Miller et al. | |
| 8,336,188 B2 | 12/2012 | Monteen | |
| 8,343,306 B2 | 1/2013 | Tanaka et al. | |
| 8,357,435 B2 | 1/2013 | Lubomirsky | |
| 8,361,892 B2 | 1/2013 | Tam et al. | |
| 8,368,308 B2 | 2/2013 | Banna et al. | |
| 8,390,980 B2 | 3/2013 | Sansoni et al. | |
| 8,398,777 B2 | 3/2013 | Collins et al. | |
| 8,427,067 B2 | 4/2013 | Espiau et al. | |
| 8,435,902 B2 | 5/2013 | Tang et al. | |
| 8,440,523 B1 | 5/2013 | Guillorn et al. | |
| 8,466,073 B2 | 6/2013 | Wang et al. | |
| 8,475,674 B2 | 7/2013 | Thadani et al. | |
| 8,480,850 B2 | 7/2013 | Tyler et al. | |
| 8,491,805 B2 | 7/2013 | Kushibiki et al. | |
| 8,501,629 B2 | 8/2013 | Tang et al. | |
| 8,506,713 B2 * | 8/2013 | Takagi | H01L 21/02197 |
| | | | 118/715 |
| 8,512,509 B2 * | 8/2013 | Bera | H01J 37/321 |
| | | | 156/345.34 |
| 8,528,889 B2 | 9/2013 | Nakano et al. | |
| 8,540,844 B2 | 9/2013 | Hudson et al. | |
| 8,551,248 B2 * | 10/2013 | Goodlin | C23C 16/45574 |
| | | | 118/715 |
| 8,551,891 B2 | 10/2013 | Liang | |
| 8,573,152 B2 | 11/2013 | De La Llera | |
| 8,622,021 B2 | 1/2014 | Taylor et al. | |
| 8,623,471 B2 | 1/2014 | Tyler et al. | |
| 8,633,423 B2 | 1/2014 | Lin et al. | |
| 8,642,481 B2 | 2/2014 | Wang et al. | |
| 8,652,298 B2 | 2/2014 | Dhindsa et al. | |
| 8,668,836 B2 | 3/2014 | Mizukami et al. | |
| 8,679,354 B2 | 3/2014 | O'Hara | |
| 8,679,982 B2 | 3/2014 | Wang et al. | |
| 8,679,983 B2 | 3/2014 | Wang et al. | |
| 8,691,023 B2 | 4/2014 | Bao et al. | |
| 8,702,902 B2 | 4/2014 | Blom et al. | |
| 8,741,778 B2 | 6/2014 | Yang et al. | |
| 8,747,610 B2 | 6/2014 | Chen et al. | |
| 8,747,680 B1 | 6/2014 | Deshpande | |
| 8,748,322 B1 | 6/2014 | Fung et al. | |
| 8,765,574 B2 | 7/2014 | Zhang et al. | |
| 8,771,536 B2 | 7/2014 | Zhang et al. | |
| 8,771,539 B2 | 7/2014 | Zhang et al. | |
| 8,772,888 B2 | 7/2014 | Jung et al. | |
| 8,778,079 B2 * | 7/2014 | Begarney | H01L 21/67017 |
| | | | 118/715 |
| 8,801,952 B1 | 8/2014 | Wang et al. | |
| 8,802,572 B2 | 8/2014 | Nemani et al. | |
| 8,808,563 B2 | 8/2014 | Wang et al. | |
| 8,815,720 B2 | 8/2014 | Godet et al. | |
| 8,835,316 B2 | 9/2014 | Yin et al. | |
| 8,846,163 B2 | 9/2014 | Kao et al. | |
| 8,869,742 B2 | 10/2014 | Dhindsa | |
| 8,871,651 B1 | 10/2014 | Choi et al. | |
| 8,888,087 B2 | 11/2014 | Okabe et al. | |
| 8,894,767 B2 * | 11/2014 | Chuc | C23C 16/452 |
| | | | 118/715 |
| 8,895,449 B1 | 11/2014 | Zhu et al. | |
| 8,900,364 B2 * | 12/2014 | Wright | C23C 16/4412 |
| | | | 118/715 |
| 8,920,597 B2 * | 12/2014 | Ramaswamy | H01J 37/32596 |
| | | | 156/345.44 |
| 8,921,234 B2 | 12/2014 | Liu et al. | |
| 8,927,390 B2 | 1/2015 | Sapre et al. | |
| 8,932,947 B1 | 1/2015 | Han et al. | |
| 8,937,017 B2 | 1/2015 | Cheshire et al. | |
| 8,945,414 B2 | 2/2015 | Su et al. | |
| 8,946,665 B2 | 2/2015 | Shim et al. | |
| 8,946,828 B2 | 2/2015 | Sun et al. | |
| 8,951,429 B1 | 2/2015 | Liu et al. | |
| 8,956,980 B1 | 2/2015 | Chen et al. | |
| 8,969,212 B2 | 3/2015 | Ren et al. | |
| 8,970,114 B2 | 3/2015 | Busche et al. | |
| 8,980,005 B2 * | 3/2015 | Carlson | C23C 16/4404 |
| | | | 118/715 |
| 8,980,758 B1 | 3/2015 | Ling et al. | |
| 8,980,763 B2 | 3/2015 | Wang et al. | |
| 8,992,723 B2 | 3/2015 | Sorensen et al. | |
| 8,999,656 B2 | 4/2015 | Jirstrom et al. | |
| 8,999,839 B2 | 4/2015 | Su et al. | |
| 8,999,856 B2 | 4/2015 | Zhang et al. | |
| 9,012,302 B2 | 4/2015 | Sapre et al. | |
| 9,017,481 B1 * | 4/2015 | Petti | H01J 37/32449 |
| | | | 118/724 |
| 9,023,732 B2 | 5/2015 | Wang et al. | |
| 9,023,734 B2 | 5/2015 | Chen et al. | |
| 9,034,770 B2 | 5/2015 | Park et al. | |
| 9,039,911 B2 | 5/2015 | Hudson et al. | |
| 9,040,353 B2 | 5/2015 | Yajima et al. | |
| 9,040,422 B2 | 5/2015 | Wang et al. | |

(56) References Cited

U.S. PATENT DOCUMENTS

| | | | |
|---|---|---|---|
| 9,057,128 B2 * | 6/2015 | Olgado | C23C 16/45565 |
| 9,064,815 B2 | 6/2015 | Zhang et al. | |
| 9,064,816 B2 | 6/2015 | Kim et al. | |
| 9,068,265 B2 | 6/2015 | Lubomirsky et al. | |
| 9,072,158 B2 | 6/2015 | Ikeda et al. | |
| 9,093,371 B2 | 7/2015 | Wang et al. | |
| 9,093,389 B2 | 7/2015 | Nemani | |
| 9,093,390 B2 | 7/2015 | Wang et al. | |
| 9,099,398 B2 | 8/2015 | Kang et al. | |
| 9,111,877 B2 | 8/2015 | Chen et al. | |
| 9,111,907 B2 | 8/2015 | Kamineni | |
| 9,114,438 B2 | 8/2015 | Hoinkis et al. | |
| 9,117,855 B2 | 8/2015 | Cho et al. | |
| 9,132,436 B2 * | 9/2015 | Liang | C23C 16/45561 |
| 9,136,273 B1 | 9/2015 | Purayath et al. | |
| 9,144,147 B2 | 9/2015 | Yang et al. | |
| 9,153,442 B2 | 10/2015 | Wang et al. | |
| 9,159,606 B1 | 10/2015 | Purayath et al. | |
| 9,165,783 B2 | 10/2015 | Nemani et al. | |
| 9,165,786 B1 | 10/2015 | Purayath et al. | |
| 9,184,055 B2 | 11/2015 | Wang et al. | |
| 9,190,290 B2 | 11/2015 | Xue et al. | |
| 9,190,293 B2 | 11/2015 | Wang et al. | |
| 9,190,302 B2 | 11/2015 | Ni | |
| 9,202,708 B1 | 12/2015 | Chen et al. | |
| 9,209,012 B2 | 12/2015 | Chen et al. | |
| 9,236,265 B2 | 1/2016 | Korolik et al. | |
| 9,236,266 B2 | 1/2016 | Zhang et al. | |
| 9,240,315 B1 | 1/2016 | Hsieh et al. | |
| 9,245,762 B2 | 1/2016 | Zhang et al. | |
| 9,263,278 B2 | 2/2016 | Purayath et al. | |
| 9,267,739 B2 | 2/2016 | Chen et al. | |
| 9,269,590 B2 | 2/2016 | Luere et al. | |
| 9,275,834 B1 | 3/2016 | Park et al. | |
| 9,281,384 B2 | 3/2016 | Takeguchi | |
| 9,287,095 B2 | 3/2016 | Nguyen et al. | |
| 9,287,134 B2 | 3/2016 | Wang et al. | |
| 9,293,568 B2 | 3/2016 | Ko | |
| 9,299,537 B2 | 3/2016 | Kobayashi et al. | |
| 9,299,538 B2 | 3/2016 | Kobayashi et al. | |
| 9,299,539 B2 | 3/2016 | Makhratchev | |
| 9,299,575 B2 | 3/2016 | Park et al. | |
| 9,299,582 B2 | 3/2016 | Ingle et al. | |
| 9,299,583 B1 | 3/2016 | Wang et al. | |
| 9,309,598 B2 | 4/2016 | Wang et al. | |
| 9,324,576 B2 | 4/2016 | Zhang et al. | |
| 9,343,272 B1 | 5/2016 | Pandit et al. | |
| 9,343,327 B2 | 5/2016 | Zhang et al. | |
| 9,349,605 B1 | 5/2016 | Xu et al. | |
| 9,355,856 B2 | 5/2016 | Wang et al. | |
| 9,355,862 B2 | 5/2016 | Pandit et al. | |
| 9,355,863 B2 | 5/2016 | Chen et al. | |
| 9,355,922 B2 | 5/2016 | Park et al. | |
| 9,362,130 B2 | 6/2016 | Ingle et al. | |
| 9,362,163 B2 | 6/2016 | Danek et al. | |
| 9,368,364 B2 | 6/2016 | Park et al. | |
| 9,373,517 B2 | 6/2016 | Yang et al. | |
| 9,373,522 B1 | 6/2016 | Wang et al. | |
| 9,378,969 B2 | 6/2016 | Hsu et al. | |
| 9,378,978 B2 | 6/2016 | Purayath et al. | |
| 9,384,997 B2 | 7/2016 | Ren et al. | |
| 9,385,028 B2 | 7/2016 | Nemani et al. | |
| 9,390,937 B2 | 7/2016 | Chen et al. | |
| 9,396,961 B2 | 7/2016 | Arghavani et al. | |
| 9,396,989 B2 | 7/2016 | Purayath et al. | |
| 9,406,523 B2 | 8/2016 | Chen et al. | |
| 9,412,608 B2 | 8/2016 | Wang et al. | |
| 9,412,752 B1 | 8/2016 | Yeh et al. | |
| 9,418,858 B2 | 8/2016 | Wang et al. | |
| 9,425,041 B2 | 8/2016 | Berry et al. | |
| 9,425,057 B2 | 8/2016 | Cho et al. | |
| 9,425,058 B2 | 8/2016 | Kim et al. | |
| 9,431,268 B2 | 8/2016 | Lill et al. | |
| 9,431,414 B2 | 8/2016 | Jang et al. | |
| 9,343,358 B1 | 9/2016 | Montgomery | |
| 9,437,451 B2 | 9/2016 | Chen et al. | |
| 9,443,749 B2 | 9/2016 | Smith | |
| 9,449,795 B2 | 9/2016 | Sabri et al. | |
| 9,449,843 B1 | 9/2016 | Korolik et al. | |
| 9,449,845 B2 | 9/2016 | Liu et al. | |
| 9,449,846 B2 | 9/2016 | Liu et al. | |
| 9,449,850 B2 | 9/2016 | Wang et al. | |
| 9,460,893 B2 | 10/2016 | Kawamata et al. | |
| 9,460,959 B1 | 10/2016 | Xie et al. | |
| 9,466,469 B2 | 10/2016 | Khaja | |
| 9,472,412 B2 | 10/2016 | Zhang et al. | |
| 9,472,417 B2 | 10/2016 | Ingle et al. | |
| 9,478,432 B2 | 10/2016 | Chen et al. | |
| 9,478,433 B1 | 10/2016 | Zhou et al. | |
| 9,478,434 B2 | 10/2016 | Wang et al. | |
| 9,493,879 B2 | 11/2016 | Hoinkis et al. | |
| 9,496,167 B2 | 11/2016 | Purayath et al. | |
| 9,499,898 B2 | 11/2016 | Nguyen et al. | |
| 9,502,258 B2 | 11/2016 | Xue et al. | |
| 9,508,529 B2 | 11/2016 | Valcore et al. | |
| 9,520,303 B2 | 12/2016 | Wang et al. | |
| 9,528,183 B2 | 12/2016 | Wu et al. | |
| 9,534,724 B2 | 1/2017 | Jiang et al. | |
| 9,543,163 B2 | 1/2017 | Ling et al. | |
| 9,564,296 B2 | 2/2017 | Kobayashi et al. | |
| 9,564,338 B1 | 2/2017 | Zhang et al. | |
| 9,576,788 B2 | 2/2017 | Liu et al. | |
| 9,576,809 B2 | 2/2017 | Korolik et al. | |
| 9,576,815 B2 | 2/2017 | Xu | |
| 9,583,399 B1 | 2/2017 | Chen et al. | |
| 9,607,856 B2 | 3/2017 | Wang et al. | |
| 9,613,822 B2 | 4/2017 | Chen et al. | |
| 9,659,753 B2 | 5/2017 | Cho et al. | |
| 9,659,791 B2 | 5/2017 | Wang et al. | |
| 9,659,792 B2 | 5/2017 | Wang et al. | |
| 9,663,856 B2 * | 5/2017 | Kasai | H01J 37/32192 |
| 9,666,449 B2 | 5/2017 | Koval et al. | |
| 9,677,176 B2 * | 6/2017 | Chandrasekharan | C23C 16/45572 |
| 9,679,750 B2 * | 6/2017 | Choi | H01J 37/32357 |
| 9,691,645 B2 | 6/2017 | Benjaminson et al. | |
| 9,704,723 B2 | 7/2017 | Wang et al. | |
| 9,711,366 B2 | 7/2017 | Ingle et al. | |
| 9,721,789 B1 | 8/2017 | Yang et al. | |
| 9,728,437 B2 | 8/2017 | Tran et al. | |
| 9,741,593 B2 | 8/2017 | Benjaminson et al. | |
| 9,754,800 B2 | 9/2017 | Zhang et al. | |
| 9,768,034 B1 | 9/2017 | Xu et al. | |
| 9,773,648 B2 | 9/2017 | Cho et al. | |
| 9,773,695 B2 | 9/2017 | Purayath et al. | |
| 9,779,956 B1 | 10/2017 | Zhang et al. | |
| 9,812,462 B1 | 11/2017 | Pang et al. | |
| 9,822,009 B2 | 11/2017 | Kagaya et al. | |
| 9,831,097 B2 | 11/2017 | Ingle et al. | |
| 9,837,249 B2 | 12/2017 | Kobayashi et al. | |
| 9,837,284 B2 | 12/2017 | Chen et al. | |
| 9,837,286 B2 | 12/2017 | Yang et al. | |
| 9,840,777 B2 * | 12/2017 | Zhou | H01J 37/32449 |
| 9,842,744 B2 | 12/2017 | Zhang et al. | |
| 9,865,484 B1 | 1/2018 | Citla et al. | |
| 9,881,805 B2 | 1/2018 | Li et al. | |
| 9,885,117 B2 | 2/2018 | Lubomirsky et al. | |
| 9,887,096 B2 | 2/2018 | Park et al. | |
| 9,903,020 B2 | 2/2018 | Kim et al. | |
| 9,934,942 B1 | 4/2018 | Lubomirsky | |
| 9,941,097 B2 | 4/2018 | Yamazawa | |
| 9,947,549 B1 | 4/2018 | Park et al. | |
| 9,960,045 B1 | 5/2018 | Purayath et al. | |
| 9,966,240 B2 | 5/2018 | Park et al. | |
| 9,978,564 B2 * | 5/2018 | Liang | C23C 16/45565 |
| 9,991,134 B2 | 6/2018 | Wang et al. | |
| 10,026,621 B2 | 7/2018 | Ko et al. | |
| 10,032,606 B2 | 7/2018 | Yang et al. | |
| 10,043,674 B1 | 8/2018 | Korolik et al. | |
| 10,043,684 B1 | 8/2018 | Arnepalli et al. | |
| 10,049,891 B1 | 8/2018 | Wang et al. | |
| 10,062,578 B2 | 8/2018 | Zhang et al. | |
| 10,062,579 B2 | 8/2018 | Chen et al. | |
| 10,062,585 B2 | 8/2018 | Lubomirsky | |

(56) References Cited

U.S. PATENT DOCUMENTS

| | | |
|---|---|---|
| 10,062,587 B2 | 8/2018 | Chen et al. |
| 10,083,830 B2 | 9/2018 | Seino et al. |
| 10,121,689 B2 | 11/2018 | Konkola et al. |
| 10,147,620 B2 | 12/2018 | Benjaminson et al. |
| 10,147,736 B2 | 12/2018 | Linuma |
| 10,217,614 B2 | 2/2019 | Tucker et al. |
| 10,240,231 B2* | 3/2019 | Du .................. C23C 16/4412 |
| 10,256,079 B2 | 4/2019 | Lubomirsky et al. |
| 10,269,541 B2 | 4/2019 | Stowell et al. |
| 10,319,600 B1 | 6/2019 | Li et al. |
| 10,319,739 B2 | 6/2019 | Purayath |
| 10,354,843 B2* | 7/2019 | Liang ............... C23C 16/45582 |
| 10,418,246 B2* | 9/2019 | Kuratomi .......... H01L 21/32051 |
| 10,465,294 B2 | 11/2019 | Wang et al. |
| 10,468,276 B2 | 11/2019 | Benjaminson et al. |
| 10,472,717 B2* | 11/2019 | Sawachi ........... H01L 21/02274 |
| 10,480,074 B2 | 11/2019 | Zhou et al. |
| 10,504,754 B2 | 12/2019 | Tan et al. |
| 10,533,252 B2* | 1/2020 | Chiu .................. H01J 37/3244 |
| 10,541,145 B2* | 1/2020 | Ogawa ............... H01J 37/3244 |
| 10,550,472 B2* | 2/2020 | Chuc ................... C23C 16/452 |
| 10,615,007 B2 | 4/2020 | Stowell et al. |
| 10,679,870 B2 | 6/2020 | Samir et al. |
| 10,699,921 B2 | 6/2020 | Samir |
| 10,770,300 B2* | 9/2020 | Kuratomi ................ C23C 16/06 |
| 10,934,621 B2 | 3/2021 | Sung et al. |
| 2001/0003014 A1 | 6/2001 | Yuda |
| 2001/0006093 A1 | 7/2001 | Tabuchi |
| 2001/0008803 A1 | 7/2001 | Takamatsu et al. |
| 2001/0015175 A1 | 8/2001 | Masuda et al. |
| 2001/0015261 A1 | 8/2001 | Kobayashi et al. |
| 2001/0023741 A1 | 9/2001 | Collison et al. |
| 2001/0027026 A1 | 10/2001 | Dhindsa et al. |
| 2001/0028093 A1 | 10/2001 | Yamazaki et al. |
| 2001/0028922 A1 | 10/2001 | Sandhu |
| 2001/0029112 A1 | 10/2001 | Toyoda et al. |
| 2001/0029891 A1 | 10/2001 | Oh et al. |
| 2001/0030366 A1 | 10/2001 | Nakano et al. |
| 2001/0034106 A1 | 10/2001 | Moise et al. |
| 2001/0034121 A1 | 10/2001 | Fu et al. |
| 2001/0035124 A1 | 11/2001 | Okayama et al. |
| 2001/0035127 A1 | 11/2001 | Metzner |
| 2001/0036706 A1 | 11/2001 | Kitamura |
| 2001/0037856 A1 | 11/2001 | Park |
| 2001/0037941 A1 | 11/2001 | Thompson |
| 2001/0039921 A1 | 11/2001 | Rolfson et al. |
| 2001/0042512 A1 | 11/2001 | Xu et al. |
| 2001/0042799 A1 | 11/2001 | Kim et al. |
| 2001/0045269 A1 | 11/2001 | Yamada |
| 2001/0047760 A1* | 12/2001 | Moslehi ................. H01J 37/321 <br> 118/723 I |
| 2001/0053585 A1 | 12/2001 | Kikuchi et al. |
| 2001/0053610 A1 | 12/2001 | Athavale |
| 2001/0054381 A1 | 12/2001 | Umotoy et al. |
| 2001/0054387 A1 | 12/2001 | Frankel et al. |
| 2002/0000202 A1 | 1/2002 | Yuda et al. |
| 2002/0001778 A1 | 1/2002 | Latchford et al. |
| 2002/0009560 A1 | 1/2002 | Ozono |
| 2002/0009885 A1 | 1/2002 | Brankner et al. |
| 2002/0011210 A1 | 1/2002 | Satoh et al. |
| 2002/0011214 A1 | 1/2002 | Kamarehi et al. |
| 2002/0015791 A1 | 2/2002 | Tobe et al. |
| 2002/0016080 A1 | 2/2002 | Khan et al. |
| 2002/0016085 A1 | 2/2002 | Huang et al. |
| 2002/0017243 A1 | 2/2002 | Pyo |
| 2002/0020429 A1 | 2/2002 | Selbrede et al. |
| 2002/0023899 A1 | 2/2002 | Khater et al. |
| 2002/0028582 A1 | 3/2002 | Nallan et al. |
| 2002/0028585 A1 | 3/2002 | Chung et al. |
| 2002/0029747 A1 | 3/2002 | Powell et al. |
| 2002/0033233 A1 | 3/2002 | Savas |
| 2002/0036143 A1 | 3/2002 | Segawa et al. |
| 2002/0038791 A1 | 4/2002 | Okumura et al. |
| 2002/0040764 A1 | 4/2002 | Kwan et al. |
| 2002/0040766 A1 | 4/2002 | Takahashi |
| 2002/0042192 A1 | 4/2002 | Tanaka et al. |
| 2002/0043690 A1 | 4/2002 | Doyle et al. |
| 2002/0045966 A1 | 4/2002 | Lee et al. |
| 2002/0046991 A1 | 4/2002 | Smith et al. |
| 2002/0048963 A1 | 4/2002 | Campbell et al. |
| 2002/0050246 A1 | 5/2002 | Parkhe |
| 2002/0054962 A1 | 5/2002 | Huang |
| 2002/0062954 A1 | 5/2002 | Getchel et al. |
| 2002/0069820 A1 | 6/2002 | Yudovsky |
| 2002/0070414 A1 | 6/2002 | Drescher et al. |
| 2002/0073925 A1 | 6/2002 | Noble et al. |
| 2002/0074573 A1 | 6/2002 | Takeuchi et al. |
| 2002/0075624 A1 | 6/2002 | Wang et al. |
| 2002/0086501 A1 | 7/2002 | O'Donnell et al. |
| 2002/0090781 A1 | 7/2002 | Skotnicki et al. |
| 2002/0090835 A1 | 7/2002 | Chakravarti et al. |
| 2002/0094378 A1 | 7/2002 | O'Donnell |
| 2002/0094591 A1 | 7/2002 | Sill et al. |
| 2002/0096493 A1 | 7/2002 | Hattori |
| 2002/0098681 A1 | 7/2002 | Hu et al. |
| 2002/0106845 A1 | 8/2002 | Chao et al. |
| 2002/0112819 A1 | 8/2002 | Kamarehi et al. |
| 2002/0124867 A1 | 9/2002 | Kim et al. |
| 2002/0129769 A1 | 9/2002 | Kim et al. |
| 2002/0129902 A1 | 9/2002 | Babayan et al. |
| 2002/0144657 A1 | 10/2002 | Chiang et al. |
| 2002/0153808 A1 | 10/2002 | Skotnicki et al. |
| 2002/0164885 A1 | 11/2002 | Lill et al. |
| 2002/0170678 A1 | 11/2002 | Hayashi et al. |
| 2002/0177322 A1 | 11/2002 | Li et al. |
| 2002/0179248 A1 | 12/2002 | Kabansky et al. |
| 2002/0182878 A1 | 12/2002 | Hirose et al. |
| 2002/0185226 A1 | 12/2002 | Lea et al. |
| 2002/0187280 A1 | 12/2002 | Johnson et al. |
| 2002/0187655 A1 | 12/2002 | Tan et al. |
| 2002/0197823 A1 | 12/2002 | Yoo et al. |
| 2003/0000473 A1 | 1/2003 | Chae et al. |
| 2003/0000647 A1 | 1/2003 | Yudovsky et al. |
| 2003/0003757 A1 | 1/2003 | Naltan et al. |
| 2003/0007910 A1 | 1/2003 | Lazarovich et al. |
| 2003/0010452 A1 | 1/2003 | Park et al. |
| 2003/0010645 A1 | 1/2003 | Ting et al. |
| 2003/0015515 A1 | 1/2003 | Ito et al. |
| 2003/0019428 A1 | 1/2003 | Ku et al. |
| 2003/0019580 A1 | 1/2003 | Strang |
| 2003/0026060 A1 | 2/2003 | Hiramatsu et al. |
| 2003/0029566 A1 | 2/2003 | Roth |
| 2003/0029567 A1 | 2/2003 | Dhindsa et al. |
| 2003/0029715 A1 | 2/2003 | Yu et al. |
| 2003/0031905 A1 | 2/2003 | Saito et al. |
| 2003/0032284 A1 | 2/2003 | Enomoto et al. |
| 2003/0038127 A1 | 2/2003 | Liu et al. |
| 2003/0038305 A1 | 2/2003 | Wasshuber |
| 2003/0054608 A1 | 3/2003 | Tseng et al. |
| 2003/0066482 A1 | 4/2003 | Pokharna et al. |
| 2003/0066607 A1 | 4/2003 | White et al. |
| 2003/0070761 A1 | 4/2003 | Turlot et al. |
| 2003/0071035 A1 | 4/2003 | Brailove |
| 2003/0072639 A1 | 4/2003 | White et al. |
| 2003/0075808 A1 | 4/2003 | Inoue et al. |
| 2003/0077857 A1 | 4/2003 | Xia et al. |
| 2003/0077909 A1 | 4/2003 | Jiwari |
| 2003/0079686 A1 | 5/2003 | Chen et al. |
| 2003/0087488 A1 | 5/2003 | Fink |
| 2003/0087531 A1 | 5/2003 | Kang et al. |
| 2003/0091938 A1 | 5/2003 | Fairbairn et al. |
| 2003/0094134 A1 | 5/2003 | Minami et al. |
| 2003/0098125 A1 | 5/2003 | An |
| 2003/0101938 A1 | 6/2003 | Ronsse et al. |
| 2003/0109143 A1 | 6/2003 | Hsieh et al. |
| 2003/0116087 A1 | 6/2003 | Nguyen et al. |
| 2003/0116439 A1 | 6/2003 | Seo et al. |
| 2003/0119328 A1 | 6/2003 | Fujisato |
| 2003/0121608 A1 | 7/2003 | Chen et al. |
| 2003/0121609 A1 | 7/2003 | Ohmi et al. |
| 2003/0124465 A1 | 7/2003 | Lee et al. |
| 2003/0124842 A1 | 7/2003 | Hytros et al. |
| 2003/0127049 A1 | 7/2003 | Han et al. |
| 2003/0127740 A1 | 7/2003 | Hsu et al. |

(56) References Cited

U.S. PATENT DOCUMENTS

| | | |
|---|---|---|
| 2003/0129106 A1 | 7/2003 | Sorensen et al. |
| 2003/0129827 A1 | 7/2003 | Lee et al. |
| 2003/0132319 A1 | 7/2003 | Hytros et al. |
| 2003/0136520 A1 | 7/2003 | Yudovsky et al. |
| 2003/0140844 A1 | 7/2003 | Maa et al. |
| 2003/0143328 A1 | 7/2003 | Chen et al. |
| 2003/0148035 A1 | 8/2003 | Lingampalli |
| 2003/0150530 A1 | 8/2003 | Lin et al. |
| 2003/0152691 A1 | 8/2003 | Baude |
| 2003/0159307 A1 | 8/2003 | Sago et al. |
| 2003/0164226 A1 | 9/2003 | Kanno et al. |
| 2003/0168439 A1 | 9/2003 | Kanno et al. |
| 2003/0170390 A1 | 9/2003 | Derraa et al. |
| 2003/0170945 A1 | 9/2003 | Igeta et al. |
| 2003/0173333 A1 | 9/2003 | Wang et al. |
| 2003/0173347 A1 | 9/2003 | Guiver |
| 2003/0173675 A1 | 9/2003 | Watanabe |
| 2003/0181040 A1 | 9/2003 | Ivanov et al. |
| 2003/0183244 A1 | 10/2003 | Rossman |
| 2003/0190426 A1 | 10/2003 | Padhi et al. |
| 2003/0196757 A1 | 10/2003 | Todorow et al. |
| 2003/0196760 A1 | 10/2003 | Tyler et al. |
| 2003/0199170 A1 | 10/2003 | Li |
| 2003/0200929 A1 | 10/2003 | Otsuki |
| 2003/0201764 A1 | 10/2003 | Jafari et al. |
| 2003/0205329 A1 | 11/2003 | Gujer et al. |
| 2003/0205479 A1 | 11/2003 | Lin et al. |
| 2003/0209323 A1 | 11/2003 | Yokogaki et al. |
| 2003/0215570 A1 | 11/2003 | Seutter et al. |
| 2003/0215963 A1 | 11/2003 | AmRhein et al. |
| 2003/0216044 A1 | 11/2003 | Lin et al. |
| 2003/0217810 A1 | 11/2003 | Chen et al. |
| 2003/0217812 A1 | 11/2003 | Yoshiki et al. |
| 2003/0221780 A1 | 12/2003 | Lei et al. |
| 2003/0224217 A1 | 12/2003 | Byun et al. |
| 2003/0224617 A1 | 12/2003 | Baek et al. |
| 2003/0230385 A1 | 12/2003 | Bach et al. |
| 2004/0002221 A1 | 1/2004 | O'Donnell et al. |
| 2004/0003828 A1 | 1/2004 | Jackson |
| 2004/0005726 A1 | 1/2004 | Huang |
| 2004/0018304 A1 | 1/2004 | Chung et al. |
| 2004/0020801 A1 | 2/2004 | Solling |
| 2004/0025788 A1 | 2/2004 | Ogasawara et al. |
| 2004/0026371 A1 | 2/2004 | Nguyen et al. |
| 2004/0033678 A1 | 2/2004 | Arghavani et al. |
| 2004/0033684 A1 | 2/2004 | Li |
| 2004/0035364 A1 | 2/2004 | Tomoyoshi et al. |
| 2004/0050328 A1 | 3/2004 | Kumagai et al. |
| 2004/0058070 A1 | 3/2004 | Takeuchi et al. |
| 2004/0058293 A1 | 3/2004 | Nguyen et al. |
| 2004/0060514 A1 | 4/2004 | Janakiraman et al. |
| 2004/0061447 A1 | 4/2004 | Saigusa et al. |
| 2004/0069225 A1 | 4/2004 | Fairbairn et al. |
| 2004/0070346 A1 | 4/2004 | Choi |
| 2004/0072446 A1 | 4/2004 | Liu et al. |
| 2004/0076529 A1 | 4/2004 | Gnauck et al. |
| 2004/0083962 A1 | 5/2004 | Bang |
| 2004/0083967 A1 | 5/2004 | Yuda et al. |
| 2004/0087139 A1 | 5/2004 | Yeh et al. |
| 2004/0092063 A1 | 5/2004 | Okumura |
| 2004/0099213 A1 | 5/2004 | Adomaitis et al. |
| 2004/0099285 A1 | 5/2004 | Wang et al. |
| 2004/0099378 A1 | 5/2004 | Kim et al. |
| 2004/0101667 A1 | 5/2004 | O'Loughlin et al. |
| 2004/0103844 A1 | 6/2004 | Chou et al. |
| 2004/0107908 A1 | 6/2004 | Collins et al. |
| 2004/0108067 A1 | 6/2004 | Fischione et al. |
| 2004/0108068 A1 | 6/2004 | Senzaki et al. |
| 2004/0115876 A1 | 6/2004 | Goundar et al. |
| 2004/0115947 A1 | 6/2004 | Fink et al. |
| 2004/0118519 A1 | 6/2004 | Sen et al. |
| 2004/0123800 A1 | 7/2004 | Schlottmann |
| 2004/0124280 A1 | 7/2004 | Shih et al. |
| 2004/0129671 A1 | 7/2004 | Ji et al. |
| 2004/0137161 A1 | 7/2004 | Segawa et al. |
| 2004/0140053 A1 | 7/2004 | Srivastava et al. |
| 2004/0144311 A1 | 7/2004 | Chen et al. |
| 2004/0144490 A1 | 7/2004 | Zhao et al. |
| 2004/0147126 A1 | 7/2004 | Yamashita et al. |
| 2004/0149223 A1 | 8/2004 | Collison et al. |
| 2004/0149387 A1 | 8/2004 | Kim et al. |
| 2004/0149394 A1 | 8/2004 | Doan et al. |
| 2004/0149699 A1 | 8/2004 | Hofman et al. |
| 2004/0152342 A1 | 8/2004 | Li |
| 2004/0154535 A1 | 8/2004 | Chen et al. |
| 2004/0157444 A1 | 8/2004 | Chiu |
| 2004/0161921 A1 | 8/2004 | Ryu |
| 2004/0163590 A1 | 8/2004 | Tran et al. |
| 2004/0163594 A1 | 8/2004 | Windhorn |
| 2004/0163601 A1 | 8/2004 | Kadotani et al. |
| 2004/0175913 A1 | 9/2004 | Johnson et al. |
| 2004/0175929 A1 | 9/2004 | Schmitt et al. |
| 2004/0182315 A1 | 9/2004 | Laflamme et al. |
| 2004/0187787 A1 | 9/2004 | Dawson |
| 2004/0192032 A1 | 9/2004 | Ohmori et al. |
| 2004/0194799 A1 | 10/2004 | Kim et al. |
| 2004/0195208 A1 | 10/2004 | Pavel et al. |
| 2004/0195216 A1 | 10/2004 | Strang |
| 2004/0200499 A1 | 10/2004 | Harvey |
| 2004/0201843 A1 | 10/2004 | Glenn et al. |
| 2004/0206730 A1 | 10/2004 | Holber et al. |
| 2004/0211357 A1 | 10/2004 | Gadgil et al. |
| 2004/0219723 A1 | 11/2004 | Peng et al. |
| 2004/0219737 A1 | 11/2004 | Quon |
| 2004/0219789 A1 | 11/2004 | Wood et al. |
| 2004/0221809 A1 | 11/2004 | Ohmi et al. |
| 2004/0231706 A1 | 11/2004 | Bhatnagar et al. |
| 2004/0237897 A1 | 12/2004 | Hanawa et al. |
| 2004/0238123 A1 | 12/2004 | Becknell et al. |
| 2004/0259367 A1 | 12/2004 | Constantine et al. |
| 2004/0261721 A1 | 12/2004 | Steger |
| 2004/0263827 A1 | 12/2004 | Xu |
| 2005/0000430 A1 | 1/2005 | Jang et al. |
| 2005/0000432 A1 | 1/2005 | Keller et al. |
| 2005/0001276 A1 | 1/2005 | Gao et al. |
| 2005/0003669 A1 | 1/2005 | Han et al. |
| 2005/0003676 A1 | 1/2005 | Ho et al. |
| 2005/0009340 A1 | 1/2005 | Saijo et al. |
| 2005/0009358 A1 | 1/2005 | Choi et al. |
| 2005/0026430 A1 | 2/2005 | Kim et al. |
| 2005/0026431 A1 | 2/2005 | Kazumi et al. |
| 2005/0034815 A1 | 2/2005 | Kasai et al. |
| 2005/0035455 A1 | 2/2005 | Hu et al. |
| 2005/0039679 A1 | 2/2005 | Kieshock |
| 2005/0051094 A1 | 3/2005 | Schaepkens et al. |
| 2005/0054167 A1 | 3/2005 | Choi et al. |
| 2005/0056218 A1 | 3/2005 | Sun et al. |
| 2005/0073051 A1 | 4/2005 | Yamamoto et al. |
| 2005/0077284 A1 | 4/2005 | Natsuhara et al. |
| 2005/0079706 A1 | 4/2005 | Kumar et al. |
| 2005/0087517 A1 | 4/2005 | Ott et al. |
| 2005/0090078 A1 | 4/2005 | Ishihara |
| 2005/0090120 A1 | 4/2005 | Hasegawa et al. |
| 2005/0098111 A1 | 5/2005 | Shimizu et al. |
| 2005/0098265 A1 | 5/2005 | Fink et al. |
| 2005/0103267 A1 | 5/2005 | Hur et al. |
| 2005/0103440 A1 | 5/2005 | Sato et al. |
| 2005/0105991 A1 | 5/2005 | Hofmeister et al. |
| 2005/0109279 A1 | 5/2005 | Suzuki |
| 2005/0112876 A1 | 5/2005 | Wu |
| 2005/0112901 A1 | 5/2005 | Ji et al. |
| 2005/0123690 A1 | 6/2005 | Derderian et al. |
| 2005/0133849 A1 | 6/2005 | Jeon et al. |
| 2005/0136188 A1 | 6/2005 | Chang |
| 2005/0136684 A1 | 6/2005 | Mukai et al. |
| 2005/0139578 A1 | 6/2005 | Fukuda et al. |
| 2005/0145173 A1 | 7/2005 | Holber et al. |
| 2005/0145341 A1 | 7/2005 | Suzuki |
| 2005/0164479 A1 | 7/2005 | Perng et al. |
| 2005/0167052 A1 | 8/2005 | Ishihara et al. |
| 2005/0167394 A1 | 8/2005 | Liu et al. |
| 2005/0176258 A1 | 8/2005 | Hirose et al. |
| 2005/0178746 A1 | 8/2005 | Gorin |
| 2005/0178748 A1 | 8/2005 | Buchberger et al. |

(56) References Cited

U.S. PATENT DOCUMENTS

| | | |
|---|---|---|
| 2005/0181588 A1 | 8/2005 | Kim |
| 2005/0183666 A1 | 8/2005 | Tsuji et al. |
| 2005/0183827 A1 | 8/2005 | White et al. |
| 2005/0194094 A1 | 9/2005 | Yasaka |
| 2005/0196967 A1 | 9/2005 | Savas et al. |
| 2005/0199489 A1 | 9/2005 | Stevens et al. |
| 2005/0205110 A1 | 9/2005 | Kao et al. |
| 2005/0205862 A1 | 9/2005 | Koemtzopoulos et al. |
| 2005/0208215 A1 | 9/2005 | Eguchi et al. |
| 2005/0208217 A1 | 9/2005 | Shinriki et al. |
| 2005/0214477 A1 | 9/2005 | Hanawa et al. |
| 2005/0217582 A1 | 10/2005 | Kim et al. |
| 2005/0218507 A1 | 10/2005 | Kao et al. |
| 2005/0219786 A1 | 10/2005 | Brown et al. |
| 2005/0221552 A1 | 10/2005 | Kao et al. |
| 2005/0224181 A1 | 10/2005 | Merry et al. |
| 2005/0229848 A1 | 10/2005 | Shinriki et al. |
| 2005/0230350 A1 | 10/2005 | Kao et al. |
| 2005/0236694 A1 | 10/2005 | Wu et al. |
| 2005/0238807 A1 | 10/2005 | Lin et al. |
| 2005/0239282 A1 | 10/2005 | Chen et al. |
| 2005/0241579 A1 | 11/2005 | Kidd |
| 2005/0241583 A1 | 11/2005 | Buechel et al. |
| 2005/0241763 A1* | 11/2005 | Huang ............. C23C 16/45565 156/345.33 |
| 2005/0247672 A1 | 11/2005 | Tatsumi |
| 2005/0251990 A1 | 11/2005 | Choi et al. |
| 2005/0257890 A1 | 11/2005 | Park et al. |
| 2005/0258160 A1 | 11/2005 | Goto et al. |
| 2005/0266622 A1 | 12/2005 | Arghavani et al. |
| 2005/0266650 A1 | 12/2005 | Ahn et al. |
| 2005/0266691 A1 | 12/2005 | Gu et al. |
| 2005/0268856 A1 | 12/2005 | Miller et al. |
| 2005/0269030 A1 | 12/2005 | Kent et al. |
| 2005/0271812 A1 | 12/2005 | Myo et al. |
| 2005/0274324 A1 | 12/2005 | Takahashi et al. |
| 2005/0274396 A1 | 12/2005 | Shih et al. |
| 2005/0279454 A1 | 12/2005 | Snijders |
| 2005/0283321 A1 | 12/2005 | Yue et al. |
| 2005/0287688 A1 | 12/2005 | Won et al. |
| 2005/0287755 A1 | 12/2005 | Bachmann |
| 2005/0287771 A1 | 12/2005 | Seamons et al. |
| 2006/0000802 A1 | 1/2006 | Kumar et al. |
| 2006/0000805 A1 | 1/2006 | Todorow et al. |
| 2006/0005856 A1 | 1/2006 | Sun et al. |
| 2006/0005930 A1 | 1/2006 | Ikeda et al. |
| 2006/0006057 A1 | 1/2006 | Laermer |
| 2006/0008676 A1 | 1/2006 | Ebata et al. |
| 2006/0011298 A1 | 1/2006 | Lim et al. |
| 2006/0011299 A1 | 1/2006 | Condrashoff et al. |
| 2006/0016783 A1 | 1/2006 | Wu et al. |
| 2006/0019456 A1 | 1/2006 | Bu et al. |
| 2006/0019477 A1 | 1/2006 | Hanawa et al. |
| 2006/0019486 A1 | 1/2006 | Yu et al. |
| 2006/0021574 A1* | 2/2006 | Armour ............ C23C 16/45565 118/715 |
| 2006/0021701 A1 | 2/2006 | Tobe et al. |
| 2006/0021703 A1 | 2/2006 | Umotoy et al. |
| 2006/0024954 A1 | 2/2006 | Wu et al. |
| 2006/0024956 A1 | 2/2006 | Zhijian et al. |
| 2006/0032833 A1 | 2/2006 | Kawaguchi et al. |
| 2006/0033678 A1 | 2/2006 | Lubomirsky et al. |
| 2006/0040055 A1 | 2/2006 | Nguyen et al. |
| 2006/0042545 A1 | 3/2006 | Shibata et al. |
| 2006/0043066 A1 | 3/2006 | Kamp |
| 2006/0046412 A1 | 3/2006 | Nguyen et al. |
| 2006/0046419 A1 | 3/2006 | Sandhu et al. |
| 2006/0046470 A1 | 3/2006 | Becknell |
| 2006/0051966 A1 | 3/2006 | Or et al. |
| 2006/0051968 A1 | 3/2006 | Joshi et al. |
| 2006/0054184 A1 | 3/2006 | Mozetic et al. |
| 2006/0054280 A1 | 3/2006 | Jang |
| 2006/0057828 A1 | 3/2006 | Omura et al. |
| 2006/0060942 A1 | 3/2006 | Minixhofer et al. |
| 2006/0065629 A1 | 3/2006 | Chen et al. |
| 2006/0073349 A1 | 4/2006 | Aihara et al. |
| 2006/0075969 A1 | 4/2006 | Fischer |
| 2006/0076108 A1 | 4/2006 | Holland et al. |
| 2006/0081337 A1 | 4/2006 | Himori et al. |
| 2006/0087644 A1 | 4/2006 | McMillin et al. |
| 2006/0090700 A1 | 5/2006 | Satoh et al. |
| 2006/0093756 A1 | 5/2006 | Rajagopalan et al. |
| 2006/0097397 A1 | 5/2006 | Russell et al. |
| 2006/0102076 A1 | 5/2006 | Smith et al. |
| 2006/0102587 A1 | 5/2006 | Kimura |
| 2006/0113038 A1 | 6/2006 | Gondhalekar et al. |
| 2006/0118178 A1 | 6/2006 | Desbiolles et al. |
| 2006/0118240 A1 | 6/2006 | Holber et al. |
| 2006/0121724 A1 | 6/2006 | Yue et al. |
| 2006/0124151 A1 | 6/2006 | Yamasaki et al. |
| 2006/0124242 A1 | 6/2006 | Kanarik et al. |
| 2006/0130971 A1 | 6/2006 | Chang et al. |
| 2006/0137613 A1 | 6/2006 | Kasai |
| 2006/0151115 A1 | 7/2006 | Kim et al. |
| 2006/0157449 A1 | 7/2006 | Takahashi et al. |
| 2006/0162661 A1 | 7/2006 | Jung et al. |
| 2006/0166107 A1 | 7/2006 | Chen et al. |
| 2006/0166515 A1 | 7/2006 | Karim et al. |
| 2006/0169327 A1 | 8/2006 | Shajii et al. |
| 2006/0169410 A1 | 8/2006 | Maeda et al. |
| 2006/0178008 A1 | 8/2006 | Yeh et al. |
| 2006/0183270 A1 | 8/2006 | Humpston |
| 2006/0185592 A1 | 8/2006 | Matsuura |
| 2006/0191479 A1 | 8/2006 | Mizukami et al. |
| 2006/0191637 A1 | 8/2006 | Zajac et al. |
| 2006/0207504 A1 | 9/2006 | Hasebe et al. |
| 2006/0207595 A1 | 9/2006 | Ohmi et al. |
| 2006/0207971 A1 | 9/2006 | Moriya et al. |
| 2006/0210713 A1 | 9/2006 | Brcka |
| 2006/0210723 A1 | 9/2006 | Ishizaka |
| 2006/0211163 A1 | 9/2006 | Ouellet et al. |
| 2006/0215347 A1 | 9/2006 | Wakabayashi et al. |
| 2006/0216878 A1 | 9/2006 | Lee |
| 2006/0219360 A1 | 10/2006 | Iwasaki |
| 2006/0222481 A1 | 10/2006 | Foree |
| 2006/0226121 A1 | 10/2006 | Aoi |
| 2006/0228496 A1* | 10/2006 | Choi .................. H01J 37/3244 427/569 |
| 2006/0228889 A1 | 10/2006 | Edelberg et al. |
| 2006/0236932 A1 | 10/2006 | Yokogawa et al. |
| 2006/0240661 A1 | 10/2006 | Annapragada et al. |
| 2006/0244107 A1 | 11/2006 | Sugihara |
| 2006/0245852 A1 | 11/2006 | Iwabuchi |
| 2006/0246217 A1 | 11/2006 | Weidman et al. |
| 2006/0251800 A1 | 11/2006 | Weidman et al. |
| 2006/0251801 A1 | 11/2006 | Weidman et al. |
| 2006/0252252 A1 | 11/2006 | Zhu et al. |
| 2006/0252265 A1 | 11/2006 | Jin et al. |
| 2006/0254716 A1 | 11/2006 | Mosden et al. |
| 2006/0260750 A1 | 11/2006 | Rueger |
| 2006/0261490 A1 | 11/2006 | Su et al. |
| 2006/0264043 A1 | 11/2006 | Stewart et al. |
| 2006/0266288 A1 | 11/2006 | Choi |
| 2006/0285270 A1 | 12/2006 | Lee |
| 2006/0286774 A1 | 12/2006 | Singh et al. |
| 2006/0289384 A1 | 12/2006 | Pavel et al. |
| 2006/0292846 A1 | 12/2006 | Pinto et al. |
| 2007/0007276 A1 | 1/2007 | Steger |
| 2007/0022952 A1 | 2/2007 | Ritchie et al. |
| 2007/0022954 A1 | 2/2007 | Ilzuka et al. |
| 2007/0023320 A1 | 2/2007 | Itakura et al. |
| 2007/0025907 A1 | 2/2007 | Rezeq |
| 2007/0039548 A1 | 2/2007 | Johnson |
| 2007/0048977 A1 | 3/2007 | Lee et al. |
| 2007/0051471 A1 | 3/2007 | Kawaguchi et al. |
| 2007/0056925 A1 | 3/2007 | Liu et al. |
| 2007/0062453 A1 | 3/2007 | Ishikawa |
| 2007/0066084 A1 | 3/2007 | Wajda et al. |
| 2007/0068625 A1 | 3/2007 | Funk et al. |
| 2007/0071888 A1 | 3/2007 | Shanmugasundram et al. |
| 2007/0072408 A1 | 3/2007 | Enomoto et al. |
| 2007/0077737 A1 | 4/2007 | Kobayashi |
| 2007/0079758 A1 | 4/2007 | Holland et al. |
| 2007/0087949 A1 | 4/2007 | Wu et al. |

(56) References Cited

U.S. PATENT DOCUMENTS

| | | |
|---|---|---|
| 2007/0090325 A1 | 4/2007 | Hwang et al. |
| 2007/0096658 A1 | 5/2007 | Saigusa et al. |
| 2007/0099428 A1 | 5/2007 | Shamiryan et al. |
| 2007/0099431 A1 | 5/2007 | Li |
| 2007/0099438 A1 | 5/2007 | Ye et al. |
| 2007/0107750 A1 | 5/2007 | Sawin et al. |
| 2007/0108404 A1 | 5/2007 | Stewart et al. |
| 2007/0111519 A1 | 5/2007 | Lubomirsky et al. |
| 2007/0117396 A1 | 5/2007 | Wu et al. |
| 2007/0119370 A1* | 5/2007 | Ma .................. H01L 21/76873 118/723 E |
| 2007/0119371 A1* | 5/2007 | Ma .................. C23C 16/45553 118/723 E |
| 2007/0123051 A1 | 5/2007 | Arghavani et al. |
| 2007/0128864 A1 | 6/2007 | Ma |
| 2007/0128876 A1 | 6/2007 | Fukiage |
| 2007/0131274 A1 | 6/2007 | Stollwerck et al. |
| 2007/0145023 A1 | 6/2007 | Holber et al. |
| 2007/0148349 A1 | 6/2007 | Fukada |
| 2007/0154838 A1 | 7/2007 | Lee |
| 2007/0163440 A1 | 7/2007 | Kim et al. |
| 2007/0169703 A1 | 7/2007 | Elliot et al. |
| 2007/0175861 A1 | 8/2007 | Hwang et al. |
| 2007/0181057 A1 | 8/2007 | Lam et al. |
| 2007/0193515 A1 | 8/2007 | Jeon et al. |
| 2007/0197028 A1 | 8/2007 | Byun et al. |
| 2007/0207275 A1 | 9/2007 | Nowak et al. |
| 2007/0209931 A1 | 9/2007 | Miller |
| 2007/0212288 A1 | 9/2007 | Holst |
| 2007/0221620 A1 | 9/2007 | Sakthivel et al. |
| 2007/0227554 A1 | 10/2007 | Satoh et al. |
| 2007/0231109 A1 | 10/2007 | Pak et al. |
| 2007/0232071 A1 | 10/2007 | Balseanu et al. |
| 2007/0235134 A1 | 10/2007 | Limuro |
| 2007/0235136 A1 | 10/2007 | Enomoto et al. |
| 2007/0238199 A1 | 10/2007 | Yamashita |
| 2007/0238321 A1 | 10/2007 | Futase et al. |
| 2007/0243685 A1 | 10/2007 | Jiang et al. |
| 2007/0243714 A1 | 10/2007 | Shin et al. |
| 2007/0254169 A1 | 11/2007 | Kamins et al. |
| 2007/0254486 A1 | 11/2007 | Bera et al. |
| 2007/0258186 A1 | 11/2007 | Matyushkin et al. |
| 2007/0259467 A1 | 11/2007 | Tweet et al. |
| 2007/0264820 A1 | 11/2007 | Liu |
| 2007/0266946 A1 | 11/2007 | Choi |
| 2007/0272154 A1 | 11/2007 | Amikura et al. |
| 2007/0277734 A1 | 12/2007 | Lubomirsky et al. |
| 2007/0280816 A1 | 12/2007 | Kurita et al. |
| 2007/0281106 A1 | 12/2007 | Lubomirksy et al. |
| 2007/0284044 A1 | 12/2007 | Matsumoto et al. |
| 2007/0284344 A1 | 12/2007 | Todorov et al. |
| 2007/0287292 A1 | 12/2007 | Li et al. |
| 2007/0293043 A1 | 12/2007 | Singh et al. |
| 2007/0296967 A1 | 12/2007 | Gupta et al. |
| 2008/0003836 A1 | 1/2008 | Nishimura et al. |
| 2008/0011424 A1 | 1/2008 | Yin et al. |
| 2008/0017104 A1 | 1/2008 | Matyushkin et al. |
| 2008/0020570 A1 | 1/2008 | Naik |
| 2008/0029032 A1 | 2/2008 | Sun et al. |
| 2008/0035608 A1 | 2/2008 | Thomas et al. |
| 2008/0044593 A1 | 2/2008 | Seo et al. |
| 2008/0044990 A1 | 2/2008 | Lee |
| 2008/0050538 A1 | 2/2008 | Hirata |
| 2008/0063798 A1 | 3/2008 | Kher et al. |
| 2008/0063810 A1 | 3/2008 | Park et al. |
| 2008/0075668 A1 | 3/2008 | Goldstein |
| 2008/0078744 A1 | 4/2008 | Wang et al. |
| 2008/0081483 A1 | 4/2008 | Wu |
| 2008/0085604 A1 | 4/2008 | Hoshino et al. |
| 2008/0089001 A1 | 4/2008 | Parkhe et al. |
| 2008/0099147 A1* | 5/2008 | Myo .................. C23C 16/45565 156/345.34 |
| 2008/0099426 A1 | 5/2008 | Kumar et al. |
| 2008/0099431 A1 | 5/2008 | Kumar et al. |
| 2008/0099876 A1 | 5/2008 | Seto |
| 2008/0100222 A1 | 5/2008 | Lewington et al. |
| 2008/0102203 A1 | 5/2008 | Wu et al. |
| 2008/0102570 A1 | 5/2008 | Fisher et al. |
| 2008/0102640 A1 | 5/2008 | Hassan et al. |
| 2008/0102646 A1 | 5/2008 | Kawaguchi et al. |
| 2008/0104782 A1 | 5/2008 | Hughes |
| 2008/0105555 A1 | 5/2008 | Iwazaki et al. |
| 2008/0115726 A1 | 5/2008 | Ingle et al. |
| 2008/0121970 A1 | 5/2008 | Aritome |
| 2008/0124937 A1 | 5/2008 | Xu et al. |
| 2008/0141941 A1 | 6/2008 | Augustino et al. |
| 2008/0142831 A1 | 6/2008 | Su |
| 2008/0149596 A1 | 6/2008 | Dhindsa et al. |
| 2008/0153306 A1 | 6/2008 | Cho et al. |
| 2008/0156631 A1 | 7/2008 | Fair et al. |
| 2008/0156771 A1 | 7/2008 | Jeon et al. |
| 2008/0157225 A1 | 7/2008 | Datta et al. |
| 2008/0160210 A1 | 7/2008 | Yang et al. |
| 2008/0169588 A1 | 7/2008 | Shih et al. |
| 2008/0171407 A1 | 7/2008 | Nakabayashi et al. |
| 2008/0173906 A1 | 7/2008 | Zhu |
| 2008/0176412 A1 | 7/2008 | Komeda |
| 2008/0178797 A1 | 7/2008 | Fodor et al. |
| 2008/0178805 A1 | 7/2008 | Paterson et al. |
| 2008/0182381 A1 | 7/2008 | Kiyotoshi |
| 2008/0182382 A1 | 7/2008 | Ingle et al. |
| 2008/0182383 A1 | 7/2008 | Lee et al. |
| 2008/0193673 A1 | 8/2008 | Paterson et al. |
| 2008/0196666 A1 | 8/2008 | Toshima |
| 2008/0202688 A1 | 8/2008 | Wu et al. |
| 2008/0202892 A1 | 8/2008 | Smith et al. |
| 2008/0213496 A1 | 9/2008 | Sun et al. |
| 2008/0216901 A1 | 9/2008 | Chamberlain et al. |
| 2008/0216958 A1 | 9/2008 | Goto et al. |
| 2008/0224364 A1 | 9/2008 | Funk |
| 2008/0230519 A1 | 9/2008 | Takahashi |
| 2008/0233709 A1 | 9/2008 | Conti et al. |
| 2008/0236749 A1 | 10/2008 | Koshimizu et al. |
| 2008/0236751 A1 | 10/2008 | Aramaki et al. |
| 2008/0254635 A1 | 10/2008 | Benzel et al. |
| 2008/0261404 A1 | 10/2008 | Kozuka et al. |
| 2008/0264337 A1 | 10/2008 | Sano et al. |
| 2008/0268171 A1 | 10/2008 | Ma et al. |
| 2008/0268645 A1 | 10/2008 | Kao et al. |
| 2008/0292798 A1 | 11/2008 | Huh et al. |
| 2008/0293248 A1 | 11/2008 | Park et al. |
| 2008/0317965 A1 | 12/2008 | Son et al. |
| 2009/0000743 A1 | 1/2009 | Iizuka |
| 2009/0001480 A1 | 1/2009 | Cheng |
| 2009/0004849 A1 | 1/2009 | Eun |
| 2009/0004873 A1 | 1/2009 | Yang |
| 2009/0014127 A1 | 1/2009 | Shah et al. |
| 2009/0014323 A1 | 1/2009 | Yendler et al. |
| 2009/0014324 A1 | 1/2009 | Kawaguchi et al. |
| 2009/0017227 A1 | 1/2009 | Fu et al. |
| 2009/0022633 A1 | 1/2009 | Tomosue et al. |
| 2009/0034148 A1 | 2/2009 | Lubomirsky et al. |
| 2009/0036292 A1 | 2/2009 | Sun et al. |
| 2009/0045167 A1 | 2/2009 | Maruyama |
| 2009/0047793 A1 | 2/2009 | Fukasawa |
| 2009/0061640 A1 | 3/2009 | Wong et al. |
| 2009/0065480 A1 | 3/2009 | Ohmi et al. |
| 2009/0072401 A1 | 3/2009 | Arnold et al. |
| 2009/0075409 A1 | 3/2009 | Ueno et al. |
| 2009/0081878 A1* | 3/2009 | Dhindsa .................. H05B 3/03 438/729 |
| 2009/0084317 A1* | 4/2009 | Wu .................. C23C 16/45563 118/728 |
| 2009/0087960 A1 | 4/2009 | Cho et al. |
| 2009/0087979 A1 | 4/2009 | Raghuram |
| 2009/0095221 A1 | 4/2009 | Tam et al. |
| 2009/0095222 A1 | 4/2009 | Tam et al. |
| 2009/0095621 A1 | 4/2009 | Kao et al. |
| 2009/0098276 A1 | 4/2009 | Burrows |
| 2009/0098706 A1 | 4/2009 | Kim et al. |
| 2009/0104738 A1 | 4/2009 | Ring et al. |
| 2009/0104782 A1 | 4/2009 | Lu et al. |
| 2009/0107403 A1 | 4/2009 | Moshtagh et al. |
| 2009/0111280 A1 | 4/2009 | Kao et al. |

(56) References Cited

U.S. PATENT DOCUMENTS

| | | |
|---|---|---|
| 2009/0117270 A1 | 5/2009 | Yamasaki et al. |
| 2009/0117746 A1 | 5/2009 | Masuda |
| 2009/0120364 A1 | 5/2009 | Suarez et al. |
| 2009/0120464 A1 | 5/2009 | Rasheed et al. |
| 2009/0120582 A1 | 5/2009 | Koshimizu |
| 2009/0140738 A1 | 6/2009 | Desvaux et al. |
| 2009/0159213 A1* | 6/2009 | Bera .................. H01J 37/3244 156/345.34 |
| 2009/0159566 A1 | 6/2009 | Brillhart et al. |
| 2009/0159588 A1 | 6/2009 | Morioka et al. |
| 2009/0162260 A1 | 6/2009 | Bera et al. |
| 2009/0162647 A1 | 6/2009 | Sun et al. |
| 2009/0169744 A1* | 7/2009 | Byun ................ C23C 16/45514 427/255.28 |
| 2009/0170221 A1 | 7/2009 | Jacques et al. |
| 2009/0170331 A1 | 7/2009 | Cheng et al. |
| 2009/0178764 A1 | 7/2009 | Kanno et al. |
| 2009/0179300 A1 | 7/2009 | Arai |
| 2009/0189246 A1 | 7/2009 | Wu et al. |
| 2009/0189287 A1 | 7/2009 | Yang et al. |
| 2009/0191711 A1 | 7/2009 | Rui et al. |
| 2009/0194233 A1 | 8/2009 | Tamura |
| 2009/0194508 A1 | 8/2009 | Ui et al. |
| 2009/0194810 A1 | 8/2009 | Kiyotoshi et al. |
| 2009/0197418 A1 | 8/2009 | Sago |
| 2009/0202721 A1 | 8/2009 | Nogami et al. |
| 2009/0212804 A1 | 8/2009 | Yamada et al. |
| 2009/0214825 A1 | 8/2009 | Sun et al. |
| 2009/0218043 A1 | 9/2009 | Balakrishna et al. |
| 2009/0218317 A1 | 9/2009 | Belen et al. |
| 2009/0223928 A1 | 9/2009 | Colpo |
| 2009/0226633 A1 | 9/2009 | Laflamme et al. |
| 2009/0230636 A1 | 9/2009 | Goto |
| 2009/0236041 A1 | 9/2009 | Iizuka |
| 2009/0236043 A1 | 9/2009 | Matsudo et al. |
| 2009/0236314 A1 | 9/2009 | Chen |
| 2009/0236547 A1 | 9/2009 | Huang et al. |
| 2009/0253222 A1 | 10/2009 | Morisawa et al. |
| 2009/0255902 A1 | 10/2009 | Satoh et al. |
| 2009/0258162 A1 | 10/2009 | Furuta et al. |
| 2009/0269934 A1 | 10/2009 | Kao et al. |
| 2009/0274590 A1 | 11/2009 | Willwerth et al. |
| 2009/0275146 A1 | 11/2009 | Takano et al. |
| 2009/0275205 A1 | 11/2009 | Kiehlbauch et al. |
| 2009/0275206 A1 | 11/2009 | Katz et al. |
| 2009/0277587 A1 | 11/2009 | Lubomirsky et al. |
| 2009/0277874 A1 | 11/2009 | Rui et al. |
| 2009/0280650 A1 | 11/2009 | Lubomirsky et al. |
| 2009/0286400 A1 | 11/2009 | Heo et al. |
| 2009/0286405 A1 | 11/2009 | Okesaku et al. |
| 2009/0291027 A1 | 11/2009 | Choi |
| 2009/0293809 A1 | 12/2009 | Cho et al. |
| 2009/0294898 A1 | 12/2009 | Feustel et al. |
| 2009/0298256 A1 | 12/2009 | Chen et al. |
| 2009/0302005 A1 | 12/2009 | Kool et al. |
| 2009/0314309 A1 | 12/2009 | Sankarakrishnan et al. |
| 2009/0314433 A1 | 12/2009 | Hoffman et al. |
| 2009/0317978 A1 | 12/2009 | Higashi |
| 2009/0320756 A1 | 12/2009 | Tanaka |
| 2010/0000683 A1 | 1/2010 | Kadkhodayan et al. |
| 2010/0003406 A1 | 1/2010 | Lam et al. |
| 2010/0003824 A1* | 1/2010 | Kadkhodayan ... H01J 37/32091 438/710 |
| 2010/0006032 A1 | 1/2010 | Hinckley et al. |
| 2010/0006543 A1 | 1/2010 | Sawada et al. |
| 2010/0018648 A1 | 1/2010 | Collins et al. |
| 2010/0022030 A1 | 1/2010 | Ditizio |
| 2010/0025370 A1 | 2/2010 | Dieguez-Campo et al. |
| 2010/0037821 A1 | 2/2010 | Nogami |
| 2010/0039747 A1 | 2/2010 | Sansoni |
| 2010/0043726 A1 | 2/2010 | Kosanke |
| 2010/0047080 A1 | 2/2010 | Bruce |
| 2010/0048022 A1 | 2/2010 | Kubota |
| 2010/0048027 A1 | 2/2010 | Cheng et al. |
| 2010/0055408 A1 | 3/2010 | Lee et al. |
| 2010/0055917 A1 | 3/2010 | Kim |
| 2010/0059889 A1 | 3/2010 | Gosset et al. |
| 2010/0062603 A1 | 3/2010 | Ganguly et al. |
| 2010/0072172 A1 | 3/2010 | Ui et al. |
| 2010/0075503 A1 | 3/2010 | Bencher |
| 2010/0081285 A1 | 4/2010 | Chen et al. |
| 2010/0081287 A1 | 4/2010 | Honda et al. |
| 2010/0087038 A1 | 4/2010 | Chung et al. |
| 2010/0089533 A1 | 4/2010 | Ueda et al. |
| 2010/0093151 A1 | 4/2010 | Arghavani et al. |
| 2010/0093168 A1 | 4/2010 | Naik |
| 2010/0093187 A1 | 4/2010 | Lee et al. |
| 2010/0096367 A1 | 4/2010 | Jeon et al. |
| 2010/0098882 A1 | 4/2010 | Lubomirsky et al. |
| 2010/0099236 A1 | 4/2010 | Kwon et al. |
| 2010/0099263 A1 | 4/2010 | Kao et al. |
| 2010/0101727 A1 | 4/2010 | Ji |
| 2010/0105209 A1 | 4/2010 | Winniczek et al. |
| 2010/0116788 A1 | 5/2010 | Singh et al. |
| 2010/0119843 A1 | 5/2010 | Sun et al. |
| 2010/0129974 A1 | 5/2010 | Futase et al. |
| 2010/0129982 A1 | 5/2010 | Kao et al. |
| 2010/0130001 A1 | 5/2010 | Noguchi |
| 2010/0139889 A1 | 6/2010 | Kurita et al. |
| 2010/0144140 A1 | 6/2010 | Chandrashekar et al. |
| 2010/0147219 A1 | 6/2010 | Hsieh et al. |
| 2010/0151149 A1 | 6/2010 | Ovshinsky |
| 2010/0154835 A1 | 6/2010 | Dimeo et al. |
| 2010/0159703 A1 | 6/2010 | Fischer et al. |
| 2010/0164422 A1 | 7/2010 | Shu et al. |
| 2010/0167461 A1 | 7/2010 | Rana et al. |
| 2010/0173499 A1 | 7/2010 | Tao et al. |
| 2010/0178748 A1 | 7/2010 | Subramanian |
| 2010/0178755 A1 | 7/2010 | Lee et al. |
| 2010/0180819 A1 | 7/2010 | Hatanaka et al. |
| 2010/0183825 A1 | 7/2010 | Becker et al. |
| 2010/0187534 A1 | 7/2010 | Nishi et al. |
| 2010/0187588 A1 | 7/2010 | Kim et al. |
| 2010/0187694 A1 | 7/2010 | Yu et al. |
| 2010/0190352 A1 | 7/2010 | Jaiswal |
| 2010/0197143 A1 | 8/2010 | Nishimura |
| 2010/0203739 A1 | 8/2010 | Becker et al. |
| 2010/0206483 A1 | 8/2010 | Sorensen et al. |
| 2010/0207195 A1 | 8/2010 | Fukuzumi et al. |
| 2010/0207205 A1 | 8/2010 | Grebs et al. |
| 2010/0212594 A1 | 8/2010 | Hara et al. |
| 2010/0213172 A1 | 8/2010 | Wilson |
| 2010/0221895 A1 | 9/2010 | Seino et al. |
| 2010/0224322 A1 | 9/2010 | Sui et al. |
| 2010/0224324 A1 | 9/2010 | Kasai |
| 2010/0240205 A1 | 9/2010 | Son |
| 2010/0243165 A1 | 9/2010 | Um |
| 2010/0243606 A1 | 9/2010 | Koshimizu |
| 2010/0244204 A1 | 9/2010 | Matsuoka et al. |
| 2010/0244350 A1 | 9/2010 | Fujisato et al. |
| 2010/0248488 A1 | 9/2010 | Agarwal et al. |
| 2010/0252068 A1 | 10/2010 | Kannan et al. |
| 2010/0255667 A1 | 10/2010 | Seino et al. |
| 2010/0258913 A1 | 10/2010 | Lue |
| 2010/0263588 A1 | 10/2010 | Zhiyin |
| 2010/0267224 A1 | 10/2010 | Choi et al. |
| 2010/0267248 A1 | 10/2010 | Ma et al. |
| 2010/0272895 A1* | 10/2010 | Tsuda ................ C23C 16/45514 427/255.32 |
| 2010/0273290 A1 | 10/2010 | Kryliouk |
| 2010/0273291 A1 | 10/2010 | Kryliouk et al. |
| 2010/0288369 A1 | 11/2010 | Chang et al. |
| 2010/0294199 A1 | 11/2010 | Tran et al. |
| 2010/0300359 A1* | 12/2010 | Armour ............. C23C 16/45565 118/724 |
| 2010/0310785 A1 | 12/2010 | Sasakawa et al. |
| 2010/0314005 A1 | 12/2010 | Saito et al. |
| 2010/0317197 A1 | 12/2010 | Lind et al. |
| 2010/0330814 A1 | 12/2010 | Yokota et al. |
| 2011/0005607 A1 | 1/2011 | Desbiolles et al. |
| 2011/0005684 A1 | 1/2011 | Hayami et al. |
| 2011/0008950 A1 | 1/2011 | Xu |
| 2011/0011338 A1* | 1/2011 | Chuc .................... C23C 16/452 118/715 |

(56) References Cited

U.S. PATENT DOCUMENTS

| | | |
|---|---|---|
| 2011/0011341 A1 | 1/2011 | Nishimoto |
| 2011/0011730 A1 | 1/2011 | Valcore, Jr. et al. |
| 2011/0034035 A1 | 2/2011 | Liang et al. |
| 2011/0039407 A1 | 2/2011 | Nishizuka |
| 2011/0042799 A1 | 2/2011 | Kang et al. |
| 2011/0043228 A1 | 2/2011 | Makhratchev et al. |
| 2011/0045676 A1 | 2/2011 | Park |
| 2011/0048325 A1 | 3/2011 | Choi et al. |
| 2011/0049102 A1 | 3/2011 | Kroll et al. |
| 2011/0053380 A1 | 3/2011 | Sapre et al. |
| 2011/0058303 A1 | 3/2011 | Migita |
| 2011/0061810 A1 | 3/2011 | Ganguly et al. |
| 2011/0061812 A1 | 3/2011 | Ganguly et al. |
| 2011/0065276 A1 | 3/2011 | Ganguly et al. |
| 2011/0076401 A1 | 3/2011 | Chao et al. |
| 2011/0081782 A1 | 4/2011 | Liang et al. |
| 2011/0088847 A1 | 4/2011 | Law et al. |
| 2011/0100489 A1 | 5/2011 | Orito |
| 2011/0101335 A1 | 5/2011 | Yamazaki et al. |
| 2011/0104393 A1 | 5/2011 | Hilkene et al. |
| 2011/0111596 A1 | 5/2011 | Kanakasabapathy |
| 2011/0114601 A1 | 5/2011 | Lubomirsky et al. |
| 2011/0115378 A1 | 5/2011 | Lubomirsky et al. |
| 2011/0124144 A1 | 5/2011 | Schlemm et al. |
| 2011/0127156 A1 | 6/2011 | Foad et al. |
| 2011/0133650 A1 | 6/2011 | Kim |
| 2011/0139748 A1 | 6/2011 | Donnelly et al. |
| 2011/0140229 A1 | 6/2011 | Rachmady et al. |
| 2011/0143542 A1 | 6/2011 | Feurprier et al. |
| 2011/0146909 A1 | 6/2011 | Shi et al. |
| 2011/0147363 A1 | 6/2011 | Yap et al. |
| 2011/0151674 A1 | 6/2011 | Tang et al. |
| 2011/0151677 A1 | 6/2011 | Wang et al. |
| 2011/0151678 A1 | 6/2011 | Ashtiani et al. |
| 2011/0155181 A1 | 6/2011 | Inatomi |
| 2011/0159690 A1 | 6/2011 | Chandrashekar et al. |
| 2011/0162800 A1* | 7/2011 | Noorbakhsh ..... H01J 37/32091 156/345.34 |
| 2011/0165057 A1 | 7/2011 | Honda et al. |
| 2011/0165347 A1 | 7/2011 | Miller et al. |
| 2011/0165771 A1 | 7/2011 | Ring et al. |
| 2011/0174778 A1 | 7/2011 | Sawada et al. |
| 2011/0180847 A1 | 7/2011 | Ikeda et al. |
| 2011/0195575 A1 | 8/2011 | Wang |
| 2011/0198034 A1 | 8/2011 | Sun et al. |
| 2011/0204025 A1 | 8/2011 | Tahara |
| 2011/0207332 A1 | 8/2011 | Liu et al. |
| 2011/0217851 A1 | 9/2011 | Liang et al. |
| 2011/0223334 A1 | 9/2011 | Yudovsky et al. |
| 2011/0226734 A1 | 9/2011 | Sumiya et al. |
| 2011/0227028 A1 | 9/2011 | Sekar et al. |
| 2011/0230008 A1 | 9/2011 | Lakshmanan et al. |
| 2011/0230052 A1 | 9/2011 | Tang et al. |
| 2011/0232737 A1 | 9/2011 | Ruletzki et al. |
| 2011/0232845 A1 | 9/2011 | Riker et al. |
| 2011/0244686 A1 | 10/2011 | Aso et al. |
| 2011/0244693 A1 | 10/2011 | Tamura et al. |
| 2011/0253044 A1 | 10/2011 | Tam et al. |
| 2011/0256421 A1 | 10/2011 | Bose et al. |
| 2011/0256729 A1* | 10/2011 | Goodlin ............ H01L 21/02104 438/758 |
| 2011/0265884 A1 | 11/2011 | Xu et al. |
| 2011/0265887 A1 | 11/2011 | Lee et al. |
| 2011/0265951 A1 | 11/2011 | Xu |
| 2011/0266252 A1 | 11/2011 | Thadani et al. |
| 2011/0266256 A1 | 11/2011 | Cruse et al. |
| 2011/0266682 A1 | 11/2011 | Edelstein et al. |
| 2011/0278260 A1 | 11/2011 | Lai et al. |
| 2011/0287633 A1 | 11/2011 | Lee et al. |
| 2011/0290419 A1 | 12/2011 | Horiguchi et al. |
| 2011/0294300 A1 | 12/2011 | Zhang et al. |
| 2011/0298061 A1 | 12/2011 | Siddiqui et al. |
| 2011/0303146 A1 | 12/2011 | Nishijima |
| 2011/0304078 A1 | 12/2011 | Lee et al. |
| 2011/0308453 A1 | 12/2011 | Su et al. |
| 2012/0003782 A1 | 1/2012 | Byun et al. |
| 2012/0009796 A1 | 1/2012 | Cui et al. |
| 2012/0012848 A1 | 1/2012 | Suh |
| 2012/0017989 A1 | 1/2012 | Chang et al. |
| 2012/0025289 A1 | 2/2012 | Liang et al. |
| 2012/0031559 A1 | 2/2012 | Dhindsa et al. |
| 2012/0034786 A1 | 2/2012 | Dhindsa et al. |
| 2012/0035766 A1 | 2/2012 | Shajii et al. |
| 2012/0037596 A1 | 2/2012 | Eto et al. |
| 2012/0040132 A1 | 2/2012 | Eto et al. |
| 2012/0040492 A1 | 2/2012 | Ovshinsky et al. |
| 2012/0052683 A1 | 3/2012 | Kim et al. |
| 2012/0055402 A1 | 3/2012 | Moriya et al. |
| 2012/0067971 A1* | 3/2012 | Byun ................ C23C 16/45591 239/106 |
| 2012/0068242 A1 | 3/2012 | Shin et al. |
| 2012/0070982 A1 | 3/2012 | Yu et al. |
| 2012/0070996 A1 | 3/2012 | Hao et al. |
| 2012/0073501 A1 | 3/2012 | Lubomirsky et al. |
| 2012/0088356 A1 | 4/2012 | Santhanam et al. |
| 2012/0091108 A1 | 4/2012 | Lin Xing et al. |
| 2012/0097330 A1 | 4/2012 | Iyengar et al. |
| 2012/0100720 A1 | 4/2012 | Winniczek et al. |
| 2012/0103518 A1 | 5/2012 | Kakimoto |
| 2012/0104564 A1 | 5/2012 | Won et al. |
| 2012/0119225 A1 | 5/2012 | Shiomi et al. |
| 2012/0122302 A1 | 5/2012 | Weidman et al. |
| 2012/0122319 A1 | 5/2012 | Shimizu |
| 2012/0129354 A1 | 5/2012 | Luong |
| 2012/0135576 A1 | 5/2012 | Lee et al. |
| 2012/0148369 A1 | 6/2012 | Michalski et al. |
| 2012/0149200 A1 | 6/2012 | Culp et al. |
| 2012/0161405 A1 | 6/2012 | Mohn et al. |
| 2012/0164839 A1 | 6/2012 | Nishimura |
| 2012/0171852 A1 | 7/2012 | Yuan et al. |
| 2012/0180954 A1 | 7/2012 | Yang et al. |
| 2012/0181599 A1 | 7/2012 | Lung |
| 2012/0182808 A1 | 7/2012 | Lue et al. |
| 2012/0187844 A1 | 7/2012 | Hoffman et al. |
| 2012/0196447 A1 | 8/2012 | Yang et al. |
| 2012/0196451 A1 | 8/2012 | Mallick |
| 2012/0202408 A1 | 8/2012 | Shajii et al. |
| 2012/0208361 A1 | 8/2012 | Ha |
| 2012/0211462 A1 | 8/2012 | Zhang et al. |
| 2012/0211722 A1 | 8/2012 | Kellam et al. |
| 2012/0216955 A1 | 8/2012 | Eto et al. |
| 2012/0222616 A1 | 9/2012 | Han et al. |
| 2012/0222815 A1 | 9/2012 | Sabri et al. |
| 2012/0223048 A1 | 9/2012 | Paranjpe et al. |
| 2012/0223418 A1 | 9/2012 | Stowers et al. |
| 2012/0225557 A1 | 9/2012 | Serry et al. |
| 2012/0228642 A1 | 9/2012 | Aube et al. |
| 2012/0234945 A1 | 9/2012 | Olgado |
| 2012/0238102 A1 | 9/2012 | Zhang et al. |
| 2012/0238103 A1 | 9/2012 | Zhang et al. |
| 2012/0238108 A1 | 9/2012 | Chen et al. |
| 2012/0241082 A1 | 9/2012 | Chen et al. |
| 2012/0241411 A1 | 9/2012 | Darling et al. |
| 2012/0247390 A1 | 10/2012 | Sawada et al. |
| 2012/0247670 A1 | 10/2012 | Dobashi et al. |
| 2012/0247671 A1 | 10/2012 | Sugawara |
| 2012/0247677 A1 | 10/2012 | Himori et al. |
| 2012/0255491 A1 | 10/2012 | Hadidi |
| 2012/0258600 A1 | 10/2012 | Godet et al. |
| 2012/0258607 A1 | 10/2012 | Holland et al. |
| 2012/0267346 A1 | 10/2012 | Kao et al. |
| 2012/0269968 A1 | 10/2012 | Rayner |
| 2012/0282779 A1 | 11/2012 | Arnold et al. |
| 2012/0285481 A1 | 11/2012 | Lee et al. |
| 2012/0285619 A1 | 11/2012 | Malyushkin et al. |
| 2012/0285621 A1 | 11/2012 | Tan |
| 2012/0291696 A1 | 11/2012 | Clarke |
| 2012/0292664 A1 | 11/2012 | Kanike |
| 2012/0304933 A1 | 12/2012 | Mai et al. |
| 2012/0305184 A1 | 12/2012 | Singh et al. |
| 2012/0309204 A1 | 12/2012 | Kang et al. |
| 2012/0309205 A1 | 12/2012 | Wang et al. |
| 2012/0322015 A1 | 12/2012 | Kim |
| 2012/0323008 A1 | 12/2012 | Barry et al. |

(56) References Cited

U.S. PATENT DOCUMENTS

| | | |
|---|---|---|
| 2013/0001899 A1 | 1/2013 | Hwang et al. |
| 2013/0005103 A1 | 1/2013 | Liu et al. |
| 2013/0005140 A1 | 1/2013 | Jeng et al. |
| 2013/0012030 A1 | 1/2013 | Lakshmanan et al. |
| 2013/0012032 A1 | 1/2013 | Liu et al. |
| 2013/0023062 A1 | 1/2013 | Masuda et al. |
| 2013/0023094 A1 | 1/2013 | Yeh et al. |
| 2013/0023124 A1 | 1/2013 | Nemani et al. |
| 2013/0023125 A1 | 1/2013 | Singh |
| 2013/0026135 A1 | 1/2013 | Kim |
| 2013/0032574 A1 | 2/2013 | Liu et al. |
| 2013/0034666 A1 | 2/2013 | Liang et al. |
| 2013/0034968 A1 | 2/2013 | Zhang et al. |
| 2013/0037919 A1 | 2/2013 | Sapra et al. |
| 2013/0045605 A1 | 2/2013 | Wang et al. |
| 2013/0049592 A1 | 2/2013 | Yeom et al. |
| 2013/0052804 A1 | 2/2013 | Song |
| 2013/0052827 A1 | 2/2013 | Wang et al. |
| 2013/0052833 A1 | 2/2013 | Ranjan et al. |
| 2013/0059440 A1 | 3/2013 | Wang et al. |
| 2013/0059448 A1 | 3/2013 | Marakhtanov et al. |
| 2013/0062675 A1 | 3/2013 | Thomas |
| 2013/0065398 A1 | 3/2013 | Ohsawa et al. |
| 2013/0065403 A1 | 3/2013 | Paranjpe et al. |
| 2013/0082197 A1 | 4/2013 | Yang et al. |
| 2013/0084654 A1 | 4/2013 | Gaylord et al. |
| 2013/0087309 A1 | 4/2013 | Volfovski |
| 2013/0089988 A1 | 4/2013 | Wang et al. |
| 2013/0095646 A1 | 4/2013 | Alsmeier et al. |
| 2013/0098868 A1 | 4/2013 | Nishimura et al. |
| 2013/0105303 A1 | 5/2013 | Lubomirsky et al. |
| 2013/0105948 A1 | 5/2013 | Kewley |
| 2013/0107415 A1 | 5/2013 | Banna et al. |
| 2013/0112383 A1 | 5/2013 | Hanamachi |
| 2013/0115372 A1 | 5/2013 | Pavol et al. |
| 2013/0118686 A1 | 5/2013 | Carducci et al. |
| 2013/0119016 A1 | 5/2013 | Kagoshima |
| 2013/0119457 A1 | 5/2013 | Lue et al. |
| 2013/0119483 A1 | 5/2013 | Alptekin et al. |
| 2013/0127124 A1 | 5/2013 | Nam et al. |
| 2013/0130507 A1 | 5/2013 | Wang et al. |
| 2013/0133578 A1 | 5/2013 | Hwang |
| 2013/0133834 A1 | 5/2013 | Dhindsa et al. |
| 2013/0149866 A1 | 6/2013 | Shriner |
| 2013/0150303 A1 | 6/2013 | Kungl et al. |
| 2013/0152859 A1 | 6/2013 | Collins et al. |
| 2013/0155568 A1 | 6/2013 | Todorow et al. |
| 2013/0161726 A1 | 6/2013 | Kim et al. |
| 2013/0171810 A1 | 7/2013 | Sun et al. |
| 2013/0171827 A1 | 7/2013 | Cho et al. |
| 2013/0175654 A1 | 7/2013 | Muckenhirn et al. |
| 2013/0187220 A1 | 7/2013 | Surthi |
| 2013/0192760 A1 | 8/2013 | Ikeda et al. |
| 2013/0193108 A1 | 8/2013 | Zheng |
| 2013/0213935 A1 | 8/2013 | Liao et al. |
| 2013/0217243 A1 | 8/2013 | Underwood et al. |
| 2013/0224953 A1 | 8/2013 | Salinas et al. |
| 2013/0224960 A1 | 8/2013 | Payyapilly et al. |
| 2013/0260533 A1 | 10/2013 | Sapre et al. |
| 2013/0260564 A1 | 10/2013 | Sapre et al. |
| 2013/0276983 A1 | 10/2013 | Park et al. |
| 2013/0279066 A1 | 10/2013 | Lubomirsky et al. |
| 2013/0284288 A1 | 10/2013 | Kim |
| 2013/0284369 A1 | 10/2013 | Kobayashi et al. |
| 2013/0284370 A1 | 10/2013 | Kobayashi et al. |
| 2013/0284373 A1 | 10/2013 | Sun et al. |
| 2013/0284374 A1 | 10/2013 | Lubomirsky et al. |
| 2013/0284700 A1 | 10/2013 | Nangoy et al. |
| 2013/0286530 A1 | 10/2013 | Lin et al. |
| 2013/0286532 A1 | 10/2013 | Kataigi et al. |
| 2013/0295297 A1 | 11/2013 | Chou et al. |
| 2013/0298942 A1 | 11/2013 | Ren et al. |
| 2013/0299009 A1 | 11/2013 | Jiang et al. |
| 2013/0302980 A1 | 11/2013 | Chandrashekar et al. |
| 2013/0306758 A1* | 11/2013 | Park .............. C23C 16/345 239/418 |
| 2013/0320550 A1 | 12/2013 | Kim |
| 2013/0337655 A1 | 12/2013 | Lee et al. |
| 2013/0343829 A1 | 12/2013 | Benedetti et al. |
| 2014/0004707 A1 | 1/2014 | Thedjoisworo et al. |
| 2014/0004708 A1 | 1/2014 | Thedjoisworo |
| 2014/0008880 A1 | 1/2014 | Miura et al. |
| 2014/0020708 A1 | 1/2014 | Kim et al. |
| 2014/0021673 A1 | 1/2014 | Chen et al. |
| 2014/0026813 A1 | 1/2014 | Wang et al. |
| 2014/0027060 A1* | 1/2014 | Ranish .............. G01J 5/0818 156/345.33 |
| 2014/0034239 A1 | 2/2014 | Yang et al. |
| 2014/0051253 A1 | 2/2014 | Guha |
| 2014/0053866 A1 | 2/2014 | Baluja et al. |
| 2014/0054269 A1 | 2/2014 | Hudson et al. |
| 2014/0057447 A1 | 2/2014 | Yang et al. |
| 2014/0061324 A1 | 3/2014 | Mohn et al. |
| 2014/0062285 A1 | 3/2014 | Chen |
| 2014/0065827 A1 | 3/2014 | Kang et al. |
| 2014/0065842 A1 | 3/2014 | Anthis et al. |
| 2014/0073143 A1 | 3/2014 | Alokozai et al. |
| 2014/0076234 A1 | 3/2014 | Kao et al. |
| 2014/0080308 A1 | 3/2014 | Chen et al. |
| 2014/0080309 A1 | 3/2014 | Park et al. |
| 2014/0080310 A1 | 3/2014 | Chen et al. |
| 2014/0083362 A1 | 3/2014 | Lubomirsky et al. |
| 2014/0087488 A1 | 3/2014 | Nam et al. |
| 2014/0087561 A1 | 3/2014 | Lee et al. |
| 2014/0097270 A1* | 4/2014 | Liang .............. H01J 37/32568 239/132.3 |
| 2014/0099794 A1* | 4/2014 | Ingle .............. H01L 21/3065 438/710 |
| 2014/0102367 A1 | 4/2014 | Ishibashi |
| 2014/0110061 A1 | 4/2014 | Okunishi |
| 2014/0116338 A1 | 5/2014 | He et al. |
| 2014/0124364 A1 | 5/2014 | Yoo et al. |
| 2014/0134842 A1 | 5/2014 | Zhang et al. |
| 2014/0134847 A1 | 5/2014 | Seya |
| 2014/0141621 A1 | 5/2014 | Ren et al. |
| 2014/0144876 A1 | 5/2014 | Nakagawa et al. |
| 2014/0147126 A1 | 5/2014 | Yamashita et al. |
| 2014/0148015 A1 | 5/2014 | Larson |
| 2014/0152312 A1 | 6/2014 | Snow et al. |
| 2014/0154668 A1 | 6/2014 | Chou et al. |
| 2014/0154889 A1 | 6/2014 | Wang et al. |
| 2014/0165912 A1 | 6/2014 | Kao et al. |
| 2014/0166617 A1 | 6/2014 | Chen |
| 2014/0166618 A1 | 6/2014 | Tadigadapa et al. |
| 2014/0175530 A1 | 6/2014 | Chien et al. |
| 2014/0175534 A1 | 6/2014 | Kofuji et al. |
| 2014/0186772 A1 | 7/2014 | Pohlers et al. |
| 2014/0190410 A1 | 7/2014 | Kim |
| 2014/0190632 A1 | 7/2014 | Kumar et al. |
| 2014/0191388 A1 | 7/2014 | Chen |
| 2014/0199850 A1 | 7/2014 | Kim et al. |
| 2014/0199851 A1 | 7/2014 | Nemani et al. |
| 2014/0209245 A1 | 7/2014 | Yamamoto et al. |
| 2014/0216337 A1 | 8/2014 | Swaminathan et al. |
| 2014/0225504 A1 | 8/2014 | Kaneko et al. |
| 2014/0227881 A1 | 8/2014 | Lubomirsky et al. |
| 2014/0231251 A1 | 8/2014 | Hashiguchi et al. |
| 2014/0234466 A1 | 8/2014 | Gao et al. |
| 2014/0248773 A1 | 9/2014 | Tsai et al. |
| 2014/0248780 A1 | 9/2014 | Ingle et al. |
| 2014/0251956 A1 | 9/2014 | Jeon et al. |
| 2014/0252134 A1 | 9/2014 | Chen et al. |
| 2014/0253900 A1 | 9/2014 | Cornelissen et al. |
| 2014/0256131 A1 | 9/2014 | Wang et al. |
| 2014/0256145 A1 | 9/2014 | Abdallah et al. |
| 2014/0262031 A1* | 9/2014 | Belostotskiy ....... H01J 37/3244 156/345.28 |
| 2014/0262038 A1 | 9/2014 | Wang et al. |
| 2014/0263172 A1 | 9/2014 | Xie et al. |
| 2014/0263177 A1 | 9/2014 | Povolny et al. |
| 2014/0263272 A1 | 9/2014 | Duan et al. |
| 2014/0264507 A1 | 9/2014 | Lee et al. |
| 2014/0264533 A1 | 9/2014 | Simsek-Ege |

(56) References Cited

U.S. PATENT DOCUMENTS

| | | |
|---|---|---|
| 2014/0271097 A1 | 9/2014 | Wang et al. |
| 2014/0272184 A1 | 9/2014 | Sreekala et al. |
| 2014/0273373 A1 | 9/2014 | Makala et al. |
| 2014/0273406 A1 | 9/2014 | Wang et al. |
| 2014/0273410 A1 | 9/2014 | Abedijaberi et al. |
| 2014/0273451 A1 | 9/2014 | Wang et al. |
| 2014/0273462 A1 | 9/2014 | Simsek-Ege et al. |
| 2014/0273487 A1 | 9/2014 | Deshmukh et al. |
| 2014/0273489 A1 | 9/2014 | Wang et al. |
| 2014/0273491 A1 | 9/2014 | Zhang et al. |
| 2014/0273492 A1 | 9/2014 | Anthis et al. |
| 2014/0273496 A1 | 9/2014 | Kao |
| 2014/0283747 A1* | 9/2014 | Kasai ............... H01J 37/3244 118/723 R |
| 2014/0288528 A1 | 9/2014 | Py et al. |
| 2014/0302256 A1 | 10/2014 | Chen et al. |
| 2014/0302678 A1 | 10/2014 | Paterson et al. |
| 2014/0302680 A1 | 10/2014 | Singh |
| 2014/0308758 A1 | 10/2014 | Nemani et al. |
| 2014/0308816 A1 | 10/2014 | Wang et al. |
| 2014/0311581 A1 | 10/2014 | Belostotskiy et al. |
| 2014/0342532 A1 | 11/2014 | Zhu |
| 2014/0342569 A1 | 11/2014 | Zhu et al. |
| 2014/0349477 A1 | 11/2014 | Chandrashekar et al. |
| 2014/0357083 A1 | 12/2014 | Ling et al. |
| 2014/0361684 A1 | 12/2014 | Ikeda et al. |
| 2014/0363977 A1 | 12/2014 | Morimoto et al. |
| 2014/0363979 A1 | 12/2014 | Or et al. |
| 2014/0373782 A1 | 12/2014 | Park et al. |
| 2015/0007770 A1 | 1/2015 | Chandrasekharan et al. |
| 2015/0011096 A1* | 1/2015 | Chandrasekharan ........................ C23C 16/509 438/758 |
| 2015/0013793 A1* | 1/2015 | Chuc ............... C23C 16/45565 137/561 A |
| 2015/0014152 A1 | 1/2015 | Hoinkis et al. |
| 2015/0031211 A1 | 1/2015 | Sapre et al. |
| 2015/0037980 A1 | 2/2015 | Rha |
| 2015/0041430 A1 | 2/2015 | Yoshino et al. |
| 2015/0044879 A1 | 2/2015 | Liao et al. |
| 2015/0050812 A1 | 2/2015 | Smith |
| 2015/0056814 A1 | 2/2015 | Ling et al. |
| 2015/0060265 A1 | 3/2015 | Cho et al. |
| 2015/0064918 A1 | 3/2015 | Ranjan et al. |
| 2015/0072508 A1 | 3/2015 | Or et al. |
| 2015/0076110 A1 | 3/2015 | Wu et al. |
| 2015/0076586 A1 | 3/2015 | Rabkin et al. |
| 2015/0079797 A1 | 3/2015 | Chen et al. |
| 2015/0093891 A1 | 4/2015 | Zope |
| 2015/0118822 A1 | 4/2015 | Zhang et al. |
| 2015/0118858 A1 | 4/2015 | Takaba |
| 2015/0123541 A1 | 5/2015 | Baek et al. |
| 2015/0126035 A1 | 5/2015 | Diao et al. |
| 2015/0126039 A1 | 5/2015 | Korolik et al. |
| 2015/0126040 A1 | 5/2015 | Korolik et al. |
| 2015/0129541 A1 | 5/2015 | Wang et al. |
| 2015/0129545 A1 | 5/2015 | Ingle et al. |
| 2015/0129546 A1 | 5/2015 | Ingle et al. |
| 2015/0132953 A1 | 5/2015 | Nowling |
| 2015/0132968 A1 | 5/2015 | Ren et al. |
| 2015/0140827 A1 | 5/2015 | Kao et al. |
| 2015/0152072 A1 | 6/2015 | Cantat et al. |
| 2015/0155177 A1 | 6/2015 | Zhang et al. |
| 2015/0155189 A1 | 6/2015 | Cho et al. |
| 2015/0167705 A1 | 6/2015 | Lee et al. |
| 2015/0170811 A1 | 6/2015 | Tanigawa et al. |
| 2015/0170879 A1 | 6/2015 | Nguyen et al. |
| 2015/0170920 A1 | 6/2015 | Purayath et al. |
| 2015/0170924 A1 | 6/2015 | Nguyen et al. |
| 2015/0170926 A1 | 6/2015 | Michalak |
| 2015/0170935 A1 | 6/2015 | Wang et al. |
| 2015/0170943 A1 | 6/2015 | Nguyen et al. |
| 2015/0170956 A1 | 6/2015 | Naik |
| 2015/0171008 A1 | 6/2015 | Luo |
| 2015/0179464 A1 | 6/2015 | Wang et al. |
| 2015/0187625 A1 | 7/2015 | Busche et al. |
| 2015/0191823 A1 | 7/2015 | Banna et al. |
| 2015/0194435 A1 | 7/2015 | Lee |
| 2015/0200042 A1 | 7/2015 | Ling et al. |
| 2015/0206764 A1 | 7/2015 | Wang et al. |
| 2015/0214066 A1 | 7/2015 | Luere et al. |
| 2015/0214067 A1 | 7/2015 | Zhang et al. |
| 2015/0214092 A1 | 7/2015 | Purayath et al. |
| 2015/0214101 A1 | 7/2015 | Ren et al. |
| 2015/0214337 A1 | 7/2015 | Ko et al. |
| 2015/0214653 A1 | 7/2015 | Sakane et al. |
| 2015/0221479 A1 | 8/2015 | Chen et al. |
| 2015/0221541 A1 | 8/2015 | Nemani et al. |
| 2015/0228456 A1 | 8/2015 | Ye et al. |
| 2015/0228499 A1 | 8/2015 | Parkinson et al. |
| 2015/0235809 A1 | 8/2015 | Ito et al. |
| 2015/0235860 A1 | 8/2015 | Tomura et al. |
| 2015/0235863 A1 | 8/2015 | Chen |
| 2015/0235865 A1 | 8/2015 | Wang et al. |
| 2015/0235867 A1 | 8/2015 | Nishizuka |
| 2015/0240359 A1 | 8/2015 | Jdira et al. |
| 2015/0247231 A1 | 9/2015 | Nguyen et al. |
| 2015/0249018 A1 | 9/2015 | Park et al. |
| 2015/0255481 A1 | 9/2015 | Baenninger et al. |
| 2015/0270105 A1 | 9/2015 | Kobayashi et al. |
| 2015/0270135 A1 | 9/2015 | Tabat |
| 2015/0270140 A1 | 9/2015 | Gupta et al. |
| 2015/0275361 A1 | 10/2015 | Lubomirsky et al. |
| 2015/0275375 A1 | 10/2015 | Kim et al. |
| 2015/0279687 A1 | 10/2015 | Xue et al. |
| 2015/0294980 A1 | 10/2015 | Lee et al. |
| 2015/0303031 A1 | 10/2015 | Choi |
| 2015/0332930 A1 | 11/2015 | Wang et al. |
| 2015/0332953 A1 | 11/2015 | Futase et al. |
| 2015/0340225 A1 | 11/2015 | Kim et al. |
| 2015/0340371 A1 | 11/2015 | Lue |
| 2015/0345029 A1 | 12/2015 | Wang et al. |
| 2015/0357201 A1 | 12/2015 | Chen et al. |
| 2015/0357205 A1 | 12/2015 | Wang et al. |
| 2015/0371861 A1 | 12/2015 | Li et al. |
| 2015/0371864 A1 | 12/2015 | Hsu et al. |
| 2015/0371865 A1 | 12/2015 | Chen et al. |
| 2015/0371866 A1 | 12/2015 | Chen et al. |
| 2015/0371869 A1 | 12/2015 | Surla et al. |
| 2015/0371877 A1 | 12/2015 | Lin et al. |
| 2015/0372104 A1 | 12/2015 | Liu et al. |
| 2015/0376782 A1 | 12/2015 | Griffin et al. |
| 2015/0376784 A1 | 12/2015 | Wu et al. |
| 2015/0380419 A1 | 12/2015 | Gunji-Yoneoka et al. |
| 2015/0380431 A1 | 12/2015 | Kanamori et al. |
| 2016/0002779 A1 | 1/2016 | Lin et al. |
| 2016/0005571 A1 | 1/2016 | Rosa et al. |
| 2016/0005572 A1* | 1/2016 | Liang ............... H01J 37/32568 156/345.33 |
| 2016/0005833 A1 | 1/2016 | Collins et al. |
| 2016/0020071 A1 | 1/2016 | Khaja et al. |
| 2016/0027654 A1 | 1/2016 | Kim et al. |
| 2016/0027673 A1 | 1/2016 | Wang et al. |
| 2016/0035586 A1 | 2/2016 | Purayath et al. |
| 2016/0035614 A1 | 2/2016 | Purayath et al. |
| 2016/0042920 A1 | 2/2016 | Cho et al. |
| 2016/0042924 A1 | 2/2016 | Kim et al. |
| 2016/0042968 A1 | 2/2016 | Purayath et al. |
| 2016/0043099 A1 | 2/2016 | Purayath et al. |
| 2016/0056167 A1 | 2/2016 | Wang et al. |
| 2016/0056235 A1 | 2/2016 | Lee et al. |
| 2016/0064212 A1 | 3/2016 | Thedjoisworo et al. |
| 2016/0064233 A1 | 3/2016 | Wang et al. |
| 2016/0064247 A1 | 3/2016 | Tomura et al. |
| 2016/0079062 A1 | 3/2016 | Zheng et al. |
| 2016/0079072 A1 | 3/2016 | Wang et al. |
| 2016/0083844 A1 | 3/2016 | Nishitani et al. |
| 2016/0086772 A1 | 3/2016 | Khaja |
| 2016/0086807 A1 | 3/2016 | Park et al. |
| 2016/0086808 A1 | 3/2016 | Zhang et al. |
| 2016/0086815 A1 | 3/2016 | Pandit et al. |
| 2016/0086816 A1 | 3/2016 | Wang et al. |
| 2016/0093505 A1 | 3/2016 | Chen et al. |
| 2016/0093506 A1 | 3/2016 | Chen et al. |

(56) References Cited

U.S. PATENT DOCUMENTS

| | | |
|---|---|---|
| 2016/0093737 A1 | 3/2016 | Li et al. |
| 2016/0097119 A1 | 4/2016 | Cui et al. |
| 2016/0099173 A1 | 4/2016 | Agarwal et al. |
| 2016/0104606 A1 | 4/2016 | Park et al. |
| 2016/0104648 A1 | 4/2016 | Park et al. |
| 2016/0109863 A1 | 4/2016 | Valcore et al. |
| 2016/0111258 A1 | 4/2016 | Taskar |
| 2016/0111315 A1 | 4/2016 | Parkhe |
| 2016/0117425 A1 | 4/2016 | Povolny et al. |
| 2016/0118227 A1 | 4/2016 | Valcore et al. |
| 2016/0118268 A1 | 4/2016 | Ingle et al. |
| 2016/0118396 A1 | 4/2016 | Rabkin et al. |
| 2016/0126118 A1 | 5/2016 | Chen et al. |
| 2016/0133480 A1 | 5/2016 | Ko et al. |
| 2016/0136660 A1 | 5/2016 | Song |
| 2016/0141179 A1 | 5/2016 | Wu et al. |
| 2016/0141419 A1 | 5/2016 | Baenninger et al. |
| 2016/0148805 A1 | 5/2016 | Jongbloed et al. |
| 2016/0148821 A1 | 5/2016 | Singh et al. |
| 2016/0163512 A1 | 6/2016 | Lubomirsky |
| 2016/0163513 A1 | 6/2016 | Lubomirsky |
| 2016/0163558 A1 | 6/2016 | Hudson et al. |
| 2016/0172216 A1 | 6/2016 | Marakhtanov et al. |
| 2016/0172226 A1 | 6/2016 | West et al. |
| 2016/0181112 A1 | 6/2016 | Xue et al. |
| 2016/0181116 A1 | 6/2016 | Berry et al. |
| 2016/0189933 A1 | 6/2016 | Kobayashi et al. |
| 2016/0190147 A1 | 6/2016 | Kato et al. |
| 2016/0196969 A1 | 7/2016 | Berry et al. |
| 2016/0196984 A1 | 7/2016 | Lill et al. |
| 2016/0196985 A1 | 7/2016 | Tan et al. |
| 2016/0203952 A1 | 7/2016 | Tucker et al. |
| 2016/0203958 A1 | 7/2016 | Arase et al. |
| 2016/0204009 A1 | 7/2016 | Nguyen et al. |
| 2016/0208395 A1 | 7/2016 | Ooshima |
| 2016/0217013 A1 | 7/2016 | Song et al. |
| 2016/0218018 A1 | 7/2016 | Lieu et al. |
| 2016/0222522 A1 | 8/2016 | Wang et al. |
| 2016/0225616 A1 | 8/2016 | Li et al. |
| 2016/0225651 A1 | 8/2016 | Tran et al. |
| 2016/0225652 A1 | 8/2016 | Tran et al. |
| 2016/0237570 A1 | 8/2016 | Tan et al. |
| 2016/0240344 A1 | 8/2016 | Kemen et al. |
| 2016/0240353 A1 | 8/2016 | Nagami |
| 2016/0240389 A1 | 8/2016 | Zhang et al. |
| 2016/0240402 A1 | 8/2016 | Park et al. |
| 2016/0254165 A1 | 9/2016 | Posseme |
| 2016/0260588 A1 | 9/2016 | Park et al. |
| 2016/0260616 A1 | 9/2016 | Li et al. |
| 2016/0260619 A1 | 9/2016 | Zhang et al. |
| 2016/0284519 A1 | 9/2016 | Kobayashi et al. |
| 2016/0284522 A1 | 9/2016 | Eto et al. |
| 2016/0284556 A1 | 9/2016 | Ingle et al. |
| 2016/0293388 A1 | 10/2016 | Chen et al. |
| 2016/0293398 A1 | 10/2016 | Danek et al. |
| 2016/0293438 A1 | 10/2016 | Zhou et al. |
| 2016/0300694 A1 | 10/2016 | Yang et al. |
| 2016/0307743 A1 | 10/2016 | Brown et al. |
| 2016/0307771 A1 | 10/2016 | Xu et al. |
| 2016/0307772 A1 | 10/2016 | Choi et al. |
| 2016/0307773 A1 | 10/2016 | Lee et al. |
| 2016/0314961 A1 | 10/2016 | Liu et al. |
| 2016/0314985 A1 | 10/2016 | Yang et al. |
| 2016/0319452 A1 | 11/2016 | Eidschun et al. |
| 2016/0340781 A1 | 11/2016 | Thomas et al. |
| 2016/0340782 A1 | 11/2016 | Chandrasekharan et al. |
| 2016/0343548 A1 | 11/2016 | Howald et al. |
| 2016/0348244 A1 | 12/2016 | Sabri et al. |
| 2016/0351377 A1 | 12/2016 | Okamoto et al. |
| 2016/0358793 A1 | 12/2016 | Okumara et al. |
| 2016/0365228 A1 | 12/2016 | Singh et al. |
| 2017/0004975 A1 | 1/2017 | Farmer et al. |
| 2017/0011922 A1 | 1/2017 | Tanimura et al. |
| 2017/0030626 A1 | 2/2017 | Closs et al. |
| 2017/0040175 A1 | 2/2017 | Xu et al. |
| 2017/0040180 A1 | 2/2017 | Xu et al. |
| 2017/0040190 A1 | 2/2017 | Benjaminson et al. |
| 2017/0040191 A1 | 2/2017 | Benjaminson et al. |
| 2017/0040198 A1 | 2/2017 | Lin et al. |
| 2017/0040207 A1 | 2/2017 | Purayath |
| 2017/0040214 A1 | 2/2017 | Lai et al. |
| 2017/0053808 A1 | 2/2017 | Kamp et al. |
| 2017/0062184 A1 | 3/2017 | Tran et al. |
| 2017/0104061 A1 | 4/2017 | Peng et al. |
| 2017/0110290 A1 | 4/2017 | Kobayashi et al. |
| 2017/0110335 A1 | 4/2017 | Yang et al. |
| 2017/0110475 A1 | 4/2017 | Liu et al. |
| 2017/0121818 A1 | 5/2017 | Dunn et al. |
| 2017/0133202 A1 | 5/2017 | Berry |
| 2017/0154784 A1 | 6/2017 | Wada |
| 2017/0159180 A1* | 6/2017 | Sawachi ............ C23C 16/45561 |
| 2017/0169995 A1 | 6/2017 | Kim et al. |
| 2017/0178894 A1 | 6/2017 | Stone et al. |
| 2017/0178899 A1 | 6/2017 | Kabansky et al. |
| 2017/0178915 A1 | 6/2017 | Ingle et al. |
| 2017/0178924 A1 | 6/2017 | Chen et al. |
| 2017/0194128 A1 | 7/2017 | Lai et al. |
| 2017/0207088 A1 | 7/2017 | Kwon et al. |
| 2017/0221708 A1 | 8/2017 | Bergendahl et al. |
| 2017/0226637 A1 | 8/2017 | Lubomirsky et al. |
| 2017/0229287 A1 | 8/2017 | Xu et al. |
| 2017/0229289 A1* | 8/2017 | Lubomirsky ..... C23C 16/45565 |
| 2017/0229291 A1 | 8/2017 | Singh et al. |
| 2017/0229293 A1 | 8/2017 | Park et al. |
| 2017/0229326 A1 | 8/2017 | Tran et al. |
| 2017/0229328 A1 | 8/2017 | Benjaminson et al. |
| 2017/0229329 A1 | 8/2017 | Benjaminson et al. |
| 2017/0236691 A1* | 8/2017 | Liang ...................... B05B 1/18 156/345.34 |
| 2017/0236694 A1 | 8/2017 | Eason et al. |
| 2017/0250193 A1 | 8/2017 | Huo |
| 2017/0283947 A1 | 10/2017 | Rasheed et al. |
| 2017/0294445 A1 | 10/2017 | Son et al. |
| 2017/0306494 A1 | 10/2017 | Lin et al. |
| 2017/0309509 A1 | 10/2017 | Tran et al. |
| 2017/0316920 A1 | 11/2017 | Melikyan et al. |
| 2017/0316935 A1 | 11/2017 | Tan et al. |
| 2017/0323825 A1 | 11/2017 | Tomura et al. |
| 2017/0330728 A1 | 11/2017 | Bravo et al. |
| 2017/0335457 A1 | 11/2017 | Nguyen et al. |
| 2017/0338133 A1 | 11/2017 | Tan et al. |
| 2017/0338134 A1 | 11/2017 | Tan et al. |
| 2017/0342556 A1 | 11/2017 | Crook et al. |
| 2017/0350011 A1 | 12/2017 | Marquardt |
| 2017/0362704 A1 | 12/2017 | Yamashita |
| 2017/0373082 A1 | 12/2017 | Sekine et al. |
| 2018/0005850 A1 | 1/2018 | Citla et al. |
| 2018/0005857 A1 | 1/2018 | Zhang et al. |
| 2018/0006041 A1 | 1/2018 | Xu et al. |
| 2018/0006050 A1 | 1/2018 | Watanabe et al. |
| 2018/0025900 A1 | 1/2018 | Park et al. |
| 2018/0033643 A1 | 2/2018 | Sharma et al. |
| 2018/0061618 A1 | 3/2018 | Nichols et al. |
| 2018/0069000 A1 | 3/2018 | Bergendahl et al. |
| 2018/0076031 A1 | 3/2018 | Yan et al. |
| 2018/0076044 A1 | 3/2018 | Choi et al. |
| 2018/0076048 A1 | 3/2018 | Gohira et al. |
| 2018/0076083 A1 | 3/2018 | Ko et al. |
| 2018/0080124 A1 | 3/2018 | Bajaj et al. |
| 2018/0082861 A1 | 3/2018 | Citla et al. |
| 2018/0096818 A1 | 4/2018 | Lubomirsky |
| 2018/0096819 A1 | 4/2018 | Lubomirsky et al. |
| 2018/0096821 A1 | 4/2018 | Lubomirsky et al. |
| 2018/0096865 A1 | 4/2018 | Lubomirsky et al. |
| 2018/0102255 A1 | 4/2018 | Chen et al. |
| 2018/0102256 A1 | 4/2018 | Chen et al. |
| 2018/0102259 A1 | 4/2018 | Wang et al. |
| 2018/0130818 A1 | 5/2018 | Kim et al. |
| 2018/0138049 A1 | 5/2018 | Ko et al. |
| 2018/0138055 A1 | 5/2018 | Xu et al. |
| 2018/0138075 A1 | 5/2018 | Kang et al. |
| 2018/0138085 A1 | 5/2018 | Wang et al. |
| 2018/0144970 A1 | 5/2018 | Chuang et al. |
| 2018/0151683 A1 | 5/2018 | Yeo et al. |

(56) References Cited

U.S. PATENT DOCUMENTS

| | | |
|---|---|---|
| 2018/0175051 A1 | 6/2018 | Lue et al. |
| 2018/0182633 A1 | 6/2018 | Pandit et al. |
| 2018/0182777 A1 | 6/2018 | Cui et al. |
| 2018/0211862 A1 | 7/2018 | Konkola et al. |
| 2018/0223437 A1 | 8/2018 | George et al. |
| 2018/0226223 A1 | 8/2018 | Lubomirsky |
| 2018/0226230 A1 | 8/2018 | Kobayashi et al. |
| 2018/0226259 A1 | 8/2018 | Choi et al. |
| 2018/0226278 A1 | 8/2018 | Arnepalli et al. |
| 2018/0226425 A1 | 8/2018 | Purayath |
| 2018/0226426 A1 | 8/2018 | Purayath |
| 2018/0240654 A1 | 8/2018 | Park et al. |
| 2018/0261516 A1 | 9/2018 | Lin et al. |
| 2018/0261686 A1 | 9/2018 | Lin et al. |
| 2018/0337024 A1 | 11/2018 | Tan et al. |
| 2018/0337057 A1 | 11/2018 | Samir et al. |
| 2018/0342375 A1 | 11/2018 | Nguyen et al. |
| 2018/0350619 A1 | 12/2018 | Chen et al. |
| 2018/0366351 A1 | 12/2018 | Lubomirsky |
| 2019/0013211 A1 | 1/2019 | Wang et al. |
| 2019/0032211 A1 | 1/2019 | Tucker et al. |
| 2019/0037264 A1 | 1/2019 | Lyons et al. |
| 2019/0040529 A1 | 2/2019 | Verbaas et al. |
| 2019/0067006 A1 | 2/2019 | Hawrylchak et al. |
| 2019/0074191 A1 | 3/2019 | Nagatomo et al. |
| 2019/0244792 A1* | 8/2019 | Liang ................ C23C 16/45565 |
| 2019/0252154 A1 | 8/2019 | Samir et al. |
| 2019/0252216 A1 | 8/2019 | Samir et al. |
| 2019/0271082 A1 | 9/2019 | Wang et al. |
| 2019/0272998 A1 | 9/2019 | Yang et al. |
| 2019/0311883 A1 | 10/2019 | Samir et al. |
| 2019/0333786 A1 | 10/2019 | Samir et al. |
| 2019/0385823 A1* | 12/2019 | Liang ................ C23C 16/45582 |
| 2020/0060005 A1 | 2/2020 | Radermacher et al. |
| 2020/0066556 A1 | 2/2020 | Benjaminson et al. |
| 2020/0087784 A1 | 3/2020 | Wu et al. |
| 2020/0149166 A1* | 5/2020 | Chuc .................... C23C 16/452 |
| 2020/0215566 A1 | 7/2020 | Subbuswamy et al. |
| 2021/0005472 A1 | 1/2021 | Kanarik et al. |

FOREIGN PATENT DOCUMENTS

| | | |
|---|---|---|
| CN | 101236893 A | 8/2008 |
| CN | 101378850 A | 3/2009 |
| CN | 102893705 | 1/2013 |
| EP | 1675160 A1 | 6/2006 |
| JP | S59-126778 A | 7/1984 |
| JP | S62-45119 A | 2/1987 |
| JP | 63301051 A | 12/1988 |
| JP | H01-200627 A | 8/1989 |
| JP | H02-114525 A | 4/1990 |
| JP | H07-153739 A | 6/1995 |
| JP | H08-31755 A | 2/1996 |
| JP | H08-107101 A | 4/1996 |
| JP | H08-264510 A | 10/1996 |
| JP | H09-260356 A | 10/1997 |
| JP | 2001-313282 A | 11/2001 |
| JP | 2001-332608 A | 11/2001 |
| JP | 2002-075972 A | 3/2002 |
| JP | 2002-083869 A | 3/2002 |
| JP | 2003-174020 A | 6/2003 |
| JP | 2003-282591 A | 10/2003 |
| JP | 2004-508709 A | 3/2004 |
| JP | 2004-296467 A | 10/2004 |
| JP | 2005-050908 A | 2/2005 |
| JP | 2006-041039 A | 2/2006 |
| JP | 2006-066408 A | 3/2006 |
| JP | 2008-288560 A | 11/2008 |
| JP | 4191137 B2 | 12/2008 |
| JP | 2009-141343 A | 6/2009 |
| JP | 2009-530871 A | 8/2009 |
| JP | 2009-239056 A | 10/2009 |
| JP | 2010-180458 A | 8/2010 |
| JP | 2011-508436 A | 3/2011 |
| JP | 2011-518408 A | 6/2011 |
| JP | 4763293 B2 | 8/2011 |
| JP | 2011-171378 A | 9/2011 |
| JP | 2012-019164 A | 1/2012 |
| JP | 2012-019194 A | 1/2012 |
| JP | 2012-512531 A | 5/2012 |
| JP | 2013-243418 A | 12/2013 |
| JP | 5802323 B2 | 10/2015 |
| JP | 2016-111177 A | 6/2016 |
| KR | 2000-0008278 A | 2/2000 |
| KR | 2000-0064946 A | 11/2000 |
| KR | 2001-0056735 A | 7/2001 |
| KR | 2003-0023964 A | 3/2003 |
| KR | 2003-0054726 A | 7/2003 |
| KR | 2003-0083663 A | 10/2003 |
| KR | 100441297 B1 | 7/2004 |
| KR | 2005-0007143 A | 1/2005 |
| KR | 2005-0042701 A | 5/2005 |
| KR | 2005-0049903 A | 5/2005 |
| KR | 2006-0080509 A | 7/2006 |
| KR | 1006-41762 B1 | 11/2006 |
| KR | 2006-0127173 A | 12/2006 |
| KR | 100663668 B1 | 1/2007 |
| KR | 100678696 B1 | 1/2007 |
| KR | 100712727 B1 | 4/2007 |
| KR | 2007-0079870 A | 8/2007 |
| KR | 2008-0063988 A | 7/2008 |
| KR | 100843236 B1 | 7/2008 |
| KR | 2009-0040869 A | 4/2009 |
| KR | 2009-0128913 A | 12/2009 |
| KR | 10-2010-0013980 A | 2/2010 |
| KR | 2010-0093358 A | 8/2010 |
| KR | 2011-0086540 A | 7/2011 |
| KR | 2011-0114538 A | 10/2011 |
| KR | 2011-0126675 A | 11/2011 |
| KR | 2012-0022251 A | 3/2012 |
| KR | 2012-0082640 A | 7/2012 |
| KR | 2016-0002543 A | 1/2016 |
| TW | 2006-12480 A | 4/2006 |
| TW | 200709256 A | 3/2007 |
| TW | 2007-35196 A | 9/2007 |
| TW | 2011-27983 A | 8/2011 |
| TW | 2012-07919 A | 2/2012 |
| TW | 2012-13594 A | 4/2012 |
| TW | 2012-33842 A | 8/2012 |
| WO | 2008-112673 A2 | 9/2008 |
| WO | 2009-084194 A1 | 7/2009 |
| WO | 2010-010706 | 1/2010 |
| WO | 2010-113946 A1 | 10/2010 |
| WO | 2011-027515 A | 3/2011 |
| WO | 2011-031556 A2 | 3/2011 |
| WO | 2011-070945 A1 | 6/2011 |
| WO | 2011-095846 A1 | 8/2011 |
| WO | 2011-149638 A2 | 12/2011 |
| WO | 2012-050321 A | 4/2012 |
| WO | 2012-118987 A1 | 9/2012 |
| WO | 2012-125656 A2 | 9/2012 |
| WO | 2012-148568 A1 | 11/2012 |
| WO | 2013-118260 A1 | 8/2013 |

* cited by examiner

CHEMICAL CONTROL FEATURES IN WAFER PROCESS EQUIPMENT

CROSS-REFERENCES TO RELATED APPLICATIONS

This application is a continuation of U.S. patent application Ser. No. 15/581,357, filed Apr. 28, 2017, which is a continuation of U.S. patent application Ser. No. 14/853,838, filed Sep. 14, 2015, now U.S. Pat. No. 9,978,564, which is a divisional of U.S. patent application Ser. No. 13/799,840, filed on Mar. 13, 2013, now U.S. Pat. No. 9,132,436, which claims the benefit of U.S. Provisional Application No. 61/704,257, filed Sep. 21, 2012. The entire disclosures of which are hereby incorporated by reference for all purposes.

TECHNICAL FIELD

The present technology relates to semiconductor processes and equipment. More specifically, the present technology relates to processing system plasma components.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Dry etches produced in local plasmas formed within the substrate processing region can penetrate more constrained trenches and exhibit less deformation of delicate remaining structures. However, as integrated circuit technology continues to scale down in size, the equipment that delivers the precursors can impact the uniformity and quality of the precursors and plasma species used.

Thus, there is a need for improved system components that can be used in plasma environments effectively while providing suitable degradation profiles. These and other needs are addressed by the present technology.

SUMMARY

Gas distribution assemblies are described including an annular body, an upper plate, and a lower plate. The upper plate may define a first plurality of apertures, and the lower plate may define a second and third plurality of apertures. The upper and lower plates may be coupled with one another and the annular body such that the first and second apertures produce channels through the gas distribution assemblies, and a volume is defined between the upper and lower plates.

The assemblies may include an annular body having an inner annular wall located at an inner diameter, an outer annular wall located at an outer diameter, as well as an upper surface and a lower surface. The annular body may further include a first upper recess formed in the upper surface, a first lower recess formed in the lower surface at the inner annular wall, and a second lower recess formed in the lower surface below and radially outward of the first lower recess. The annular body may also define a first fluid channel in the upper surface that is located in the annular body radially inward of the first upper recess. The assemblies may include an upper plate coupled with the annular body at the first upper recess and covering the first fluid channel, and the upper plate may define a plurality of first apertures. The assemblies may also include a lower plate coupled with the annular body at the first lower recess and having a plurality of second apertures defined in the plate where the second apertures align with the first apertures defined in the upper plate. The lower plate may also define a plurality of third apertures located between the second apertures. The upper and lower plates may be coupled with one another such that the first and second apertures are aligned to form a channel through the upper and lower plates.

The upper and lower plates of the assemblies may be bonded together. The annular body of the assemblies may further define a second fluid channel in the upper surface that is located radially outward of the first fluid channel, and a plurality of ports may be defined in a portion of the annular body defining an outer wall of the first fluid channel and an inner wall of the second fluid channel. The second fluid channel may be located radially outward of the upper recess such that the second fluid channel is not covered by the upper plate. The annular body may define a second upper recess near the top of the second fluid channel in both the inner wall and an outer wall, and the gas distribution assembly may include an annular member positioned within the second upper recess so as to cover the second fluid channel. The upper recess may include a bottom portion that intersects the outer wall of the first fluid channel.

The assemblies may further include a pair of isolation channels, where one of the pair of isolation channels is defined in the upper surface of the annular body, and the other of the pair of isolation channels is defined in the lower surface of the annular body. The pair of isolation channels may be vertically aligned with one another. The second fluid channel may be located radially inward of the upper recess such that the second fluid channel is covered by the upper plate in embodiments. A portion of the upper plate may also extend into the second channel below a bottom of the upper recess. The plurality of ports may be angled upward from the second fluid channel to the first fluid channel such that the ports are fluidly accessible below the portion of the upper plate extending into the second channel. The isolation channels may be disposed in embodiments so that one of the pair of isolation channels is defined in the upper plate at a location radially inward from the upper recess, and the other of the pair of isolation channels is defined in the lower surface of the annular body so that the pair of isolation channels are vertically aligned with one another. The annular body may also define an annular temperature channel configured to receive a cooling fluid operable to maintain a temperature of the annular body. The temperature channel may also be configured to receive a heating element disposed within the channel and operable to maintain a temperature of the annular body.

Gas distribution assemblies are also described that may include an annular body. The annular body may include an inner annular wall located at an inner diameter, an outer annular wall located at an outer diameter, and an upper surface and a lower surface. An upper recess may be formed in the upper surface and a lower recess may be formed in the lower surface. A first fluid channel may be defined in the lower surface that is located in the annular body radially inward of the lower recess. The assemblies may also include an upper plate coupled with the annular body at the upper recess, where the upper plate defines a plurality of first apertures. The assemblies may also include a lower plate coupled with the annular body at the lower recess, and covering the first fluid channel. The lower plate may define a plurality of second apertures that align with the first apertures defined in the upper plate. The lower plate may further define a plurality of third apertures located between the second apertures. The upper and lower plates may be coupled with one another such that the first and second apertures are aligned to form a channel through the upper and lower plates.

The gas distribution assemblies may include a second fluid channel defined in the lower surface that is located in the annular body radially outward of the first fluid channel. A plurality of ports may be defined in a portion of the annular body defining an outer wall of the first fluid channel and an inner wall of the second fluid channel, and the plurality of ports may be configured to fluidly couple the second fluid channel with the first fluid channel. The second fluid channel may be located radially inward of the lower recess such that the second fluid channel may be covered by the lower plate, and where a portion of the lower plate extends into the second channel above a top of the lower recess. The plurality of ports may be angled downward from the second fluid channel to the first fluid channel such that the ports are fluidly accessible above the portion of the lower plate extending into the second channel. The first apertures may also have a conical shape of decreasing diameter as the first apertures extend through the upper plate. The second and third apertures may have a conical shape of increasing diameter as the second and third apertures extend through the lower plate. Each of the second and third apertures may also include at least three sections of different shape or diameter.

Gas distribution assemblies are also described having an annular body having an inner wall located at an inner diameter, an outer wall located at an outer diameter, an upper surface, and a lower surface. The assemblies may also include an upper plate coupled with the annular body, and the upper plate may define a plurality of first apertures. An intermediate plate may be coupled with the upper plate, and the intermediate plate may define a plurality of second and third apertures, where the second apertures align with the first apertures of the upper plate. The assemblies may also include a lower plate coupled with the annular body and the intermediate plate. The lower plate may define a plurality of fourth apertures that align with the first apertures of the upper plate and the second apertures of the intermediate plate to form a first set of fluid channels through the plates. The lower plate may also define a plurality of fifth apertures that align with the third apertures of the intermediate plate to form a second set of fluid channels through the intermediate and lower plates, where the second set of fluid channels are fluidly isolated from the first set of fluid channels. The lower plate may further define a sixth set of apertures that form a third set of fluid channels through the lower plate, where the third set of fluid channels are fluidly isolated from the first and second set of fluid channels.

The lower plate of the gas distribution assemblies may include an orientation of the fourth, fifth, and sixth apertures such that a majority of fourth apertures are each surrounded by at least four of the fifth apertures and four of the sixth apertures. The fifth apertures may be located around the fourth apertures with centers of the fifth apertures at about 90° intervals from one another about a center of the fourth apertures, and the sixth apertures may be located around the fourth apertures with centers of the sixth apertures at about 90° intervals from one another about the center of the fourth apertures and offset from the fifth apertures by about 45°. The fifth apertures may be located around the fourth apertures with centers of the fifth apertures at about 60° intervals from one another about a center of the fourth apertures, and where the sixth apertures are located around the fourth apertures with centers of the sixth apertures at about 60° intervals from one another about the center of the fourth apertures and offset from the fifth apertures by about 30°.

Such technology may provide numerous benefits over conventional systems and techniques. For example, leakage through the assembly may be minimized or avoided providing improved flow characteristics, which may lead to improved process uniformity. Additionally, multiple precursors may be delivered through the assembly while being maintained fluidly isolated from one another. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

In the appended figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

The present technology includes improved gas distribution assembly or showerhead designs for distributing processing gases to produce flow patterns for forming deposition layers on a semiconductor substrate of a more uniform height and/or etching deposited layers in a more uniform fashion. While conventional showerhead designs may simply provide pass-through distribution systems for processing and precursor gases, the presently described technology allows for improved control of the flow characteristics of gases as they are delivered to a substrate processing chamber. In so doing, deposition operations may produce more accurate film profiles during manufacturing operations.

Although some conventional gas distribution assemblies or showerheads may include multiple fluid channels covered by a plate, for example, such designs routinely suffer from gaps along the intersections of the plate with the portions of the body located between the channels and the inner walls.

When the plate is coupled with the body, for example via bonding, brazing, etc., the plate may warp. Because the coupling may be performed only around the outer edge, no additional bonding may exist at other interfaces of the plate and body. Even slight warping of the plate may produce an uneven surface at the interfaces between the upper plate and annular body, and interface locations where warping has occurred may not properly couple with the annular body. As such, in operation, fluid may leak between the first and second fluid channels, as well as between the first fluid channel and a central region. Such leakage can affect fluid delivery into the processing region, which can impact deposition or etching. Aspects of the present technology, however, overcome many if not all of these issues by providing components that are less likely to warp, and/or designs that are less impacted by warping.

Figure 1:
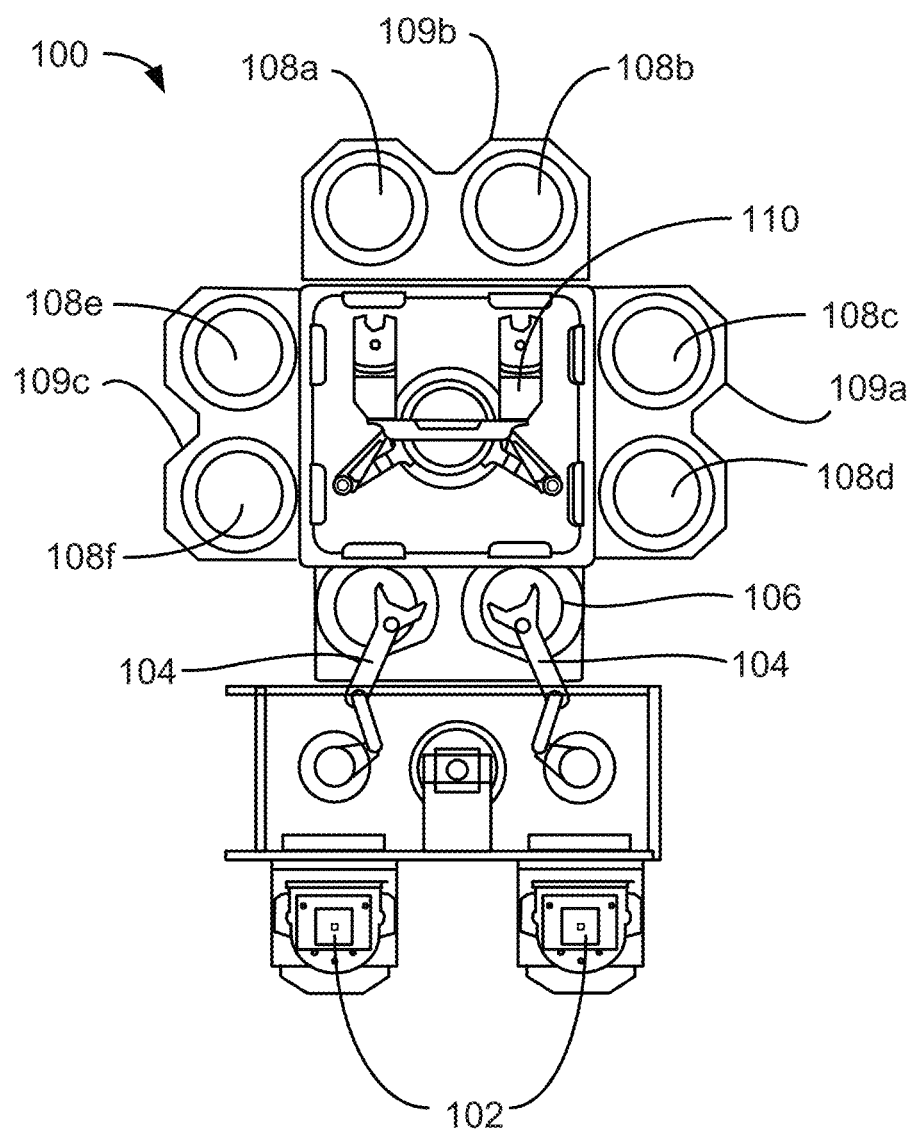
FIG. 1 shows a top plan view of one embodiment of an exemplary processing tool.

FIG. 1 shows a top plan view of one embodiment of a processing tool 100 of deposition, etching, baking, and/or curing chambers according to disclosed embodiments. In the figure, a pair of FOUPs (front opening unified pods) 102 supply substrates (e.g., various specified diameter semiconductor wafers) that may be received by robotic arms 104 and placed into a low-pressure holding area 106 before being placed into one of the substrate processing sections 108a-f of the tandem process chambers 109a-c. A second robotic arm 110 may be used to transport the substrates from the holding area 106 to the processing chambers 108a-f and back.

The substrate processing sections 108a-f of the tandem process chambers 109a-c may include one or more system components for depositing, annealing, curing and/or etching substrates or films thereon. Exemplary films may be flowable dielectrics, but many types of films may be formed or processed with the processing tool. In one configuration, two pairs of the tandem processing sections of the processing chamber (e.g., 108c-d and 108e-f) may be used to deposit the dielectric material on the substrate, and the third pair of tandem processing sections (e.g., 108a-b) may be used to anneal the deposited dielectric. In another configuration, the two pairs of the tandem processing sections of processing chambers (e.g., 108c-d and 108e-f) may be configured to both deposit and anneal a dielectric film on the substrate, while the third pair of tandem processing sections (e.g., 108a-b) may be used for UV or E-beam curing of the deposited film. In still another configuration, all three pairs of tandem processing sections (e.g., 108a-f) may be configured to deposit and cure a dielectric film on the substrate or etch features into a deposited film.

In yet another configuration, two pairs of tandem processing sections (e.g., 108c-d and 108e-f) may be used for both deposition and UV or E-beam curing of the dielectric, while a third pair of tandem processing sections (e.g. 108a-b) may be used for annealing the dielectric film. In addition, one or more of the tandem processing sections 108a-f may be configured as a treatment chamber, and may be a wet or dry treatment chamber. These process chambers may include heating the dielectric film in an atmosphere that includes moisture. Thus, embodiments of system 100 may include wet treatment tandem processing sections 108a-b and anneal tandem processing sections 108c-d to perform both wet and dry anneals on the deposited dielectric film. It will be appreciated that additional configurations of deposition, annealing, and curing chambers for dielectric films are contemplated by system 100.

Figure 2A:
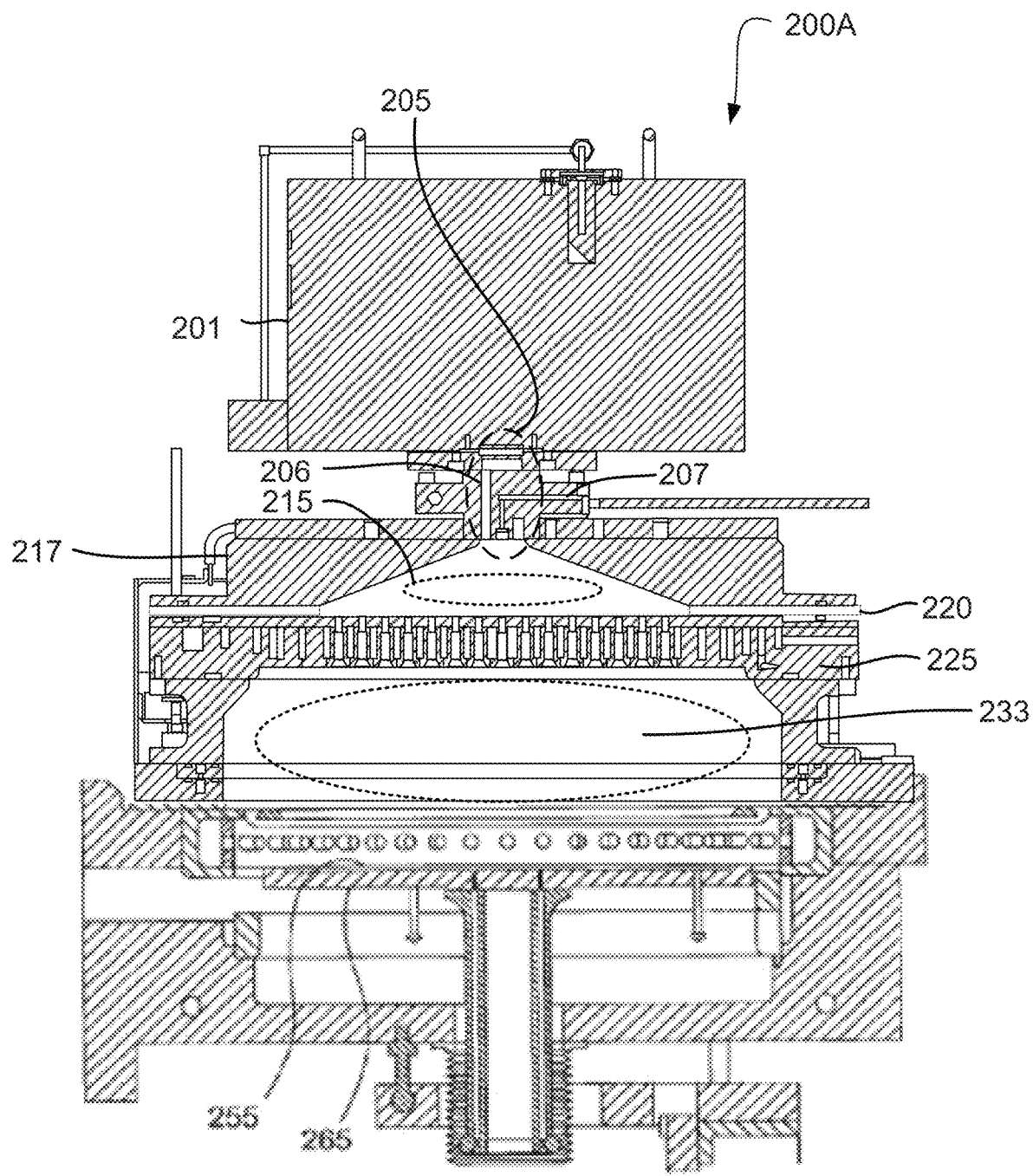
FIGS. 2A-2E show schematic cross-sectional views of an exemplary processing chamber.

FIG. 2A is a cross-sectional view of an exemplary process chamber section 200 with partitioned plasma generation regions within the processing chambers. During film deposition (e.g., silicon oxide, silicon nitride, silicon oxynitride, or silicon oxycarbide), a process gas may be flowed into the first plasma region 215 through a gas inlet assembly 205. A remote plasma system (RPS) 201 may process a gas which then travels through gas inlet assembly 205. Two distinct gas supply channels are visible within the gas inlet assembly 205. A first channel 206 carries a gas that passes through the remote plasma system (RPS) 201, while a second channel 207 bypasses the RPS 201. The first channel 206 may be used for the process gas and the second channel 207 may be used for a treatment gas in disclosed embodiments. The process gas may be excited prior to entering the first plasma region 215 within a remote plasma system (RPS) 201. A lid 212, a showerhead 225, and a substrate support 265, having a substrate 255 disposed thereon, are shown according to disclosed embodiments. The lid 212 may be pyramidal, conical, or of another similar structure with a narrow top portion expanding to a wide bottom portion. Additional geometries of the lid 212 may also be used. The lid (or conductive top portion) 212 and showerhead 225 are shown with an insulating ring 220 in between, which allows an AC potential to be applied to the lid 212 relative to showerhead 225. The insulating ring 220 may be positioned between the lid 212 and the showerhead 225 enabling a capacitively coupled plasma (CCP) to be formed in the first plasma region. A baffle (not shown) may additionally be located in the first plasma region 215 to affect the flow of fluid into the region through gas inlet assembly 205.

A fluid, such as a precursor, for example a silicon-containing precursor, may be flowed into the processing region 233 by embodiments of the showerhead described herein. Excited species derived from the process gas in the plasma region 215 may travel through apertures in the showerhead 225 and react with the precursor flowing into the processing region 233 from the showerhead. Little or no plasma may be present in the processing region 233. Excited derivatives of the process gas and the precursor may combine in the region above the substrate and, on occasion, on the substrate to form a film on the substrate that may be flowable in disclosed applications. For flowable films, as the film grows, more recently added material may possess a higher mobility than underlying material. Mobility may decrease as organic content is reduced by evaporation. Gaps may be filled by the flowable film using this technique without leaving traditional densities of organic content within the film after deposition is completed. A curing step may still be used to further reduce or remove the organic content from a deposited film.

Exciting the process gas in the first plasma region 215 directly, exciting the process gas in the RPS, or both, may provide several benefits. The concentration of the excited species derived from the process gas may be increased within the processing region 233 due to the plasma in the first plasma region 215. This increase may result from the location of the plasma in the first plasma region 215. The processing region 233 may be located closer to the first plasma region 215 than the remote plasma system (RPS) 201, leaving less time for the excited species to leave excited states through collisions with other gas molecules, walls of the chamber, and surfaces of the showerhead.

The uniformity of the concentration of the excited species derived from the process gas may also be increased within the processing region 233. This may result from the shape of the first plasma region 215, which may be more similar to the shape of the processing region 233. Excited species created in the remote plasma system (RPS) 201 may travel greater distances in order to pass through apertures near the edges of the showerhead 225 relative to species that pass through apertures near the center of the showerhead 225. The greater distance may result in a reduced excitation of the excited species and, for example, may result in a slower growth rate near the edge of a substrate. Exciting the process gas in the first plasma region 215 may mitigate this variation.

The processing gas may be excited in the RPS 201 and may be passed through the showerhead 225 to the processing region 233 in the excited state. Alternatively, power may be applied to the first processing region to either excite a plasma gas or enhance an already exited process gas from the RPS. While a plasma may be generated in the processing region 233, a plasma may alternatively not be generated in the processing region. In one example, the only excitation of the processing gas or precursors may be from exciting the processing gas in the RPS 201 to react with the precursors in the processing region 233.

The processing chamber and this discussed tool are more fully described in patent application Ser. No. 12/210,940 filed on Sep. 15, 2008, and patent application Ser. No. 12/210,982 filed on Sep. 15, 2008, which are incorporated herein by reference to the extent not inconsistent with the claimed aspects and description herein.

Figure 2B:
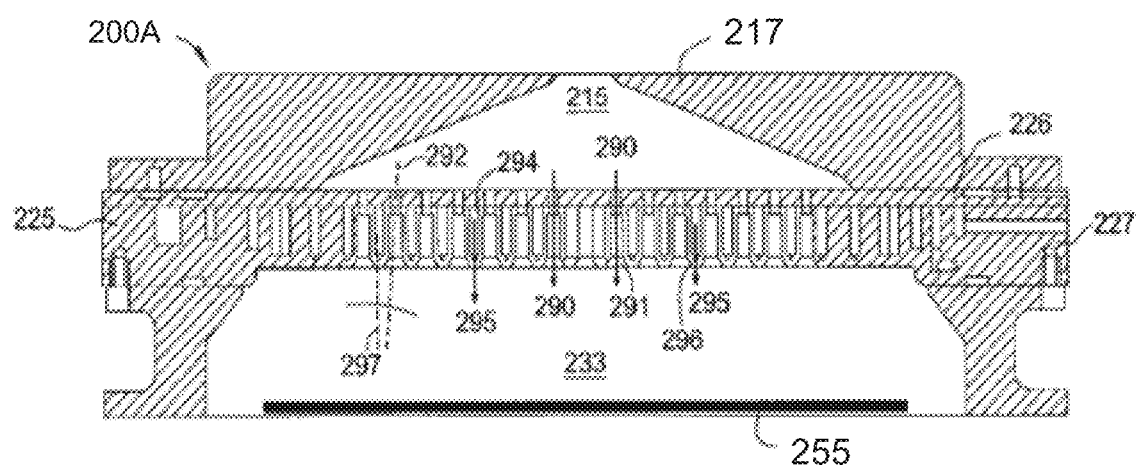
Figure 2C:
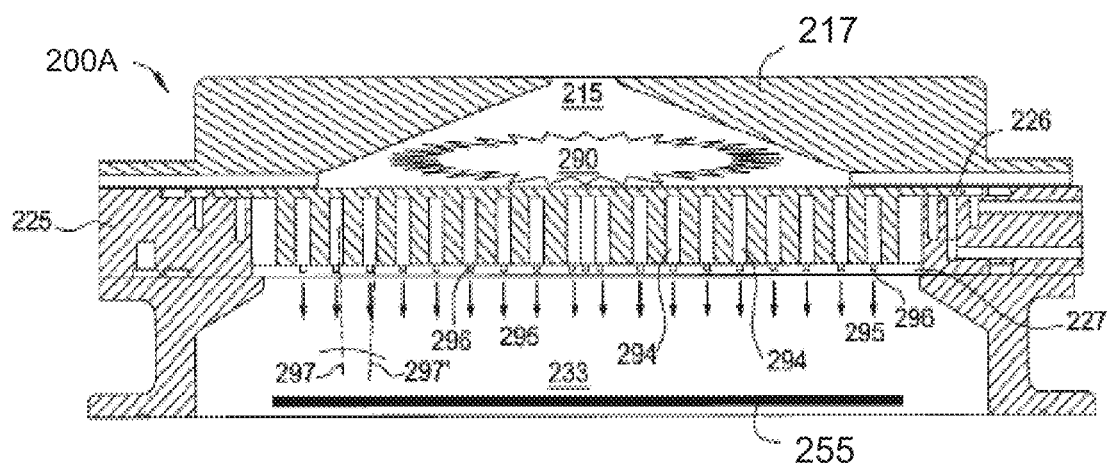

FIGS. 2B-2C are side schematic views of one embodiment of the precursor flow processes in the processing chambers and the gas distribution assemblies described herein. The gas distribution assemblies for use in the processing chamber section 200 may be referred to as dual channel showerheads (DCSH) or triple channel showerheads (TCSH) and are detailed in the embodiments described in FIGS. 3A-3G, 4A-4B, and 5A-5C herein. The dual or triple channel showerhead may allow for flowable deposition of a dielectric material, and separation of precursor and processing fluids during operation. The showerhead may alternatively be utilized for etching processes that allow for separation of etchants outside of the reaction zone to provide limited interaction with chamber components.

Precursors may be introduced into the distribution zone by first being introduced into an internal showerhead volume 294 defined in the showerhead 225 by a first manifold 226, or upper plate, and second manifold 227, or lower plate. The manifolds may be perforated plates that define a plurality of apertures. The precursors in the internal showerhead volume 294 may flow 295 into the processing region 233 via apertures 296 formed in the lower plate. This flow path may be isolated from the rest of the process gases in the chamber, and may provide for the precursors to be in an unreacted or substantially unreacted state until entry into the processing region 233 defined between the substrate 217 and a bottom of the lower plate 227. Once in the processing region 233, the precursor may react with a processing gas. The precursor may be introduced into the internal showerhead volume 294 defined in the showerhead 225 through a side channel formed in the showerhead, such as channels 322, 422 as shown in the showerhead embodiments herein. The process gas may be in a plasma state including radicals from the RPS unit or from a plasma generated in the first plasma region. Additionally, a plasma may be generated in the processing region.

Processing gases may be provided into the first plasma region 215, or upper volume, defined by the faceplate 217 and the top of the showerhead 225. The processing gas may be plasma excited in the first plasma region 215 to produce process gas plasma and radicals. Alternatively, the processing gas may already be in a plasma state after passing through a remote plasma system prior to introduction to the first plasma processing region 215 defined by the faceplate 217 and the top of the showerhead 225.

The processing gas including plasma and radicals may then be delivered to the processing region 233 for reaction with the precursors though channels, such as channels 290, formed through the apertures in the showerhead plates or manifolds. The processing gasses passing though the channels may be fluidly isolated from the internal showerhead volume 294 and may not react with the precursors passing through the internal showerhead volume 294 as both the processing gas and the precursors pass through the showerhead 225. Once in the processing volume, the processing gas and precursors may mix and react.

In addition to the process gas and a dielectric material precursor, there may be other gases introduced at varied times for varied purposes. A treatment gas may be introduced to remove unwanted species from the chamber walls, the substrate, the deposited film and/or the film during deposition. A treatment gas may be excited in a plasma and then used to reduce or remove residual content inside the chamber. In other disclosed embodiments the treatment gas may be used without a plasma. When the treatment gas includes water vapor, the delivery may be achieved using a mass flow meter (MFM), an injection valve, or by commercially available water vapor generators. The treatment gas may be introduced from the first processing region, either through the RPS unit or bypassing the RPS unit, and may further be excited in the first plasma region.

The axis 292 of the opening of apertures 291 and the axis 297 of the opening of apertures 296 may be parallel or substantially parallel to one another. Alternatively, the axis 292 and axis 297 may be angled from each other, such as from about 1° to about 80°, for example, from about 1° to about 30°. Alternatively, each of the respective axes 292 may be angled from each other, such as from about 1° to about 80°, for example, from about 1° to about 30°, and each of the respective axis 297 may be angled from each other, such as from about 1° to about 80°, for example, from about 1° to about 30°.

The respective openings may be angled, such as shown for aperture 291 in FIG. 2B, with the opening having an angle from about 1° to about 80°, such as from about 1° to about 30°. The axis 292 of the opening of apertures 291 and the axis 297 of the opening of apertures 296 may be perpendicular or substantially perpendicular to the surface of the substrate 217. Alternatively, the axis 292 and axis 297 may be angled from the substrate surface, such as less than about 5°.

FIG. 2C illustrates a partial schematic view of the processing chamber 200 and showerhead 225 illustrating the precursor flow 295 from the internal volume 294 through apertures 296 into the processing region 233. The figure also illustrates an alternative embodiment showing axis 297 and 297' of two apertures 296 being angled from one another.

Figure 2D:
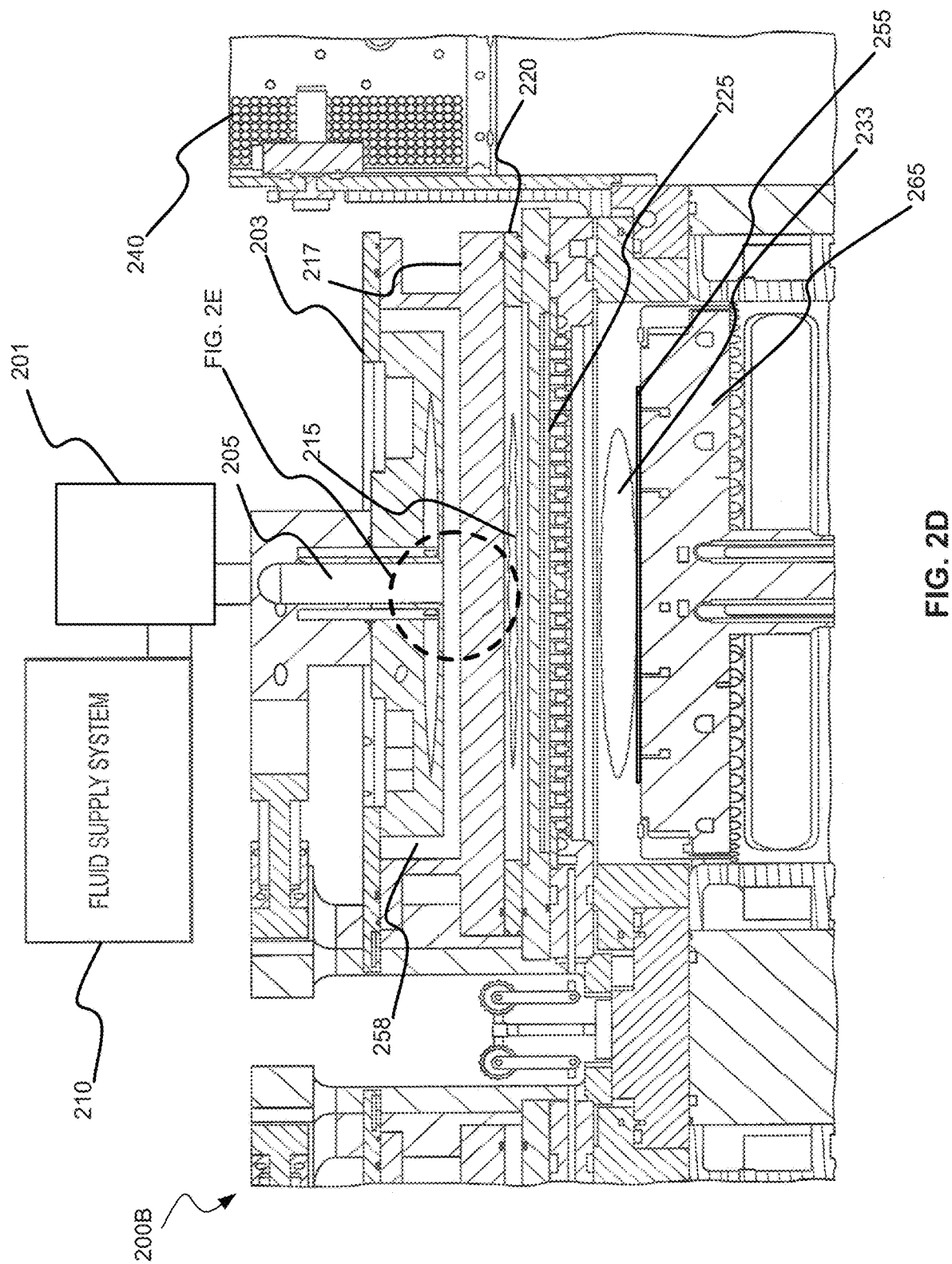

FIG. 2D shows a simplified cross-sectional view of another exemplary processing system 200 according to embodiments of the present technology that may include an alternative fluid delivery system. Distribution of the processing gas may be achieved by use of a faceplate 217 as shown. Processing gases may be delivered through a fluid supply system 210, and the chamber may or may not include components as previously described including RPS 201, first plasma region 215, insulating ring 220, showerhead 225, processing region 233, pedestal 265, and substrate 255. The system may also include cooling plate 203 in the modified distribution system.

Figure 2E:
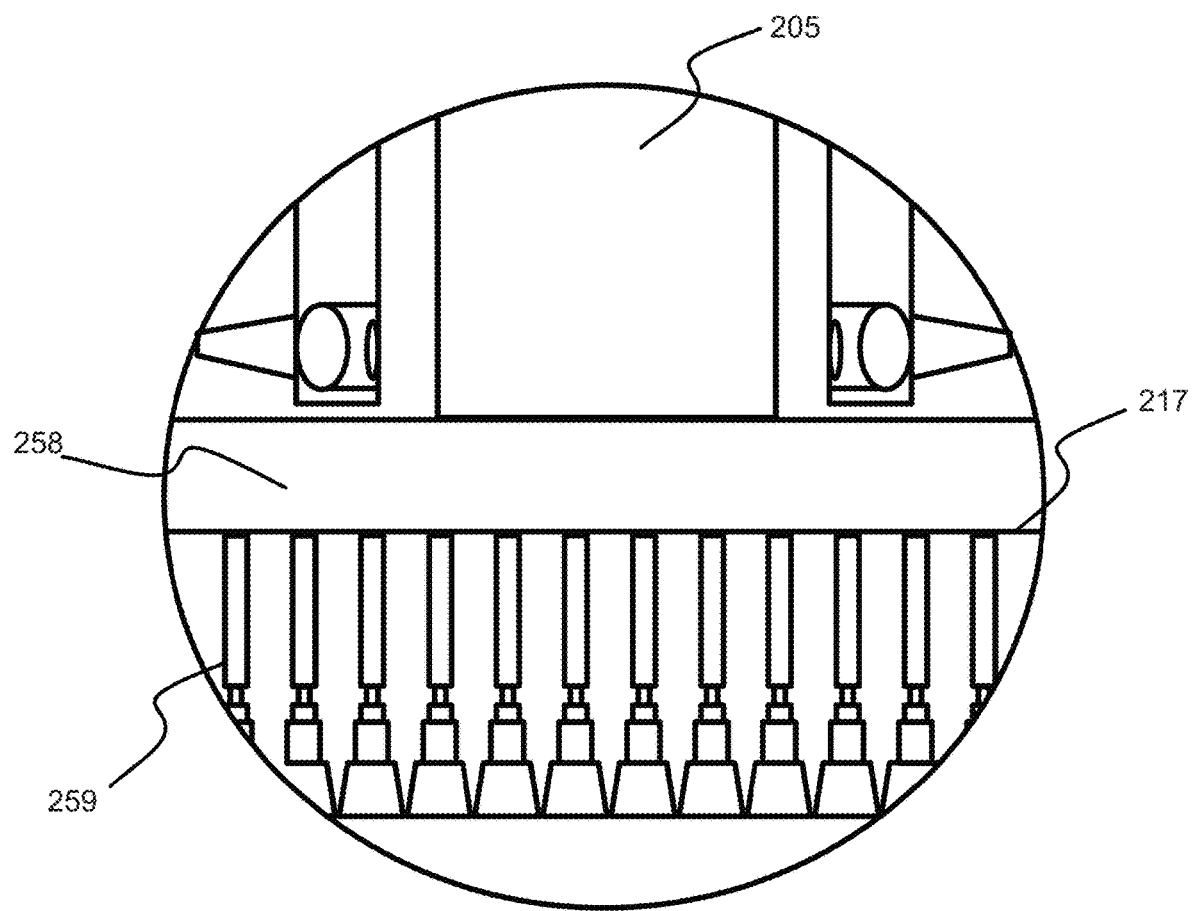

Plasma generating gases and/or plasma excited species, depending on use of the RPS 201, may pass through a plurality of holes, shown in FIG. 2E, in faceplate 217 for a more uniform delivery into the first plasma region 215. Exemplary configurations include having the gas inlet assembly 205 open into a gas supply region 258 partitioned from the first plasma region 215 by faceplate 217 so that the gases/species flow through the holes in the faceplate 217 into the first plasma region 215. Structural and operational features may be selected to prevent significant backflow of plasma from the first plasma region 215 back into the supply region 258, gas inlet assembly 205, and fluid supply system 210. The structural features may include the selection of dimensions and cross-sectional geometry of the apertures in faceplate 217 that deactivates back-streaming plasma. The operational features may include maintaining a pressure difference between the gas supply region 258 and first plasma region 215 that maintains a unidirectional flow of plasma through the showerhead 225.

The processing system may further include a power supply 240 electrically coupled with the processing chamber to provide electric power to the faceplate 217 and/or showerhead 225 to generate a plasma in the first plasma region 215 or processing region 233. The power supply may be configured to deliver an adjustable amount of power to the chamber depending on the process performed.

FIG. 2E shows a detailed view of the features affecting the processing gas distribution through faceplate 217. As shown in FIGS. 2D and 2E, faceplate 217, cooling plate 203, and gas inlet assembly 205 intersect to define a gas supply region 258 into which process gases may be delivered from gas inlet 205. The gases may fill the gas supply region 258 and flow to first plasma region 215 through apertures 259 in faceplate 217. The apertures 259 may be configured to direct flow in a substantially unidirectional manner such that process gases may flow into processing region 233, but may be partially or fully prevented from backflow into the gas supply region 258 after traversing the faceplate 217.

An additional dual-channel showerhead, as well as this processing system and chamber, are more fully described in patent application Ser. No. 13/251,714 filed on Oct. 3, 2011, which is hereby incorporated by reference for all purposes to the extent not inconsistent with the claimed features and description herein.

Figure 3A:
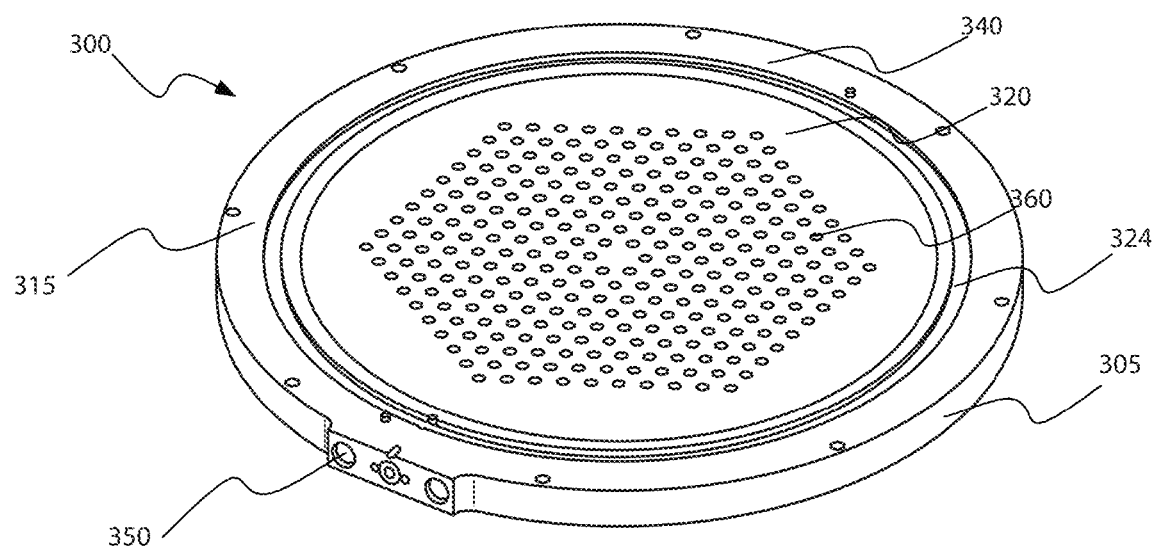
FIGS. 3A-3E show schematic views of exemplary showerhead configurations according to the disclosed technology.
Figure 3B:
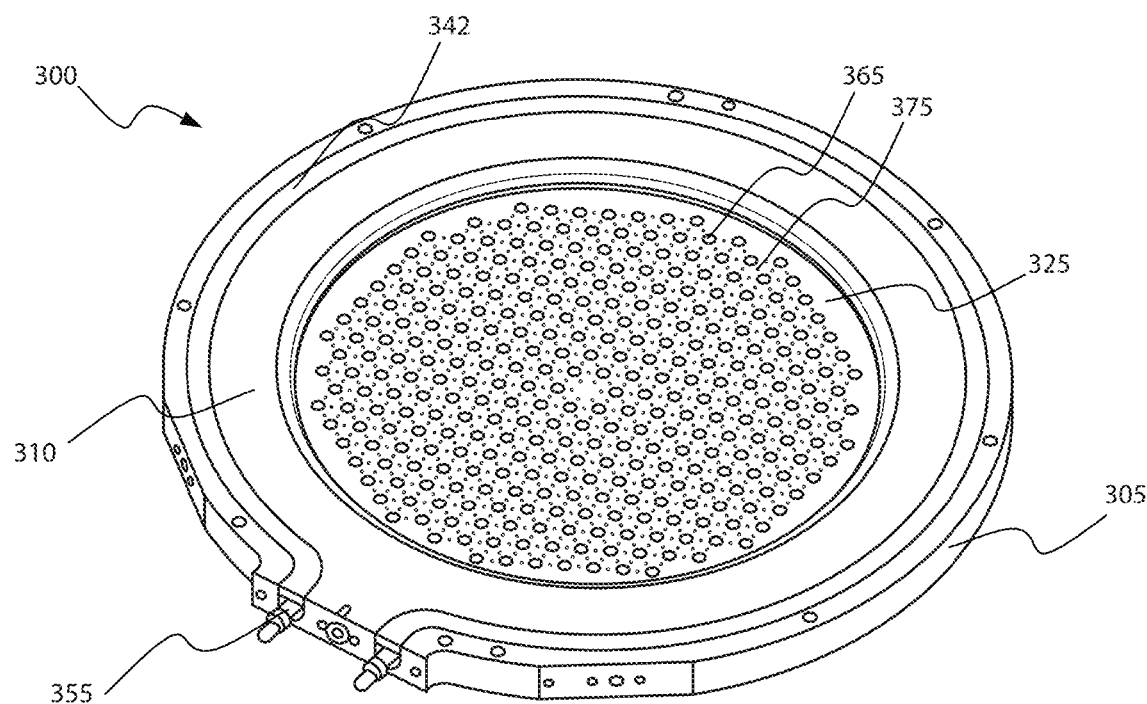
Figure 3C:
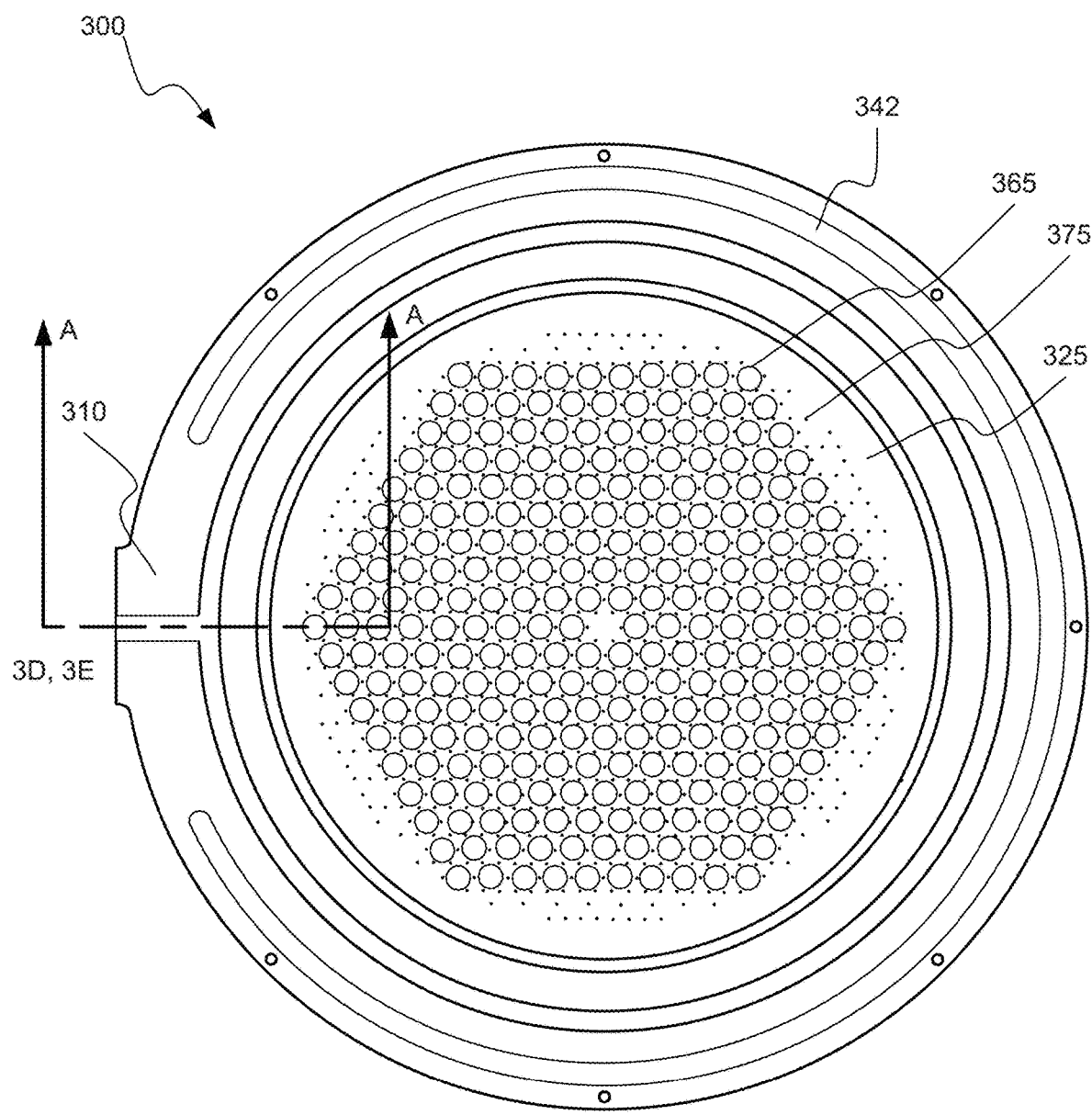
Figure 3D:
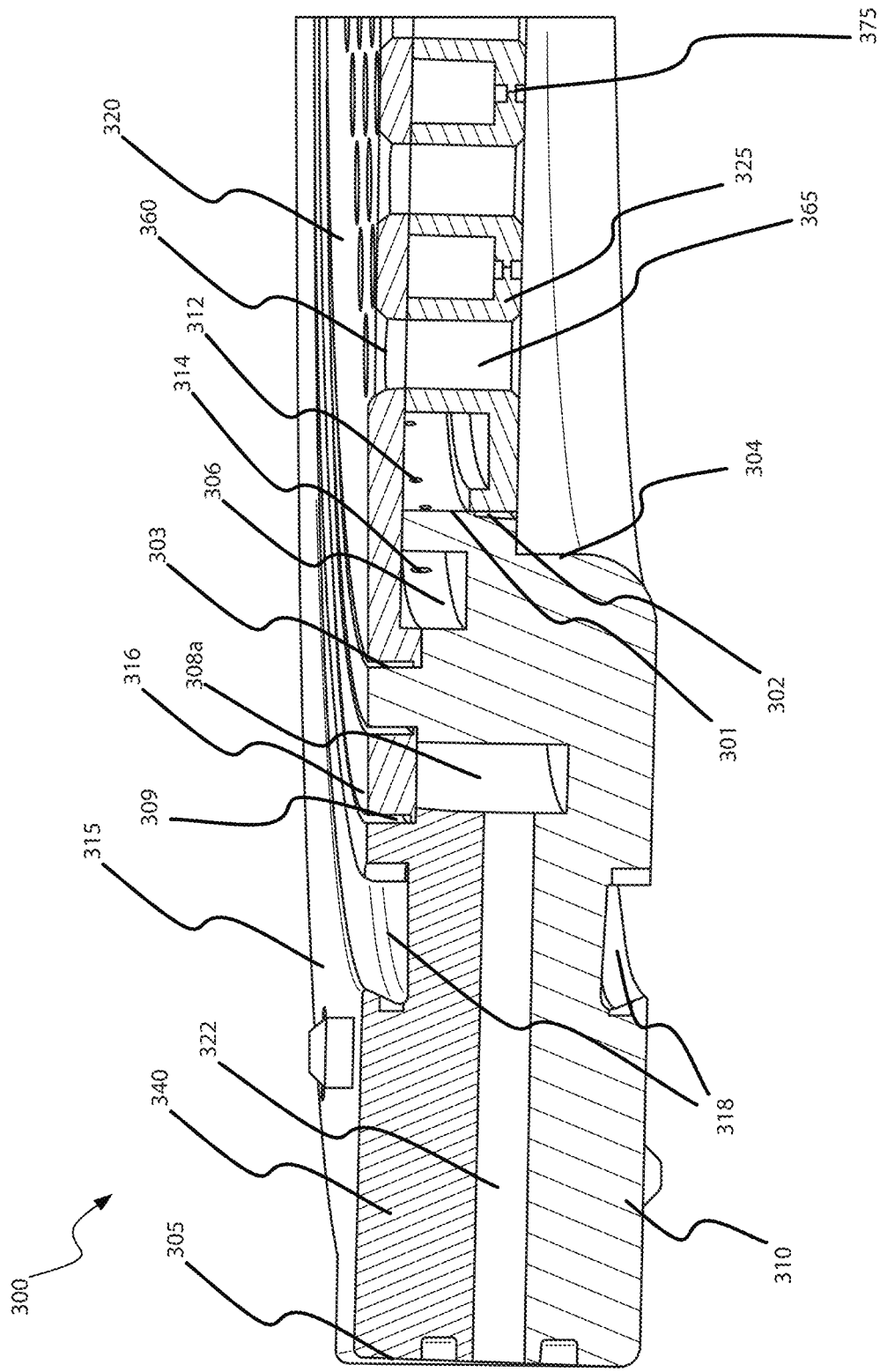
Figure 3E:
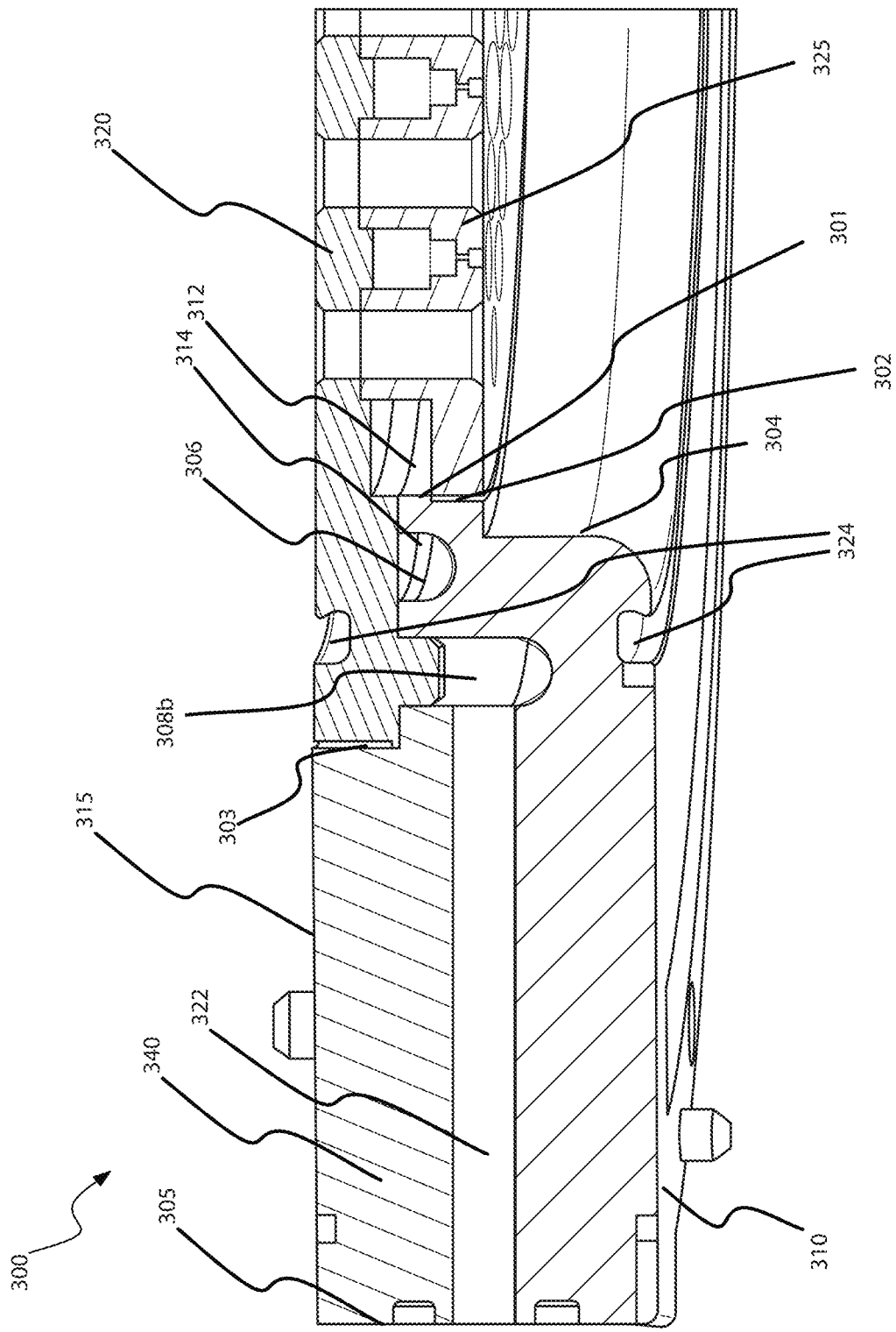

FIG. 3A illustrates an upper perspective view of a gas distribution assembly 300. In usage, the gas distribution system 300 may have a substantially horizontal orientation such that an axis of the gas apertures formed therethrough may be perpendicular or substantially perpendicular to the plane of the substrate support (see substrate support 265 in FIG. 2A). FIG. 3B illustrates a bottom perspective view of the gas distribution assembly 300. FIG. 3C is a bottom plan view of the gas distribution assembly 300. FIGS. 3D and 3E are cross sectional views of disclosed embodiments of gas distribution assembly 300 taken along line A-A of FIG. 3C.

Referring to FIGS. 3A-3E, the gas distribution assembly 300 generally includes the annular body 340, the upper plate 320, and the lower plate 325. The annular body 340 may be a ring which has an inner annular wall 301 located at an inner diameter, an outer annular wall 305 located at an outer diameter, an upper surface 315, and a lower surface 310. The upper surface 315 and lower surface 310 define the thickness of the annular body 340. A conduit 350 or annular temperature channel may be defined within the annular body and may be configured to receive a cooling fluid or a heating element that may be used to maintain or regulate the temperature of the annular body. As shown in FIG. 3A, the cooling channel 350 may include an inlet and outlet on the outer diameter 305 of the annular body. This may provide access from the side of the processing chamber from which a cooling fluid may be flowed. An additional embodiment is shown in FIG. 3B, in which conduit 355 may be formed in the bottom surface 310 and a heating element may be disposed therein. A heater recess 342 may be formed in the bottom surface 310 and be adapted to hold the heating element, and which provides access for disposing the heating element within the annular temperature channel or conduit 355.

One or more recesses and/or channels may be formed in or defined by the annular body as shown in disclosed embodiments including that illustrated in FIG. 3D. The annular body may include an upper recess 303 formed in the upper surface, and a first lower recess 302 formed in the lower surface at the inner annular wall 301. The upper recess 303 may be a first upper recess formed in the annular body 340. The annular body may also include a second lower recess 304 formed in the lower surface 310 below and radially outward from the first lower recess 302. As shown in FIG. 3D, a first fluid channel 306 may be defined in the upper surface 315, and may be located in the annular body radially inward of the upper recess 303. The first fluid channel 306 may be annular in shape and be formed the entire distance around the annular body 340. In disclosed embodiments, a bottom portion of the upper recess 303 intersects an outer wall of the first fluid channel 306. The first fluid channel may also be at least partially radially outward of the second lower recess 304. A plurality of ports 312 may be defined in an inner wall of the first fluid channel, also the inner annular wall 301 of the annular body 340. The ports 312 may provide access between the first fluid channel and the internal volume defined between the upper plate 320 and lower plate 325. The ports may be defined around the circumference of the channel at specific intervals, and may facilitate distribution across the entire region of the volume defined between the upper and lower plates. The intervals of spacing between the ports 312 may be constant, or may be varied in different locations to affect the flow of fluid into the volume. The inner and outer walls, radially, of the first fluid channel 306 may be of similar or dissimilar height. For example, the inner wall may be formed higher than the outer wall to affect the distribution of fluids in the first fluid channel to avoid or substantially avoid the flow of fluid over the inner wall of the first fluid channel.

Again referring to FIG. 3D, a second fluid channel 308a may be defined in the upper surface 315 that is located in the annular body radially outward of the first fluid channel 306. Second fluid channel 308a may be an annular shape and be located radially outward from and concentric with first fluid channel 306. The second fluid channel 308a may also be located radially outward of the first upper recess 303 such that the second fluid channel 308a is not covered by the upper plate 320 as discussed below. A second plurality of ports 314 may be defined in the portion of the annular body 340 defining the outer wall of the first fluid channel 306 and the inner wall of the second fluid channel 308a. The second plurality of ports 314 may be located at intervals of a pre-defined distance around the channel to provide fluid access to the first fluid channel 306 at several locations about the second fluid channel 308a. A second upper recess 309 may be formed in a top portion of the second fluid channel 308a in both the inner wall and outer wall of the second fluid channel. The second upper recess may be configured to receive an annular member 316 that may be positioned to cover the second fluid channel by extending radially inward and outward into the annular body past the inner and outer walls of the channel into the recess spaces 309. The annular member 316 may be braised or bonded with the annular body 340 to fluidly isolate the second fluid channel 308a from above. In operation, a precursor may be flowed from outside the process chamber to a delivery channel 322 located in the side of the annular body 340. The fluid may flow into the second fluid channel 308a, through the second plurality of ports 314 into the first fluid channel 306, through the first plurality of ports 312 into the internal volume defined between the upper and lower plates, and through the third apertures 375 located in the bottom plate. As such, a fluid provided in such a fashion can be isolated or substantially isolated from any fluid delivered into the first plasma region through apertures 360 until the fluids separately exit the lower plate 325.

By providing annular member 316 to cover the second fluid channel 308a, leakage between the first and second fluid channels may be substantially eliminated, and in disclosed embodiments may be completely eliminated. Annular member 316 may be coupled with the annular body 340, such as by bonding for example, on both sides of the channel in both recesses 309. Because the annular member 316 does not extend radially beyond the width of the second fluid channel 308a and recesses 309, annular member 316 is less prone to radial warping. As such, an improved covering profile may be produced, and leakage from the second fluid channel may be substantially or completely prevented.

The upper plate 320 may be a disk-shaped body, and may be coupled with the annular body 340 at the first upper recess 303. The upper plate 320 may thus cover the first fluid channel 306 to prevent or substantially prevent fluid flow from the top of the first fluid channel 306. The upper plate may have a diameter selected to mate with the diameter of the upper recess 303, and the upper plate may comprise a plurality of first apertures 360 formed therethrough. The first apertures 360 may extend beyond a bottom surface of the upper plate 320 thereby forming a number of raised cylindrical bodies. In between each raised cylindrical body may be a gap. As seen in FIG. 3A, the first apertures 360 may be arranged in a polygonal pattern on the upper plate 320, such that an imaginary line drawn through the centers of the outermost first apertures 360 define or substantially define a polygonal figure, which may be for example, a six-sided polygon.

The pattern may also feature an array of staggered rows from about 5 to about 60 rows, such as from about 15 to about 25 rows of first apertures 360. Each row may have, along the y-axis, from about 5 to about 20 first apertures 360, with each row being spaced between about 0.4 and about 0.7 inches apart. Each first aperture 360 in a row may be displaced along the x-axis from a prior aperture between about 0.4 and about 0.8 inches from each respective diameter. The first apertures 360 may be staggered along the x-axis from an aperture in another row by between about 0.2 and about 0.4 inches from each respective diameter. The first apertures 360 may be equally spaced from one another in each row. Referring to FIG. 3D, an edge portion of the upper plate 320 may comprise a second thickness greater than a first thickness located more towards the central portion of the plate, and the second thickness may be equivalent or substantially equivalent to the height of the outer wall of first upper recess 303. The edge portion may extend radially inward from an outer edge a distance equivalent or substantially equivalent to a bottom portion of the upper recess. Accordingly, the edge portion may not extend radially inward past the inward most portion of first upper recess 303 in disclosed embodiments.

The lower plate 325 may have a disk-shaped body having a number of second apertures 365 and third apertures 375 formed therethrough, as especially seen in FIG. 3C. The lower plate 325 may have multiple thicknesses, with the thickness of defined portions greater than the central thickness of the upper plate 320, and in disclosed embodiments at least about twice the thickness of the upper plate 320. The lower plate 325 may also have a diameter that mates with the diameter of the inner annular wall 301 of the annular body 340 at the first lower recess 302. As mentioned, the lower plate 325 may comprise multiple thicknesses, and for example, a first thickness of the plate may be the thickness through which the third apertures 375 extend. A second thickness greater than the first may be the thickness of an edge region of the plate that intersects the first lower recess 302 of the annular body 340. The second thickness with respect to the first lower recess may be dimensioned similar to the edge portion of the upper plate with respect to the first upper recess. In disclosed embodiments, the first and second thicknesses are substantially similar. A third thickness greater than the second may be a thickness of the plate around the second apertures 365. For example, the second apertures 365 may be defined by the lower plate 325 as cylindrical bodies extending up to the upper plate 320. In this way, channels may be formed between the first and second apertures that are fluidly isolated from one another. Additionally, the volume formed between the upper and lower plates may be fluidly isolated from the channels formed between the first and second apertures. As such, a fluid flowing through the first apertures 360 will flow through the second apertures 365 and a fluid within the internal volume between the plates will flow through the third apertures 375, and the fluids will be fluidly isolated from one another until they exit the lower plate 325 through either the second or third apertures. This separation may provide numerous benefits including preventing a radical precursor from contacting a second precursor prior to reaching a reaction zone. By preventing the interaction of the gases, deposition within the chamber may be minimized prior to the processing region in which deposition is desired.

The second apertures 365 may be arranged in a pattern that aligns with the pattern of the first apertures 360 as described above. In one embodiment, when the upper plate 320 and bottom plate 325 are positioned one on top of the other, the axes of the first apertures 360 and second apertures 365 align. In disclosed embodiments, the upper and lower plates may be coupled with one another or directly bonded together. Under either scenario, the coupling of the plates may occur such that the first and second apertures are aligned to form a channel through the upper and lower plates. The plurality of first apertures 360 and the plurality of second apertures 365 may have their respective axes parallel or substantially parallel to each other, for example, the apertures 360, 365 may be concentric. Alternatively, the plurality of first apertures 360 and the plurality of second apertures 365 may have the respective axis disposed at an angle from about 1° to about 30° from one another. At the center of the bottom plate 325 there may be no second aperture 365.

As stated previously, the gas distribution assembly 300 generally consists of the annular body 340, the upper plate 320, and the lower plate 325. The lower plate 325 may be positioned within the first lower recess 303 with the raised cylindrical bodies facing toward the bottom surface of the upper plate 320, as shown in FIG. 3D. The bottom plate 325 may then be positioned in the first lower recess 304 and rotatably oriented so that the axes of the first and second apertures 360, 365 may be aligned. The upper plate 320 may be sealingly coupled with the bottom plate 325 to fluidly isolate the first and second apertures 360, 365 from the third apertures 375. For example, the upper plate 320 may be brazed to the bottom plate 325 such that a seal is created between a surface of the raised cylindrical bodies on the lower plate 325, and a surface of the bottom of the upper plate 320. The upper plate 320 and bottom plate 325 may then be E-beam welded or otherwise bonded to the annular body 340. The upper plate 320 may be E-beam welded such that a seal is created between an outer edge of the circular body and an inner edge of the upper recess 303. The bottom plate 325 may be E-beam welded such that a seal is created between an outer edge of the circular body and the inner annular wall 301. In disclosed embodiments, the surfaces of the gas distribution assembly 300 may be electro-polished, plated with metal, or coated with various metal-based substances or oxides.

The plurality of second apertures 365 and the plurality of third apertures 375 may form alternating staggered rows. The third apertures 375 may be arranged in between at least two of the second apertures 365 of the bottom plate 325. Between each second aperture 365 there may be a third aperture 375, which is evenly spaced between the two second apertures 365. There may also be a number of third apertures 375 positioned around the center of the bottom plate 325 in a hexagonal pattern, such as for example six third apertures, or a number of third apertures 375 forming another geometric shape. There may be no third aperture 375 formed in the center of the bottom plate 325. There may also be no third apertures 375 positioned between the perimeter second apertures 365 which form the vertices of the polygonal pattern of second apertures. Alternatively there may be third apertures 375 located between the perimeter second apertures 365, and there may also be additional third apertures 375 located outwardly from the perimeter second apertures 365 forming the outermost ring of apertures as shown, for example, in FIG. 3C.

Alternatively, the arrangement of the first and second apertures may make any other geometrical pattern, and may be distributed as rings of apertures located concentrically outward from each other and based on a centrally located position on the plate. As one example, and without limiting the scope of the technology, FIG. 3A shows a pattern formed by the apertures that includes concentric hexagonal rings extending outwardly from the center. Each outwardly located ring may have the same number, more, or less apertures than the preceding ring located inwardly. In one example, each concentric ring may have an additional number of apertures based on the geometric shape of each ring. In the example of a six-sided polygon, each ring moving outwardly may have six apertures more than the ring located directly inward, with the first internal ring having six apertures. With a first ring of apertures located nearest to the center of the upper and bottom plates, the upper and bottom plates may have more than two rings, and depending on the geometric pattern of apertures used, may have between about one and about fifty rings of apertures. Alternatively, the plates may have between about two and about forty rings, or up to about thirty rings, about twenty rings, about fifteen rings, about twelve rings, about ten rings, about nine rings, about eight rings, about seven rings, about six rings, etc. or less. In one example, as shown in FIG. 3A, there may be nine hexagonal rings on the exemplary upper plate.

The concentric rings of apertures may also not have one of the concentric rings of apertures, or may have one of the rings of apertures extending outward removed from between other rings. For example with reference to FIG. 3A, where an exemplary nine hexagonal rings are on the plate, the plate may instead have eight rings, but it may be ring four that is removed. In such an example, channels may not be formed where the fourth ring would otherwise be located which may redistribute the gas flow of a fluid being passed through the apertures. The rings may still also have certain apertures removed from the geometric pattern. For example again with reference to FIG. 3A, a tenth hexagonal ring of apertures may be formed on the plate shown as the outermost ring. However, the ring may not include apertures that would form the vertices of the hexagonal pattern, or other apertures within the ring.

The first, second, and third apertures 360, 365, 375 may all be adapted to allow the passage of fluid therethrough. The first and second apertures 360, 365 may have cylindrical shape and may, alternatively, have a varied cross-sectional shape including conical, cylindrical, or a combination of multiple shapes. In one example, as shown in FIG. 3D, the first and second apertures may have a substantially cylindrical shape, and the third apertures may be formed by a series of cylinders of different diameters. For example, the third apertures may comprise three cylinders where the second cylinder is of a diameter smaller than the diameters of the other cylinders. These and numerous other variations can be used to modulate the flow of fluid through the apertures.

When all first and second apertures are of the same diameter, the flow of gas through the channels may not be uniform. As process gases flow into the processing chamber, the flow of gas may be such as to preferentially flow a greater volume of gas through certain channels. As such, certain of the apertures may be reduced in diameter from certain other apertures in order to redistribute the precursor flow as it is delivered into a first plasma region. The apertures may be selectively reduced in diameter due to their relative position, such as near a baffle, and as such, apertures located near the baffle may be reduced in diameter to reduce the flow of process gas through those apertures. In one example, as shown in FIG. 3A, where nine hexagonal rings of first apertures are located concentrically on the plates, certain rings of apertures may have some or all of the apertures reduced in diameter. For example, ring four may include a subset of first apertures that have a smaller diameter than the first apertures in the other rings. Alternatively, rings two through eight, two through seven, two through six, two through five, two through four, three through seven, three through six, three through five, four through seven, four through six, two and three, three and four, four and five, five and six, etc., or some other combination of rings may have reduced aperture diameters for some or all of the apertures located in those rings.

Referring again to FIG. 3D, a pair of isolation channels, 318 may be formed in the annular body 340. One of the pair of isolation channels 318 may be defined in the upper surface 315 of the annular body 340, and the other of the pair of isolation channels 318 may be defined in the lower surface 310 of the annular body 340. The pair of isolation channels may be vertically aligned with one another, and in disclosed embodiments may be in direct vertical alignment. Alternatively, the pair of isolation channels may be offset from vertical alignment in either direction. The channels may provide locations for isolation barriers such as o-rings in disclosed embodiments.

Turning to FIG. 3E, additional features of gas distribution assemblies are shown according to disclosed embodiments, and may include many of the features described above with respect to FIG. 3D. The assembly 300 includes annular body 340 having inner annular wall 301, outer annular wall 305, upper surface 315, and lower surface 310. The annular body 340 may additionally include an upper recess 303, a first lower recess 302, and a second lower recess 304. The annular body may also have a first fluid channel 306 formed in the upper surface 315 with a plurality of ports 312 defined in the inner channel wall that provide fluid access to a volume formed between upper plate 320 and lower plate 325. Lower plate 325 may be coupled with annular body 340 at first lower recess 302. Lower plate 325 may additionally define first and second apertures as discussed above with regard to FIG. 3D.

Upper plate 320 may be coupled with annular body 340 at upper recess 303. First fluid channel 306 may be defined similar to first fluid channel 306 of FIG. 3D. Alternatively, the inner and outer walls of the first fluid channel 306 may be of substantially similar height, and in disclosed embodiments may be of identical height. Upper plate 320 may cover first fluid channel 306 in order to prevent a flow path from the top of the first fluid channel 306. The first plurality of ports 312 may be defined in the annular body similar to that of FIG. 3D. Alternatively, the first plurality of ports 312 may be partially formed in the upper surface 315 at the inner annular wall 301. When upper plate 320 is coupled with the annular body 340, the upper plate may further define the top of the plurality of ports 312.

A second fluid channel 308b may be formed in the upper surface 315 of annular body 340, and may be configured to receive a fluid delivered through fluid delivery channel 322 as previously described. Second fluid channel 308b, however, may be located radially inward of the first upper recess 303 such that the second fluid channel 308b is covered by the upper plate 320. An outer wall of second fluid channel 308b may intersect a bottom portion of upper recess 303. A second plurality of ports 314 may be defined by a portion of the annular body forming an inner wall of the second fluid channel 308b and the outer wall of first fluid channel 306. The ports may provide fluid communication between the first and second fluid channels, and may be located similarly as described above. Upper plate 320 may be configured to limit warping at each interface of contact with the annular body 340. For example, upper plate 320 may have a first thickness in the central portion of the upper plate 320 where the apertures are located, and may be a second thickness greater than the first thickness at the edge portions of the plate. These edge portions may extend from the upper recess 303 over the second fluid channel 308b, the first fluid channel 306, and the inner annular wall 301. The increased thickness of the upper plate 320 at the edge regions may better absorb the stress produced during the coupling of the upper plate to the annular body, and thereby reduce warping.

A portion of upper plate 320 may extend a distance into the second fluid channel 308b. The portion of the upper plate may extend into the second channel below a level of the bottom of the upper recess 303. In disclosed embodiments, second fluid channel 308b is formed to a greater depth in the upper surface 315 than the first fluid channel 306. The portion of upper plate 320 extending into the second fluid channel 308b may extend to a depth equivalent to the depth of the first fluid channel 306 within the annular body 340. By having a portion of the upper plate extend into the second fluid channel 308b, warping that may occur in the upper plate when it is coupled with the annular body 340 may not produce any leak paths between the first and second fluid channels as the extent of warping may be overcome by the amount of the upper plate 320 that extends into the second fluid channel 308b. The second plurality of ports 314 may be defined similar to those of FIG. 3D, or alternatively may be partially formed in the upper surface similar to the first plurality of ports 312. The top of the plurality of ports 314 may be defined by the bottom surface of the upper plate 320. The second plurality of ports 314 may be formed at an angle increasing vertically between the second fluid channel 308b and the first fluid channel 306. By forming the ports at an angle, the ports may not be blocked by the portion of the upper plate extending into the second fluid channel 308b. In disclosed embodiments the second plurality of ports 314 may be slots of various shapes or dimensions formed in the annular body. The slots may be formed at an angle increasing or upward from the second fluid channel 308b to the first fluid channel 306 such that the ports are fluidly accessible below the portion of the upper plate 320 extending into the second fluid channel 308b.

A pair of isolation channels 324 may be formed in the gas distribution assembly in disclosed embodiments where at least a portion of the isolation channels are vertically aligned with the portion of the annular body forming the inner wall of the second fluid channel 308b and the inner wall of the first fluid channel 306. To produce this configuration, one of the pair of isolation channels may be defined in the upper plate at a location radially inward from the first upper recess. The other of the pair of isolation channels may be defined in the lower surface 310 of the annular body, and the pair of isolation channels may be vertically aligned with one another. In disclosed embodiments the pair of isolation channels may be in direct vertical alignment. In operation, the isolation channels may receive o-rings, for example, or other isolation devices. By providing the isolation channels at a location that is at least partially aligned with the shared wall of the first and second fluid channels, the compression produced at the isolation channels may be used to offset, reduce, or remove warping that may have occurred at the interface of the upper plate 320 and the annular body.

Figure 4A:
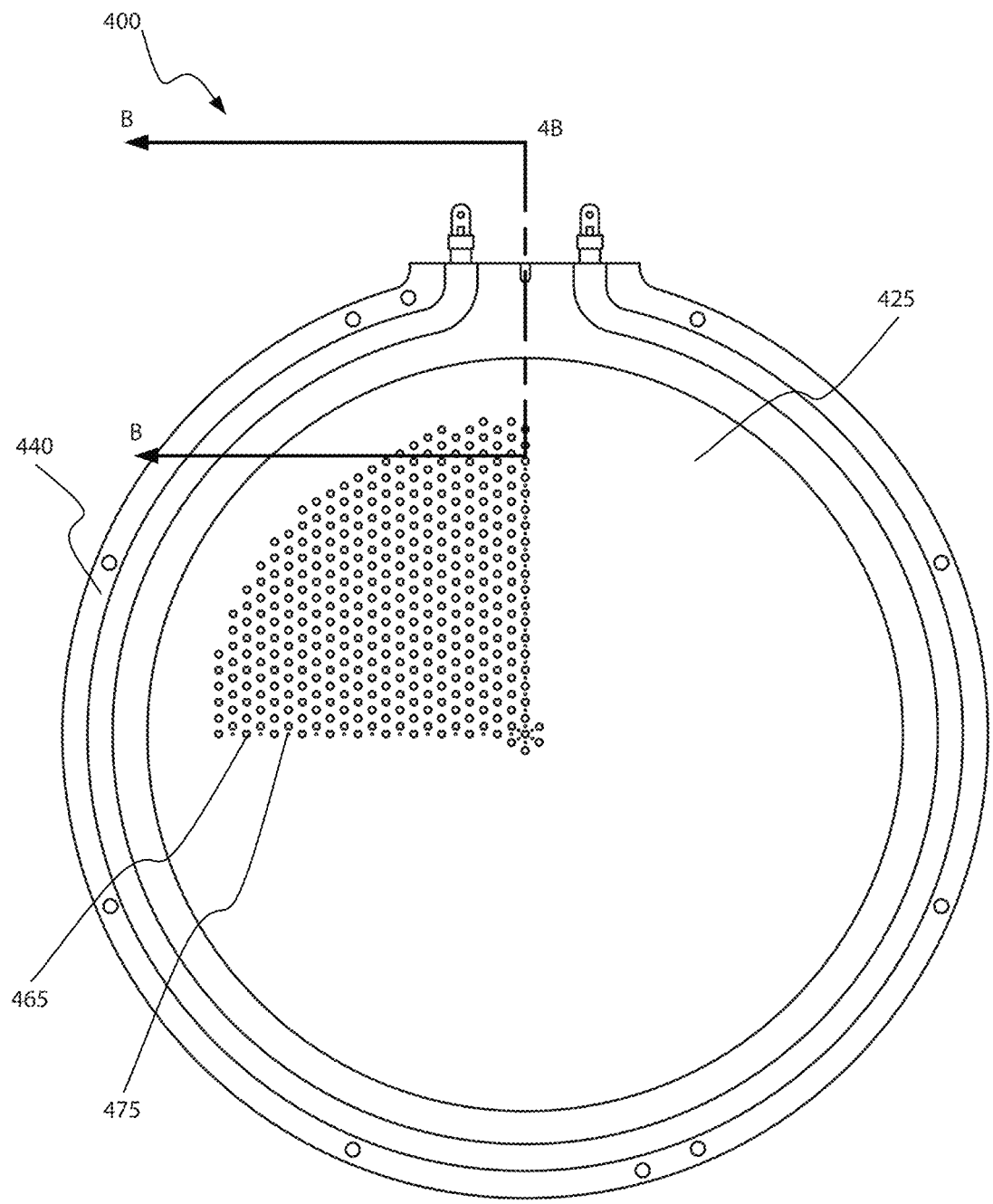
FIGS. 4A-4B show additional schematic views of exemplary showerhead configurations according to the disclosed technology.
Figure 4B:
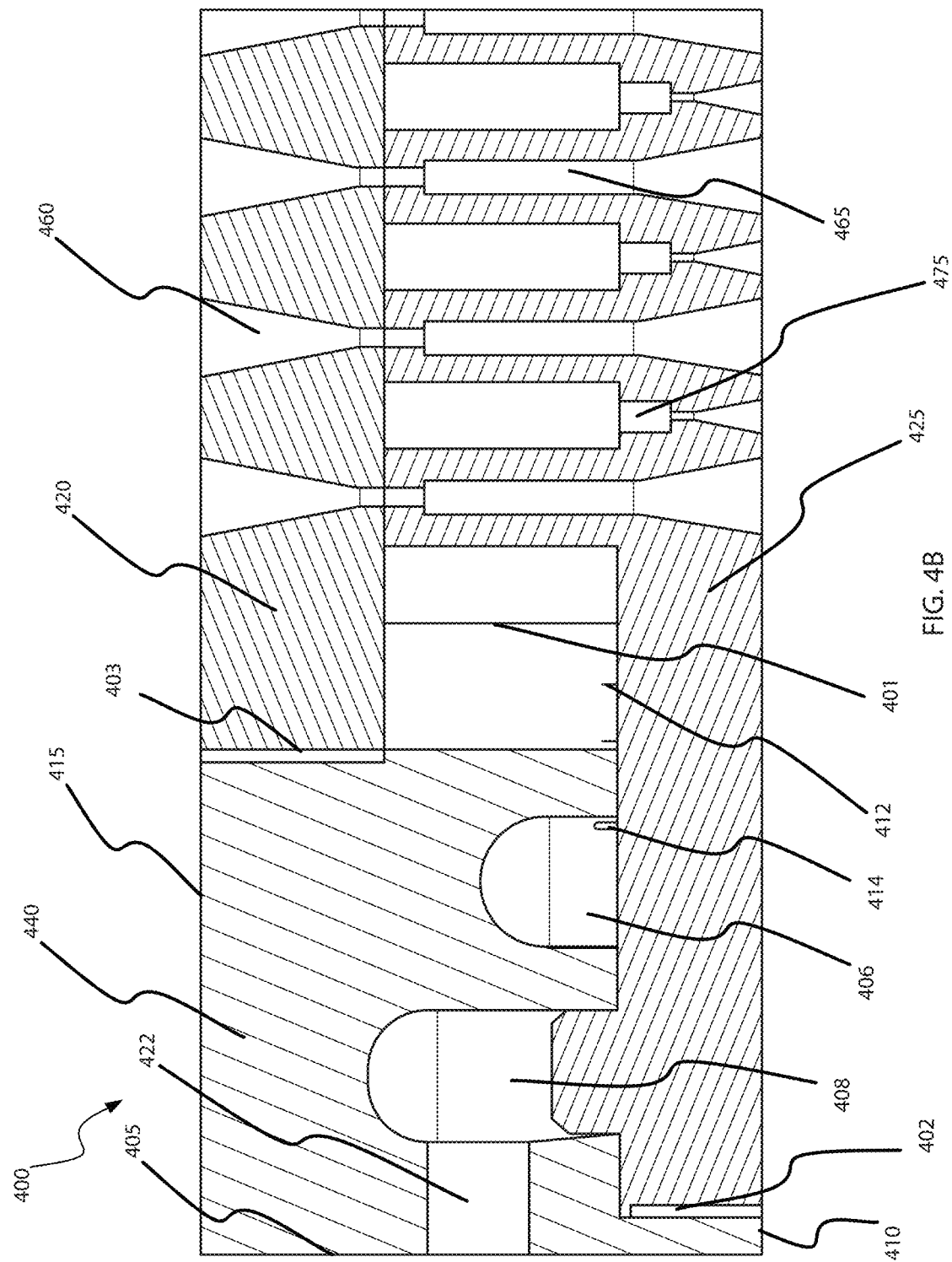

Referring to FIGS. 4A-4B, gas distribution assembly 400, or showerhead, is provided including a first or upper plate 420 and a second or lower plate 425, and the top of the lower plate 425 may be configured to be coupled with the bottom of the upper plate 420. The upper and lower plates may be perforated plates with a plurality of apertures defined in each plate. In usage, the orientation of the showerhead 400 to the substrate may be done in such a way that the axis of any apertures formed in the showerhead may be perpendicular or substantially perpendicular to the substrate plane.

Referring to FIG. 4B, annular body 440 may include an upper recess 403 in upper surface 415, and a lower recess 402 in lower surface 410. A first fluid channel 406 may be defined in the lower surface 410 and may be located in the annular body radially inward of the lower recess 402. The first fluid channel may be annular in shape, and the channel may be covered by lower plate 425. A plurality of ports 412 may be at least partially defined in the annular body at the inner annular wall 401, and may be located along the entire channel at defined intervals that may be equal or modified across the plurality of ports. In disclosed embodiments, lower plate 425 may define a top portion of the plurality of ports 412. Upper plate 420 may be coupled with the annular body 440 at upper recess 403, and the upper plate 420 may define a plurality of first apertures 460. Lower plate 425 may be coupled with the annular body 440 at the lower recess 402, and may cover first fluid channel 406. Lower plate 425 may define a plurality of second apertures 465 that may align with the first apertures 460 defined in the upper plate 420 in order to form a first set of channels through the assembly 400. The lower plate 425 may also define a plurality of third apertures 475 that are located between and around the second apertures 465. The lower plate 425 may include raised portions around second apertures 465 that extend up to the upper plate 420 to produce fluidly isolated channels through the assembly.

The upper and lower plates may be sealingly coupled with one another such that the first and second apertures are aligned to form a channel through the upper and lower plates with the raised portions of the lower plate such that an internal volume is defined between the upper and lower plate. The volume may be fluidly accessed through the plurality of ports 412. The assembly may be configured such that a first fluid may flow through the first apertures and extend through the assembly 400 through the isolated channels formed between the first and second apertures. Additionally, a second fluid may be flowed through the assembly via the first fluid channel 406 and delivered into the volume defined between the upper and lower plates. The fluid flowing through the volume may flow through the third apertures and around the raised portions of the lower plate such that the first and second fluid may be fluidly isolated through the showerhead, and remain separated until they exit the lower plate through the second and third apertures respectively.

The first apertures 460 may be shaped to suppress the migration of ionically-charged species out of the first plasma region 215 described previously, while allowing uncharged neutral or radical species to pass through the showerhead 225, or gas distribution assembly 400. These uncharged species may include highly reactive species that are transported with less reactive carrier gas through the holes. As noted above, the migration of ionic species through the holes may be reduced, and in some instances completely suppressed. Controlling the amount of ionic species passing through the gas distribution assembly 400 may provide increased control over the gas mixture brought into contact with the underlying wafer substrate, which in turn increases control of the deposition and/or etch characteristics of the gas mixture. Accordingly, in disclosed embodiments, the first apertures may include a conical shape extending through the upper plate with decreasing diameter in order to control fluid characteristics. This upper plate may specifically act as an ion-suppression plate or ion blocker such that a configuration effectively combines ion-suppression directly into the showerhead design, and an additional suppression element may not be additionally required.

Each first aperture 460 may have a conical inlet portion tapering to a first cylindrical portion that intersects second apertures 465. The second apertures may include multiple sections of various shapes to further affect fluid flow through the channels formed between the first and second apertures. In an exemplary design, the second apertures 465 may include multiple cylindrical sections of increasing diameter leading to a conical section extending with increasing diameter to the bottom of the lower plate 425. Third apertures 475 may similarly include multiple sections of various shapes, and in an exemplary configuration the third apertures 475 may include multiple cylindrical sections of decreasing diameter leading to a conical section extending with increasing diameter to the bottom of the lower plate 425. In disclosed embodiments, the second and third apertures include at least three sections of different shape or diameter.

For ion-suppression assemblies such as exemplary configuration assembly 400, the number of apertures may be greater than the number of apertures in configurations such as exemplary assemblies of FIGS. 3D and 3E. Providing a greater number of apertures may increase the density of species delivered to the processing region of the chamber. FIG. 4A shows a bottom view of gas distribution assembly 400 including lower plate 425 with second apertures 465 and third apertures 475. Although only one quadrant of apertures is shown, it will be readily understood that the apertures are defined similarly in all four quadrants of the assembly. While FIG. 3A shows an exemplary nine hexagonal rings of apertures, a similarly sized gas distribution assembly such as shown in FIG. 4A may include between about eighteen and twenty-five rings of apertures. The total number of apertures in the high-density design illustrated in FIGS. 4A-4B may include between 2-10 times as many total second and third apertures. The high-density configuration as shown in FIG. 3E may include an additional second aperture 365 directly in the center of the plate.

Referring back to FIG. 4B, the gas distribution assembly may additionally include a second fluid channel 408 defined in the lower surface 410 that is located in the annular body 440 radially outward of the first fluid channel 406. The second fluid channel 408 may be formed around the entire annular body 360, and may also be concentric with the first fluid channel 406. A second plurality of ports 414 may be defined in at least a portion of the annular body defining an outer wall of the first fluid channel 406 and an inner wall of the second fluid channel 408. The second fluid channel 408 may also be located radially inward of the lower recess such that the second fluid channel is covered by the lower plate 425. Similar to the design described in FIG. 4E, a portion of the lower plate may extend up into the second fluid channel 408.

The portion of the lower plate 425 may extend into the second channel above a level of the top of the lower recess 402. In disclosed embodiments, second fluid channel 408 is formed to a greater height in the lower surface 410 than the first fluid channel 406. The portion of lower plate 425 extending into the second fluid channel 408 may extend to a height equivalent to the height of the first fluid channel 406 or less within the annular body 440, or to a height equivalent to about half of the height of first fluid channel 406. As explained above, a portion of the lower plate extending into the second fluid channel 408 may limit the effects of warping that may occur in the lower plate when it is coupled with the annular body 440. The second plurality of ports 414 may be defined similar to those of FIG. 3D or 3E but in the lower surface 410. The bottom of the plurality of ports 414 may be defined by the top surface of the lower plate 425.

The second plurality of ports 414 may be formed at an angle decreasing vertically between the second fluid channel 408 and the first fluid channel 406. By forming the ports at an angle, the ports may not be blocked by the portion of the lower plate extending into the second fluid channel 408. In disclosed embodiments the second plurality of ports 414 may be slots of various shapes or dimensions formed in the annular body, and may be angled downward from the second fluid channel 408 to the first fluid channel 406 such that the ports are fluidly accessible above the portion of the lower plate extending into the second fluid channel 408. In operation, a fluid may be delivered through the gas distribution assembly 400 through a side port in the chamber, for example, fluid delivery channel 422. The fluid may flow into second fluid channel 408 and then through the second plurality of ports 414 that may fluidly couple the second fluid channel 408 with the first fluid channel 406. The fluid may then flow through the first plurality of ports 412 that may fluidly couple the first fluid channel 406 with the volume defined between the upper plate 420 and lower plate 425. The fluid may continue to flow through third apertures 475 into the processing region. In this configuration, such a fluid may be fluidly isolated from the first and second apertures that form channels through the gas distribution assembly. In this way, the distribution assembly may prevent the flow of this fluid from accessing the first apertures, and may prevent the fluid from flowing through the top of the gas distribution assembly without a pressure differential or forced flow.

Figure 5A:
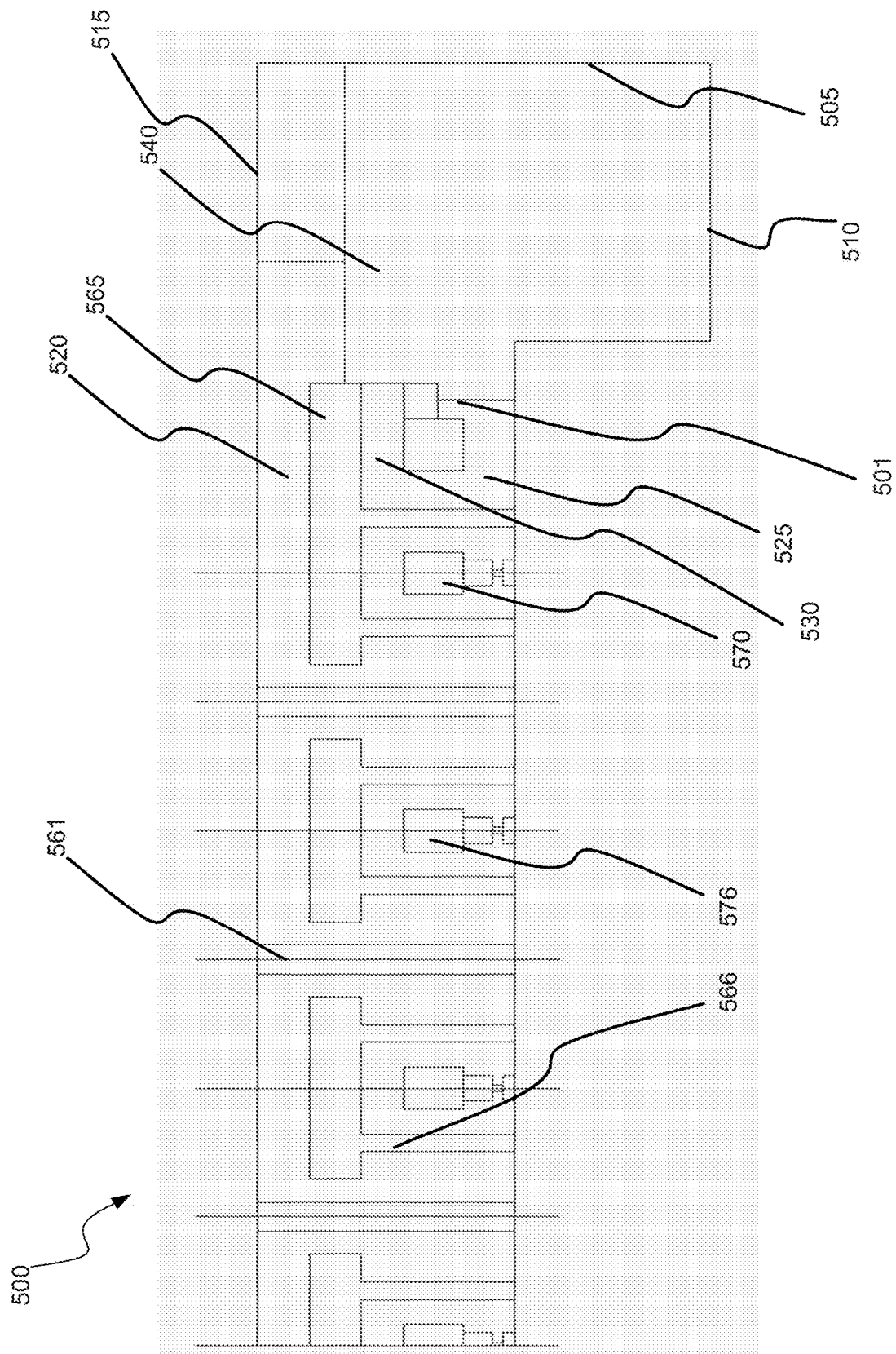
FIGS. 5A-5C show additional schematic views of exemplary showerhead configurations according to the disclosed technology.

FIG. 5A shows an exemplary gas distribution assembly 500 configured to provide three isolated fluid paths to a processing region. The assembly 500 may include similar components as previously described including an annular body 540 having an inner annular wall 501 located at an inner diameter, an outer annular wall 505 located at an outer diameter, an upper surface 515, and a lower surface 510. Gas distribution assembly 500 may include an upper plate 520 coupled with the annular body 540 that defines a first set of apertures. Intermediate plate 530 may be coupled with the upper plate 520 and may comprise a plurality of second apertures and a plurality of third apertures. The intermediate plate 530 may be coupled such that the second apertures align with the first apertures of the upper plate. The assembly may additionally include a lower plate 525 coupled with the annular body 540 and the intermediate plate 530. The lower plate 525 may define a plurality of fourth apertures that align with the first apertures of the upper plate and the second apertures of the intermediate plate to form a first plurality of fluid channels 561 through the plates. The lower plate may also define a fifth set of apertures that align with the third apertures of the intermediate plate to form a second plurality of fluid channels 566 through the intermediate and lower plates. The second plurality of fluid channels 566 may be fluidly isolated from the first plurality of fluid channels 561. The lower plate may also define a sixth set of apertures that form a third plurality of fluid channels 576 through the lower plate. The third plurality of fluid channels 576 may be fluidly isolated from the first and second pluralities of fluid channels.

In operation, the gas distribution assembly may be configured such that two fluids may be delivered into the showerhead from the side, but maintained fluidly separate in two fluidly isolated volumes 565, 570 produced in the assembly. A first fluid may be delivered from above the gas distribution assembly 500 and may include radical species produced in an RPS or first plasma region, for example. The first fluid may flow through the first plurality of fluid channels 561 that may be individually isolated and may not be accessed from within the assembly volumes. A second fluid may be introduced into the showerhead from a side port or first delivery channel that delivers the second fluid between the upper plate 520 and intermediate plate 530. The second fluid may flow within this first defined volume 565 and through the second plurality of fluid channels. These channels may also be fluidly isolated from the other channels formed through the assembly. A third fluid may be introduced into the showerhead from an additional side port or second delivery channel that delivers the third fluid between the intermediate plate 530 and lower plate 525. The third fluid may flow within this second defined volume 570 and through the third plurality of fluid channels, which may be fluidly isolated from the other channels formed through the assembly. The additional side port or second delivery channel, as well as the second defined volume 570, may be fluidly isolated from the first delivery channel and first defined volume 565. In this way, three fluids may be delivered to a processing region through a single gas distribution assembly, but may be separated until they each exit the gas distribution assembly and enter the processing region.

Figure 5B:
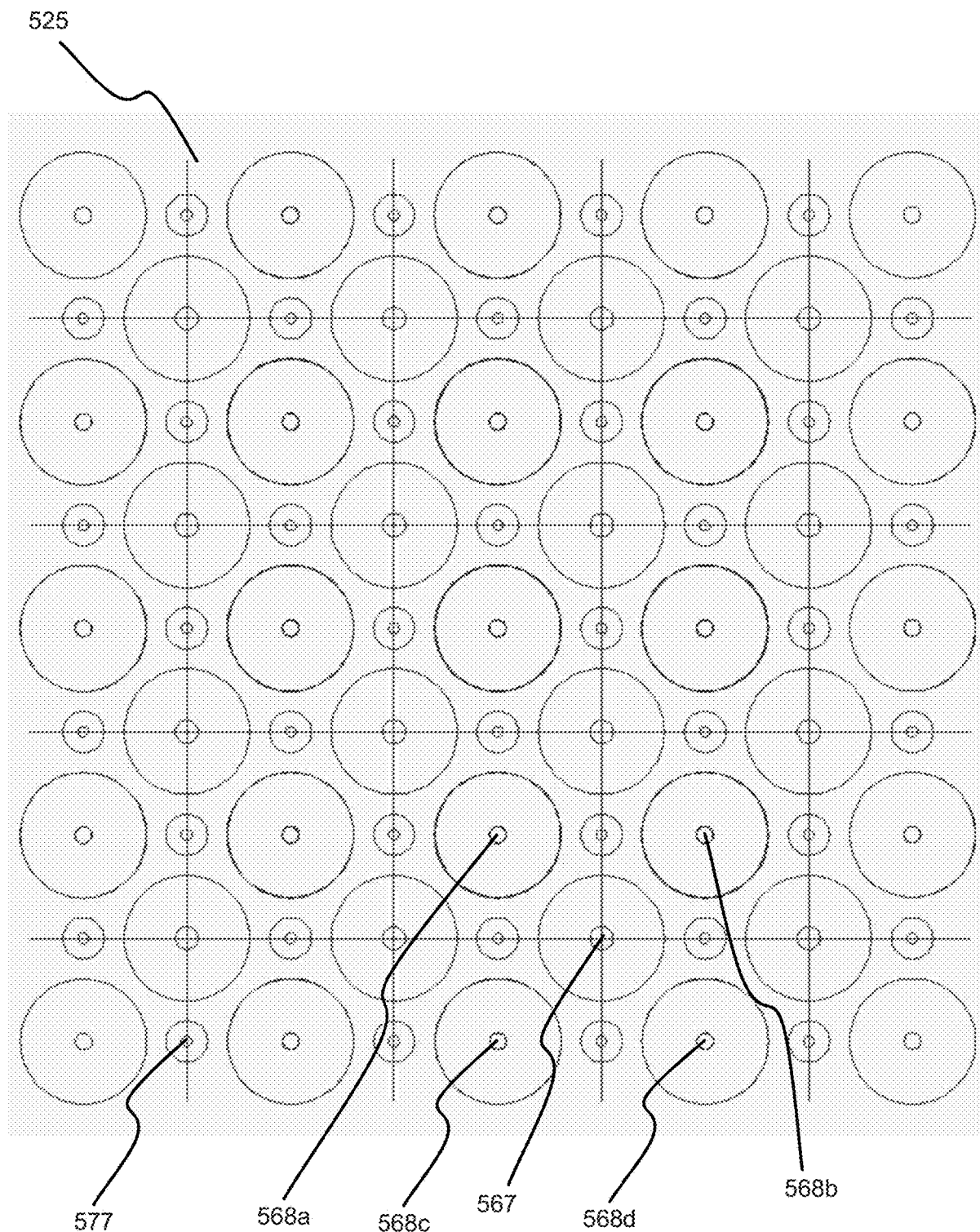
Figure 5C:
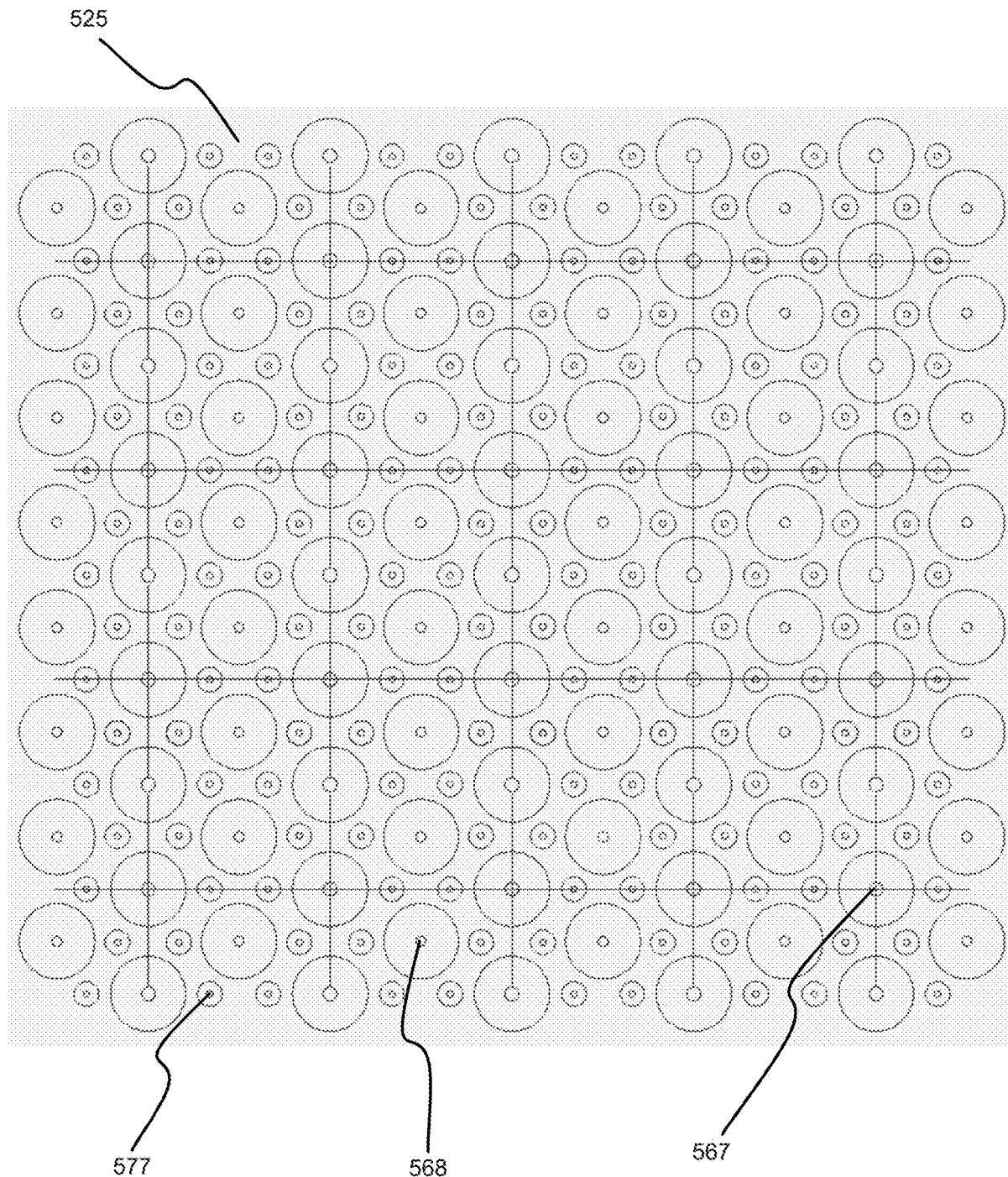

Although a variety of aperture configurations are encompassed by the disclosed technology, FIGS. 5B and 5C illustrate two exemplary configurations of fourth apertures 567, fifth apertures 568, and sixth apertures 577. The figures show partial plan views of lower plate 525 and exemplary orientations of fourth, fifth, and sixth apertures. In some disclosed configurations, the lower plate may include an orientation of fourth, fifth, and sixth apertures such that a majority of fourth apertures 567 are each surrounded by at least four of the fifth apertures 568 and four of the sixth apertures 577.

As shown in FIG. 5B, fourth apertures 567 may have four of the fifth apertures 568 positioned around each of the fourth apertures 567. Additionally, four of the sixth apertures 577 may also be positioned around each of the fourth apertures 567. In this configuration, the fifth apertures 568a-d may be located around the fourth apertures 567 with the centers of the fifth apertures at about 90° intervals from one another as identified about a center of one of the fourth apertures 567. Similarly, the sixth apertures 577 may be located around the fourth apertures with centers of the sixth apertures at about 90° intervals from one another as identified about a center of the fourth apertures 577. The sixth apertures 577 may also be offset from fifth apertures 568 by about 45° as identified about a center of the fourth apertures 577. Each of the fifth apertures 568 may additionally have four of the sixth apertures 577 located around the fifth apertures 568 at about 90° intervals from one another as identified about a center of the fifth apertures 568. The apertures may also be considered as rows of apertures based on the fourth apertures 567 and fifth apertures 568. As shown in FIG. 5B, each horizontal row of fourth apertures 567 or fifth apertures 568 alternates sixth apertures 577 with each of the fourth or fifth apertures of the individual rows. The rows are additionally displaced by one aperture in alternating rows, such that each of the fourth or fifth apertures has a located sixth aperture above or below it in each alternating row.

As shown in FIG. 5C, fourth apertures 567 may have four or more of the fifth apertures 568 positioned around each of the fourth apertures 567. The sixth apertures 568 may be located in alternating columns with the fourth apertures 567. Additionally, six of the sixth apertures 577 may also be positioned around each of the fourth apertures 567. In this configuration, the fifth apertures 568 may be located around the fourth apertures 567 with the centers of the fifth apertures at about 60° intervals from one another as identified about a center of the fourth apertures 567. Similarly, the sixth apertures 577 may be located around the fourth apertures with centers of the sixth apertures at about 60° intervals from one another as identified about a center of the fourth apertures 577. The sixth apertures 577 may also be offset from fifth apertures 568 by about 30° as identified about a center of the fourth apertures 577. The fifth apertures 568 may be located a first radial distance from the center of each of the fourth apertures 567. Additionally, the sixth apertures 577 may be located a second radial distance from the center of each of the fourth apertures 567. As illustrated in FIG. 5C, the second radial distance may be less than the first radial distance. Other disclosed embodiments may have the second radial distance greater than the first radial distance. The apertures may again be considered as alternating horizontal rows of apertures of fourth or fifth apertures. As shown in the figure, each fourth or fifth aperture is separated from the next fourth or fifth aperture in a row by two sixth apertures. The rows of apertures may be offset such that each row is displaced by half the distance between any two fourth or fifth apertures such that every other row of apertures is aligned in terms of the sixth apertures 577.

In the preceding description, for the purposes of explanation, numerous details have been set forth in order to provide an understanding of various embodiments of the present invention. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the disclosed embodiments. Additionally, a number of well-known processes and elements have not been described in order to avoid unnecessarily obscuring the present invention. Accordingly, the above description should not be taken as limiting the scope of the invention.

Where a range of values is provided, it is understood that each intervening value, to the smallest fraction of the unit of the lower limit, unless the context clearly dictates otherwise, between the upper and lower limits of that range is also specifically disclosed. Each smaller range between any stated value or intervening value in a stated range and any other stated or intervening value in that stated range is encompassed. The upper and lower limits of those smaller ranges may independently be included or excluded in the range, and each range where either, neither, or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "an aperture" includes a plurality of such apertures, and reference to "the plate" includes reference to one or more plates and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or steps, but they do not preclude the presence or addition of one or more other features, integers, components, steps, acts, or groups.

What is claimed is:

1. A gas distribution assembly, comprising:
   an annular body characterized by an inner annular wall located at an inner diameter, an outer annular wall located at an outer diameter, an upper surface defining an upper recess, and a lower surface defining a lower recess;
   an upper plate coupled with the annular body along the upper recess of the upper surface of the annular body and defining a top surface of the gas distribution assembly, wherein the upper plate defines a plurality of first apertures, and wherein the upper plate defines a first recessed volume within a surface of the upper plate and about the first apertures;
   an intermediate plate coupled with the upper plate along the surface of the upper plate defining the first recessed volume, wherein the intermediate plate couples with the upper plate to isolate the first recessed volume from the first apertures, wherein the intermediate plate defines a plurality of second apertures and a plurality of third apertures, wherein the plurality of second apertures are axially aligned with the plurality of first apertures, and wherein all third apertures of the plurality of third apertures are fluidly coupled with the first recessed volume; and
   a lower plate coupled with the lower recess of the annular body and the intermediate plate and contacting the intermediate plate, wherein the lower plate defines a plurality of fourth apertures, a plurality of fifth apertures, and a plurality of sixth apertures, wherein the plurality of fourth apertures are axially aligned with the plurality of first apertures and the plurality of second apertures, wherein the plurality of fifth apertures are axially aligned with the plurality of third apertures, and wherein the upper plate, the intermediate plate, and the lower plate are coupled with one another such that the plurality of first apertures, the plurality of second apertures, and the plurality of fourth apertures form a plurality of first fluid channels extending vertically through the upper plate, the intermediate plate, and the lower plate in a straight vertical path through the entire gas distribution assembly.

2. The gas distribution assembly of claim 1, wherein the plurality of third apertures and the plurality of fifth apertures form a plurality of second fluid channels extending through the intermediate plate and the lower plate.

3. The gas distribution assembly of claim 2, wherein the plurality of sixth apertures form a plurality of third fluid channels extending through the lower plate.

4. The gas distribution assembly of claim 3, wherein the plurality of first fluid channels, the plurality of second fluid channels, and the plurality of third fluid channels are fluidly isolated from one another.

5. The gas distribution assembly of claim 1, wherein the intermediate plate and the lower plate define a second recessed volume between the intermediate plate and the lower plate.

6. The gas distribution assembly of claim 5, wherein the plurality of sixth apertures provide fluid access from the second volume.

7. The gas distribution assembly of claim 1, wherein each aperture of the plurality of sixth apertures comprise at least three sections of different shape or diameter.

8. A gas distribution assembly, comprising:
   an annular body characterized by an inner annular wall located at an inner diameter, an outer annular wall located at an outer diameter, an upper surface defining an upper recess, and a lower surface defining a lower recess;
   an upper plate coupled with the annular body along the upper recess of the upper surface of the annular body and defining a top surface of the gas distribution assembly, wherein the upper plate defines a first recessed volume from a surface of the upper plate opposite a surface defining the top surface of the gas distribution assembly, and wherein the upper plate defines a plurality of first apertures;
   an intermediate plate coupled with the upper plate, wherein the intermediate plate defines a plurality of second apertures and a plurality of third apertures, and wherein each aperture of the plurality of second apertures align with an aperture of the plurality of first apertures of the upper plate; and a lower plate coupled with the lower recess of the annular body and the intermediate plate, wherein the lower plate is in contact with the intermediate plate, the lower plate defining:
  a plurality of fourth apertures that are axially aligned with the plurality of first apertures of the upper plate and the plurality of second apertures of the intermediate plate to form a first set of fluid channels through the upper plate, the intermediate plate, and the lower plate, wherein the first set of fluid channels extend vertically in a direct path through the gas distribution assembly from a top surface of the gas distribution assembly through a bottom surface of the gas distribution assembly,
  a plurality of fifth apertures that align with the plurality of third apertures of the intermediate plate to form a second set of fluid channels through the intermediate plate and the lower plate, wherein the second set of fluid channels are fluidly isolated from the first set of fluid channels, and
  a plurality of sixth apertures that form a third set of fluid channels through the lower plate, wherein the third set of fluid channels are fluidly isolated from the first set of fluid channels and the second set of fluid channels.

9. The gas distribution assembly of claim 8, wherein each aperture of the plurality of sixth apertures comprise at least three sections of different shape or diameter.

10. The gas distribution assembly of claim 8, wherein the lower plate includes an orientation of the plurality of fourth apertures, the plurality of fifth apertures, and the plurality of sixth apertures such that a majority of fourth apertures of the plurality of fourth apertures are each surrounded by at least four fifth apertures of the plurality of fifth apertures.

11. The gas distribution assembly of claim 10, wherein the majority of fourth apertures of the plurality of fourth apertures are also each surrounded by at least four of the sixth apertures of the plurality of sixth apertures.

12. The gas distribution assembly of claim 11, wherein the fifth apertures are located around the fourth apertures with centers of the fifth apertures at about 90° intervals from one another about a center of the fourth apertures, and wherein the sixth apertures are located around the fourth apertures with centers of the sixth apertures at about 90° intervals from one another about the center of the fourth apertures and offset from the fifth apertures by about 45°.

13. The gas distribution assembly of claim 11, wherein the fifth apertures are located around the fourth apertures with centers of the fifth apertures at about 60° intervals from one another about a center of the fourth apertures, and wherein the sixth apertures are located around the fourth apertures with centers of the sixth apertures at about 60° intervals from one another about the center of the fourth apertures and offset from the fifth apertures by about 30°.

14. The gas distribution assembly of claim 8, wherein each aperture of the plurality of third apertures extends from the first recessed volume of the upper plate.

15. The gas distribution assembly of claim 8, wherein the intermediate plate defines a second recessed volume along a surface opposite a surface in contact with the upper plate, wherein the second recessed volume extends about each of the second apertures and each of the third apertures.

16. The gas distribution assembly of claim 15, wherein each sixth apertures of the plurality of sixth apertures provides fluid access from the second recessed volume.

17. A gas distribution assembly, comprising:
  an annular body characterized by an inner annular wall located at an inner diameter, an outer annular wall located at an outer diameter, an upper surface defining an upper recess, and a lower surface defining a lower recess;
  an upper plate coupled with the annular body and seated in the upper recess of the upper surface of the annular body and defining a top surface of the gas distribution assembly, wherein the upper plate defines a plurality of first apertures, and wherein the upper plate defines a first recessed volume within a surface of the upper plate and about the first apertures;
  an intermediate plate coupled with the upper plate along the surface of the upper plate defining the first recessed volume, wherein the intermediate plate defines a plurality of second apertures and a plurality of third apertures, wherein the plurality of second apertures are axially aligned with the plurality of first apertures, and wherein all third apertures of the plurality of third apertures are fluidly coupled with the first recessed volume; and
  a lower plate contacting the intermediate plate, wherein the lower plate is coupled with and seated in the lower recess of the annular body, wherein the lower plate defines a bottom surface of the gas distribution assembly, wherein the lower plate defines a plurality of fourth apertures, a plurality of fifth apertures, and a plurality of sixth apertures, wherein the plurality of fourth apertures are axially aligned with the plurality of first apertures and the plurality of second apertures, wherein the plurality of fifth apertures are axially aligned with the plurality of third apertures, and wherein the upper plate, the intermediate plate, and the lower plate are coupled with one another such that the plurality of first apertures, the plurality of second apertures, and the plurality of fourth apertures form a plurality of first fluid channels extending vertically through the upper plate, the intermediate plate, and the lower plate.

18. The gas distribution assembly of claim 1, wherein the upper surface of the annular body defines a first fluid channel radially inward of the upper recess.

19. The gas distribution assembly of claim 1, wherein the upper plate defines a topmost surface of the gas distribution assembly.

20. The gas distribution assembly of claim 8, wherein the upper surface of the annular body defines a first fluid channel radially inward of the upper recess, wherein the upper surface of the annular body defines a second fluid channel radially outward of the first fluid channel, and wherein the first fluid channel and the second fluid channel are in fluid communication.

* * * * *